(12) United States Patent
Shokrollahi et al.

(10) Patent No.: US 9,236,976 B2
(45) Date of Patent: *Jan. 12, 2016

(54) MULTI STAGE CODE GENERATOR AND DECODER FOR COMMUNICATION SYSTEMS

(75) Inventors: M. Amin Shokrollahi, Preverenges (CH); Soren Lassen, Glebe (AU); Michael G. Luby, Berkeley, CA (US)

(73) Assignee: Digital Fountain, Inc., San Diego, CA (US)

( * ) Notice: Subject to any disclaimer, the term of this patent is extended or adjusted under 35 U.S.C. 154(b) by 466 days.

This patent is subject to a terminal disclaimer.

(21) Appl. No.: 12/781,192

(22) Filed: May 17, 2010

(65) Prior Publication Data

US 2011/0019769 A1    Jan. 27, 2011

Related U.S. Application Data

(63) Continuation of application No. 11/354,256, filed on Feb. 13, 2006, now Pat. No. 7,720,174, which is a continuation of application No. 10/032,156, filed on Dec. 21, 2001, now Pat. No. 7,068,729.

(51) Int. Cl.
*H04K 1/02* (2006.01)
*H03M 13/00* (2006.01)
(Continued)

(52) U.S. Cl.
CPC ......... *H04L 1/0041* (2013.01); *H03M 13/3761* (2013.01); *H03M 13/1102* (2013.01); *H03M 13/19* (2013.01); *H04L 2001/0093* (2013.01)

(58) Field of Classification Search
CPC .... H03M 13/15; G06F 11/10; G06F 11/1004; G06F 11/14; G06F 11/16

USPC ............ 375/295, 296, 316, 340, 346; 341/50, 341/55, 56, 60; 714/699, 746, 752, 755, 714/758, 761, 786, 800

See application file for complete search history.

(56) References Cited

U.S. PATENT DOCUMENTS

| 3,909,721 A | 9/1975 | Bussgang et al. |
| 4,365,338 A | 12/1982 | McRae et al. |

(Continued)

FOREIGN PATENT DOCUMENTS

| CN | 1338839 A | 3/2002 |
| CN | 1425228 A | 6/2003 |

(Continued)

OTHER PUBLICATIONS

International Search Report, PCT/US2002/041615—International Search Authority—US, Mar. 26, 2003.

(Continued)

*Primary Examiner* — Kevin Kim

(57) ABSTRACT

A method of encoding data for transmission from a source to a destination over a communications channel is provided. A plurality of redundant symbols are generated from an ordered set of input symbols to be transmitted. A plurality of output symbols are generated from a combined set of symbols including the input symbols and the redundant symbols, wherein the number of possible output symbols is much larger than the number of symbols in the combined set of symbols, wherein at least one output symbol is generated from more than one symbol in the combined set of symbols and from less than all of the symbols in the combined set of symbols, and such that the ordered set of input symbols can be regenerated to a desired degree of accuracy from any predetermined number, N, of the output symbols.

50 Claims, 20 Drawing Sheets

(51) Int. Cl.
*H04L 1/00* (2006.01)
*H03M 13/37* (2006.01)
*H03M 13/11* (2006.01)
*H03M 13/19* (2006.01)

(56) References Cited

U.S. PATENT DOCUMENTS

| | | | |
|---|---|---|---|
| 4,589,112 A | 5/1986 | Karim | |
| 4,901,319 A | 2/1990 | Ross | |
| 5,136,592 A | 8/1992 | Weng | |
| 5,153,591 A | 10/1992 | Clark | |
| 5,329,369 A | 7/1994 | Willis et al. | |
| 5,331,320 A | 7/1994 | Cideciyan et al. | |
| 5,371,532 A | 12/1994 | Gelman et al. | |
| 5,372,532 A | 12/1994 | Robertson, Jr. | |
| 5,379,297 A | 1/1995 | Glover et al. | |
| 5,421,031 A | 5/1995 | De Bey | |
| 5,425,050 A | 6/1995 | Schreiber et al. | |
| 5,432,787 A | 7/1995 | Chethik | |
| 5,455,823 A | 10/1995 | Noreen et al. | |
| 5,465,318 A | 11/1995 | Sejnoha | |
| 5,517,508 A | 5/1996 | Scott | |
| 5,524,025 A | 6/1996 | Lawrence et al. | |
| 5,566,208 A | 10/1996 | Balakrishnan | |
| 5,568,614 A | 10/1996 | Mendelson et al. | |
| 5,583,784 A | 12/1996 | Kapust et al. | |
| 5,608,738 A | 3/1997 | Matsushita | |
| 5,617,541 A | 4/1997 | Albanese et al. | |
| 5,642,365 A | 6/1997 | Murakami et al. | |
| 5,659,614 A | 8/1997 | Bailey, III | |
| 5,699,473 A | 12/1997 | Kim | |
| 5,701,582 A | 12/1997 | DeBey | |
| 5,751,336 A | 5/1998 | Aggarwal et al. | |
| 5,754,563 A | 5/1998 | White | |
| 5,757,415 A | 5/1998 | Asamizuya et al. | |
| 5,802,394 A | 9/1998 | Baird et al. | |
| 5,805,825 A | 9/1998 | Danneels et al. | |
| 5,835,165 A | 11/1998 | Keate et al. | |
| 5,844,636 A | 12/1998 | Joseph et al. | |
| 5,852,565 A | 12/1998 | Demos | |
| 5,870,412 A | 2/1999 | Schuster et al. | |
| 5,903,775 A | 5/1999 | Murray | |
| 5,917,852 A | 6/1999 | Butterfield et al. | |
| 5,926,205 A | 7/1999 | Krause et al. | |
| 5,933,056 A | 8/1999 | Rothenberg | |
| 5,936,659 A | 8/1999 | Viswanathan et al. | |
| 5,936,949 A | 8/1999 | Pasternak et al. | |
| 5,953,537 A | 9/1999 | Balicki et al. | |
| 5,970,098 A | 10/1999 | Herzberg | |
| 5,983,383 A | 11/1999 | Wolf | |
| 5,993,056 A | 11/1999 | Vaman et al. | |
| 6,005,477 A | 12/1999 | Deck et al. | |
| 6,011,590 A | 1/2000 | Saukkonen | |
| 6,012,159 A | 1/2000 | Fischer et al. | |
| 6,014,706 A | 1/2000 | Cannon et al. | |
| 6,018,359 A | 1/2000 | Kermode et al. | |
| 6,041,001 A | 3/2000 | Estakhri | |
| 6,044,485 A | 3/2000 | Dent et al. | |
| 6,061,820 A | 5/2000 | Nakakita et al. | |
| 6,073,250 A | 6/2000 | Luby et al. | |
| 6,079,041 A | 6/2000 | Kunisa et al. | |
| 6,079,042 A | 6/2000 | Vaman et al. | |
| 6,081,907 A | 6/2000 | Witty et al. | |
| 6,081,909 A | 6/2000 | Luby et al. | |
| 6,081,918 A | 6/2000 | Spielman | |
| 6,088,330 A | 7/2000 | Bruck et al. | |
| 6,097,320 A | 8/2000 | Kuki et al. | |
| 6,134,596 A | 10/2000 | Bolosky et al. | |
| 6,141,053 A | 10/2000 | Saukkonen | |
| 6,141,787 A | 10/2000 | Kunisa et al. | |
| 6,141,788 A | 10/2000 | Rosenberg et al. | |
| 6,154,452 A | 11/2000 | Marko et al. | |
| 6,163,870 A | 12/2000 | Luby et al. | |
| 6,166,544 A | 12/2000 | Debbins et al. | |
| 6,175,944 B1 | 1/2001 | Urbanke et al. | |
| 6,178,536 B1 | 1/2001 | Sorkin | |
| 6,185,265 B1 | 2/2001 | Campanella | |
| 6,195,777 B1 | 2/2001 | Luby et al. | |
| 6,223,324 B1 | 4/2001 | Sinha et al. | |
| 6,226,259 B1 | 5/2001 | Piret | |
| 6,226,301 B1 | 5/2001 | Cheng et al. | |
| 6,229,824 B1 | 5/2001 | Marko | |
| 6,243,846 B1 | 6/2001 | Schuster et al. | |
| 6,272,658 B1 | 8/2001 | Steele et al. | |
| 6,278,716 B1 | 8/2001 | Rubenstein et al. | |
| 6,298,462 B1 | 10/2001 | Yi | |
| 6,307,487 B1 | 10/2001 | Luby | |
| 6,314,289 B1 | 11/2001 | Eberlein et al. | |
| 6,320,520 B1 | 11/2001 | Luby | |
| 6,332,163 B1 | 12/2001 | Bowman-Amuah | |
| 6,333,926 B1 | 12/2001 | Van Heeswyk et al. | |
| 6,373,406 B2 | 4/2002 | Luby | |
| 6,393,065 B1 | 5/2002 | Piret et al. | |
| 6,411,223 B1 | 6/2002 | Haken et al. | |
| 6,415,326 B1 | 7/2002 | Gupta et al. | |
| 6,420,982 B1 | 7/2002 | Brown | |
| 6,421,387 B1 | 7/2002 | Rhee | |
| 6,430,233 B1 | 8/2002 | Dillon et al. | |
| 6,445,717 B1 | 9/2002 | Gibson et al. | |
| 6,459,811 B1 | 10/2002 | Hurst, Jr. | |
| 6,466,698 B1 | 10/2002 | Creusere | |
| 6,473,010 B1 | 10/2002 | Vityaev et al. | |
| 6,486,803 B1 | 11/2002 | Luby et al. | |
| 6,487,692 B1 * | 11/2002 | Morelos-Zaragoza | 714/784 |
| 6,496,980 B1 | 12/2002 | Tillman et al. | |
| 6,497,479 B1 | 12/2002 | Stoffel et al. | |
| 6,510,177 B1 | 1/2003 | De Bonet et al. | |
| 6,523,147 B1 | 2/2003 | Kroeger et al. | |
| 6,535,920 B1 | 3/2003 | Parry et al. | |
| 6,577,599 B1 | 6/2003 | Gupta et al. | |
| 6,584,543 B2 | 6/2003 | Williams et al. | |
| 6,609,223 B1 | 8/2003 | Wolfgang | |
| 6,614,366 B2 | 9/2003 | Luby | |
| 6,618,451 B1 | 9/2003 | Gonikberg | |
| 6,631,172 B1 | 10/2003 | Shokrollahi et al. | |
| 6,633,856 B2 | 10/2003 | Richardson et al. | |
| 6,641,366 B2 | 11/2003 | Nordhoff | |
| 6,643,332 B1 | 11/2003 | Morelos-Zaragoza et al. | |
| 6,677,864 B2 | 1/2004 | Khayrallah | |
| 6,678,855 B1 | 1/2004 | Gemmell | |
| 6,694,476 B1 | 2/2004 | Sridharan et al. | |
| 6,704,370 B1 | 3/2004 | Chheda et al. | |
| 6,732,325 B1 | 5/2004 | Tash et al. | |
| 6,742,154 B1 | 5/2004 | Barnard | |
| 6,748,441 B1 | 6/2004 | Gemmell | |
| 6,751,772 B1 | 6/2004 | Kim et al. | |
| 6,765,866 B1 | 7/2004 | Wyatt | |
| 6,804,202 B1 | 10/2004 | Hwang | |
| 6,810,499 B2 | 10/2004 | Sridharan et al. | |
| 6,820,221 B2 | 11/2004 | Fleming | |
| 6,831,172 B1 | 12/2004 | Barbucci et al. | |
| 6,849,803 B1 | 2/2005 | Gretz | |
| 6,850,736 B2 | 2/2005 | McCune, Jr. | |
| 6,856,263 B2 | 2/2005 | Shokrollahi et al. | |
| 6,868,083 B2 | 3/2005 | Apostolopoulos et al. | |
| 6,876,623 B1 | 4/2005 | Lou et al. | |
| 6,882,618 B1 | 4/2005 | Sakoda et al. | |
| 6,895,547 B2 | 5/2005 | Eleftheriou et al. | |
| 6,909,383 B2 | 6/2005 | Shokrollahi et al. | |
| 6,928,603 B1 | 8/2005 | Castagna et al. | |
| 6,937,618 B1 | 8/2005 | Noda et al. | |
| 6,956,875 B2 | 10/2005 | Kapadia et al. | |
| 6,965,636 B1 * | 11/2005 | DesJardins et al. | 375/219 |
| 6,985,459 B2 | 1/2006 | Dickson | |
| 6,995,692 B2 | 2/2006 | Yokota et al. | |
| 7,010,052 B2 | 3/2006 | Dill et al. | |
| 7,030,785 B2 | 4/2006 | Shokrollahi et al. | |
| 7,031,257 B1 | 4/2006 | Lu et al. | |
| 7,057,534 B2 | 6/2006 | Luby | |
| 7,068,681 B2 | 6/2006 | Chang et al. | |
| 7,068,729 B2 | 6/2006 | Shokrollahi et al. | |
| 7,073,191 B2 | 7/2006 | Srikantan et al. | |
| 7,100,188 B2 | 8/2006 | Hejna et al. | |
| 7,110,412 B2 | 9/2006 | Costa et al. | |

(56) References Cited

U.S. PATENT DOCUMENTS

| | | |
|---|---|---|
| 7,139,660 B2 | 11/2006 | Sarkar et al. |
| 7,139,960 B2 | 11/2006 | Shokrollahi |
| 7,143,433 B1 | 11/2006 | Duan et al. |
| 7,151,754 B1 | 12/2006 | Boyce et al. |
| 7,154,951 B2 | 12/2006 | Wang |
| 7,164,370 B1 | 1/2007 | Mishra |
| 7,164,882 B2 | 1/2007 | Poltorak |
| 7,168,030 B2 | 1/2007 | Ariyoshi |
| 7,219,289 B2 | 5/2007 | Dickson |
| 7,231,404 B2 | 6/2007 | Paila et al. |
| 7,233,264 B2 | 6/2007 | Luby |
| 7,240,236 B2 | 7/2007 | Cutts et al. |
| 7,240,358 B2 | 7/2007 | Horn et al. |
| 7,243,285 B2 | 7/2007 | Foisy et al. |
| 7,254,754 B2 | 8/2007 | Hetzler et al. |
| 7,257,764 B2 | 8/2007 | Suzuki et al. |
| 7,265,688 B2 | 9/2007 | Shokrollahi et al. |
| 7,293,222 B2 | 11/2007 | Shokrollahi et al. |
| 7,295,573 B2 | 11/2007 | Yi et al. |
| 7,304,990 B2 | 12/2007 | Rajwan |
| 7,318,180 B2 | 1/2008 | Starr |
| 7,320,099 B2 | 1/2008 | Miura et al. |
| 7,363,048 B2 | 4/2008 | Cheng et al. |
| 7,391,717 B2 | 6/2008 | Klemets et al. |
| 7,394,407 B2 | 7/2008 | Shokrollahi et al. |
| 7,398,454 B2 | 7/2008 | Cai et al. |
| 7,409,626 B1 | 8/2008 | Schelstraete |
| 7,412,641 B2 | 8/2008 | Shokrollahi |
| 7,418,651 B2 | 8/2008 | Luby et al. |
| 7,451,377 B2 | 11/2008 | Shokrollahi |
| 7,483,447 B2 | 1/2009 | Chang et al. |
| 7,483,489 B2 | 1/2009 | Gentric et al. |
| 7,512,697 B2 | 3/2009 | Lassen et al. |
| 7,525,994 B2 | 4/2009 | Scholte |
| 7,529,806 B1 | 5/2009 | Shteyn |
| 7,532,132 B2 | 5/2009 | Shokrollahi et al. |
| 7,555,006 B2 | 6/2009 | Wolfe et al. |
| 7,559,004 B1 | 7/2009 | Chang et al. |
| 7,570,665 B2 | 8/2009 | Ertel et al. |
| 7,574,706 B2 | 8/2009 | Meulemans et al. |
| 7,590,118 B2 | 9/2009 | Giesberts et al. |
| 7,597,423 B2 | 10/2009 | Silverbrook |
| 7,613,183 B1 | 11/2009 | Brewer et al. |
| 7,633,413 B2 | 12/2009 | Shokrollahi et al. |
| 7,633,970 B2 | 12/2009 | Van Kampen et al. |
| 7,644,335 B2 | 1/2010 | Luby et al. |
| 7,650,036 B2 | 1/2010 | Lei et al. |
| 7,668,198 B2 | 2/2010 | Yi et al. |
| 7,711,068 B2 | 5/2010 | Shokrollahi et al. |
| 7,720,096 B2 | 5/2010 | Klemets |
| 7,720,174 B2 | 5/2010 | Shokrollahi et al. |
| 7,721,184 B2 | 5/2010 | Luby et al. |
| 7,812,743 B2 | 10/2010 | Luby |
| 7,831,896 B2 | 11/2010 | Amram et al. |
| 7,924,913 B2 | 4/2011 | Sullivan et al. |
| 7,961,700 B2 | 6/2011 | Malladi et al. |
| 7,979,769 B2 | 7/2011 | Lee et al. |
| 8,027,328 B2 | 9/2011 | Yang et al. |
| 8,028,322 B2 | 9/2011 | Riedl et al. |
| 8,081,716 B2 | 12/2011 | Kang et al. |
| 8,135,073 B2 | 3/2012 | Shen |
| 8,185,794 B2 | 5/2012 | Lohmar et al. |
| 8,185,809 B2 | 5/2012 | Luby et al. |
| RE43,741 E | 10/2012 | Shokrollahi et al. |
| 8,301,725 B2 | 10/2012 | Biderman et al. |
| 8,327,403 B1 | 12/2012 | Chilvers et al. |
| 8,340,133 B2 | 12/2012 | Kim et al. |
| 8,422,474 B2 | 4/2013 | Park et al. |
| 8,462,643 B2 | 6/2013 | Walton et al. |
| 8,544,043 B2 | 9/2013 | Parekh et al. |
| 8,572,646 B2 | 10/2013 | Haberman et al. |
| 8,615,023 B2 | 12/2013 | Oh et al. |
| 8,638,796 B2 | 1/2014 | Dan et al. |
| 8,713,624 B1 | 4/2014 | Harvey et al. |
| 8,737,421 B2 | 5/2014 | Zhang et al. |
| 8,812,735 B2 | 8/2014 | Igarashi |
| 2001/0015944 A1 | 8/2001 | Takahashi et al. |
| 2001/0033586 A1 | 10/2001 | Takashimizu et al. |
| 2002/0009137 A1 | 1/2002 | Nelson et al. |
| 2002/0053062 A1 | 5/2002 | Szymanski |
| 2002/0083345 A1 | 6/2002 | Halliday et al. |
| 2002/0085013 A1 | 7/2002 | Lippincott |
| 2002/0087685 A1 | 7/2002 | Lassen et al. |
| 2002/0133247 A1 | 9/2002 | Smith et al. |
| 2002/0141433 A1 | 10/2002 | Kwon et al. |
| 2002/0143953 A1 | 10/2002 | Aiken |
| 2002/0191116 A1 | 12/2002 | Kessler et al. |
| 2003/0005386 A1 | 1/2003 | Bhatt et al. |
| 2003/0037299 A1 | 2/2003 | Smith |
| 2003/0086515 A1 | 5/2003 | Trans et al. |
| 2003/0101408 A1 | 5/2003 | Martinian et al. |
| 2003/0106014 A1 | 6/2003 | Dohmen et al. |
| 2003/0138043 A1 | 7/2003 | Hannuksela |
| 2003/0194211 A1 | 10/2003 | Abecassis |
| 2003/0207696 A1 | 11/2003 | Willenegger et al. |
| 2003/0224773 A1 | 12/2003 | Deeds |
| 2003/0226089 A1 | 12/2003 | Rasmussen et al. |
| 2004/0015768 A1 | 1/2004 | Bordes et al. |
| 2004/0031054 A1 | 2/2004 | Dankworth et al. |
| 2004/0049793 A1 | 3/2004 | Chou |
| 2004/0066854 A1 | 4/2004 | Hannuksela |
| 2004/0081106 A1 | 4/2004 | Bruhn |
| 2004/0096110 A1 | 5/2004 | Yogeshwar et al. |
| 2004/0117716 A1 | 6/2004 | Shen |
| 2004/0151109 A1 | 8/2004 | Batra et al. |
| 2004/0162071 A1 | 8/2004 | Grilli et al. |
| 2004/0207548 A1 | 10/2004 | Kilbank |
| 2004/0231004 A1 | 11/2004 | Seo |
| 2004/0240382 A1 | 12/2004 | Ido et al. |
| 2004/0255328 A1 | 12/2004 | Baldwin et al. |
| 2005/0018635 A1 | 1/2005 | Proctor, Jr. |
| 2005/0028067 A1 | 2/2005 | Weirauch |
| 2005/0041736 A1 | 2/2005 | Butler-Smith et al. |
| 2005/0071491 A1 | 3/2005 | Seo |
| 2005/0091697 A1 | 4/2005 | Tanaka et al. |
| 2005/0097213 A1 | 5/2005 | Barrett et al. |
| 2005/0102371 A1 | 5/2005 | Aksu |
| 2005/0105371 A1 | 5/2005 | Johnson et al. |
| 2005/0123058 A1 | 6/2005 | Greenbaum et al. |
| 2005/0138286 A1 | 6/2005 | Franklin et al. |
| 2005/0160272 A1 | 7/2005 | Teppler |
| 2005/0163468 A1 | 7/2005 | Takahashi et al. |
| 2005/0169379 A1 | 8/2005 | Shin et al. |
| 2005/0180415 A1 | 8/2005 | Cheung et al. |
| 2005/0193309 A1 | 9/2005 | Grilli et al. |
| 2005/0195752 A1 | 9/2005 | Amin et al. |
| 2005/0195899 A1 | 9/2005 | Han |
| 2005/0195900 A1 | 9/2005 | Han |
| 2005/0207392 A1 | 9/2005 | Sivalingham et al. |
| 2005/0216472 A1 | 9/2005 | Leon et al. |
| 2005/0216951 A1 | 9/2005 | MacInnis |
| 2005/0254575 A1 | 11/2005 | Hannuksela et al. |
| 2006/0015568 A1 | 1/2006 | Walsh et al. |
| 2006/0020796 A1 | 1/2006 | Aura et al. |
| 2006/0031738 A1 | 2/2006 | Fay et al. |
| 2006/0037057 A1 | 2/2006 | Xu |
| 2006/0093634 A1 | 5/2006 | Lutz et al. |
| 2006/0107174 A1 | 5/2006 | Heise |
| 2006/0109805 A1 | 5/2006 | Malamal Vadakital et al. |
| 2006/0120464 A1 | 6/2006 | Hannuksela |
| 2006/0193524 A1 | 8/2006 | Tarumoto et al. |
| 2006/0212444 A1 | 9/2006 | Handman et al. |
| 2006/0212782 A1 | 9/2006 | Li |
| 2006/0229075 A1 | 10/2006 | Kim et al. |
| 2006/0244824 A1 | 11/2006 | Debey |
| 2006/0244865 A1 | 11/2006 | Simon |
| 2006/0248195 A1 | 11/2006 | Toumura et al. |
| 2006/0256851 A1 | 11/2006 | Wang et al. |
| 2006/0262856 A1 | 11/2006 | Wu et al. |
| 2006/0279437 A1 | 12/2006 | Luby et al. |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |

(56) References Cited

U.S. PATENT DOCUMENTS

| | | |
|---|---|---|
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0081586 A1 | 4/2007 | Raveendran et al. |
| 2007/0110074 A1 | 5/2007 | Bradley et al. |
| 2007/0127576 A1 | 6/2007 | Henocq et al. |
| 2007/0134005 A1 | 6/2007 | Myong et al. |
| 2007/0140369 A1 | 6/2007 | Limberg |
| 2007/0157267 A1 | 7/2007 | Lopez-Estrada |
| 2007/0162568 A1 | 7/2007 | Gupta et al. |
| 2007/0162611 A1 | 7/2007 | Yu et al. |
| 2007/0176800 A1 | 8/2007 | Rijavec |
| 2007/0177811 A1 | 8/2007 | Yang |
| 2007/0185973 A1 | 8/2007 | Wayda et al. |
| 2007/0195894 A1 | 8/2007 | Shokrollahi et al. |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | ORourke et al. |
| 2007/0255844 A1 | 11/2007 | Shen et al. |
| 2007/0277209 A1 | 11/2007 | Yousef |
| 2007/0300127 A1 | 12/2007 | Watson et al. |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0152241 A1 | 6/2008 | Itoi et al. |
| 2008/0168133 A1 | 7/2008 | Osborne |
| 2008/0168516 A1 | 7/2008 | Flick et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0303896 A1 | 12/2008 | Lipton et al. |
| 2008/0309525 A1 | 12/2008 | Shokrollahi et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0031199 A1 | 1/2009 | Luby et al. |
| 2009/0043906 A1 | 2/2009 | Hurst et al. |
| 2009/0055705 A1 | 2/2009 | Gao |
| 2009/0067551 A1 | 3/2009 | Chen et al. |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0195640 A1 | 8/2009 | Kim et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1 | 1/2010 | Stockhammer et al. |
| 2010/0020871 A1 | 1/2010 | Hannuksela et al. |
| 2010/0023525 A1 | 1/2010 | Westerlund et al. |
| 2010/0046906 A1 | 2/2010 | Kanamori et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0103001 A1 | 4/2010 | Shokrollahi et al. |
| 2010/0131671 A1 | 5/2010 | Kohli et al. |
| 2010/0153578 A1 | 6/2010 | Van et al. |
| 2010/0165077 A1 | 7/2010 | Yin et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0223533 A1 | 9/2010 | Stockhammer et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0103519 A1 | 5/2011 | Shokrollahi et al. |
| 2011/0119394 A1 | 5/2011 | Wang et al. |
| 2011/0119396 A1 | 5/2011 | Kwon et al. |
| 2011/0216541 A1 | 9/2011 | Inoue et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0258510 A1 | 10/2011 | Watson et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0299629 A1 | 12/2011 | Luby et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |
| 2013/0254634 A1 | 9/2013 | Luby |
| 2013/0287023 A1 | 10/2013 | Bims |
| 2014/0009578 A1 | 1/2014 | Chen et al. |
| 2014/0380113 A1 | 12/2014 | Luby et al. |

FOREIGN PATENT DOCUMENTS

| | | |
|---|---|---|
| CN | 1481643 A | 3/2004 |
| CN | 1708934 A | 12/2005 |
| CN | 1714577 A | 12/2005 |
| CN | 1792056 A | 6/2006 |

(56) References Cited

FOREIGN PATENT DOCUMENTS

| | | | |
|---|---|---|---|
| CN | 1806392 A | 7/2006 |
| CN | 1819661 A | 8/2006 |
| CN | 1868157 A | 11/2006 |
| CN | 101390399 A | 3/2009 |
| CN | 101729857 A | 6/2010 |
| EP | 0669587 A2 | 8/1995 |
| EP | 0701371 A1 | 3/1996 |
| EP | 0784401 A2 | 7/1997 |
| EP | 0853433 A1 | 7/1998 |
| EP | 0854650 A2 | 7/1998 |
| EP | 0903955 A1 | 3/1999 |
| EP | 0986908 A1 | 3/2000 |
| EP | 1024672 A1 | 8/2000 |
| EP | 1051027 A1 | 11/2000 |
| EP | 1124344 A1 | 8/2001 |
| EP | 1241795 A2 | 9/2002 |
| EP | 1298931 A2 | 4/2003 |
| EP | 1406452 A2 | 4/2004 |
| EP | 1455504 A2 | 9/2004 |
| EP | 1468497 A1 | 10/2004 |
| EP | 1501318 A1 | 1/2005 |
| EP | 1670256 A2 | 6/2006 |
| EP | 1755248 A1 | 2/2007 |
| EP | 2046044 A1 | 4/2009 |
| EP | 2071827 A2 | 6/2009 |
| EP | 2096870 A2 | 9/2009 |
| EP | 1700410 B1 | 4/2010 |
| EP | 2323390 A2 | 5/2011 |
| JP | H07183873 | 7/1995 |
| JP | 08186570 | 7/1996 |
| JP | 8289255 A | 11/1996 |
| JP | 9252253 A | 9/1997 |
| JP | 11041211 A | 2/1999 |
| JP | 11112479 | 4/1999 |
| JP | 11164270 A | 6/1999 |
| JP | 2000151426 A | 5/2000 |
| JP | 2000216835 A | 8/2000 |
| JP | 2000513164 A | 10/2000 |
| JP | 2000307435 A | 11/2000 |
| JP | 2000353969 A | 12/2000 |
| JP | 2001036417 | 2/2001 |
| JP | 2001094625 | 4/2001 |
| JP | 2001189665 A | 7/2001 |
| JP | 2001223655 A | 8/2001 |
| JP | 2001251287 A | 9/2001 |
| JP | 2001274776 A | 10/2001 |
| JP | 2001274855 A | 10/2001 |
| JP | 2002073625 A | 3/2002 |
| JP | 2002204219 A | 7/2002 |
| JP | 2002543705 A | 12/2002 |
| JP | 2003018568 A | 1/2003 |
| JP | 2003507985 | 2/2003 |
| JP | 2003092564 A | 3/2003 |
| JP | 2003510734 A | 3/2003 |
| JP | 2003174489 | 6/2003 |
| JP | 2003256321 A | 9/2003 |
| JP | 2003318975 A | 11/2003 |
| JP | 2003319012 | 11/2003 |
| JP | 2003333577 A | 11/2003 |
| JP | 2004048704 A | 2/2004 |
| JP | 2004070712 A | 3/2004 |
| JP | 2004135013 A | 4/2004 |
| JP | 2004165922 A | 6/2004 |
| JP | 2004516717 A | 6/2004 |
| JP | 2004192140 A | 7/2004 |
| JP | 2004193992 A | 7/2004 |
| JP | 2004529533 A | 9/2004 |
| JP | 2004289621 A | 10/2004 |
| JP | 2004343701 A | 12/2004 |
| JP | 2004348824 A | 12/2004 |
| JP | 2004362099 A | 12/2004 |
| JP | 2005094140 A | 4/2005 |
| JP | 2005136546 A | 5/2005 |
| JP | 2005514828 T | 5/2005 |
| JP | 2005204170 A | 7/2005 |
| JP | 2005223433 A | 8/2005 |
| JP | 2005277950 A | 10/2005 |
| JP | 2006503463 A | 1/2006 |
| JP | 2006505177 A | 2/2006 |
| JP | 2006506926 A | 2/2006 |
| JP | 2006074335 A | 3/2006 |
| JP | 2006074421 A | 3/2006 |
| JP | 2006115104 A | 4/2006 |
| JP | 3809957 | 6/2006 |
| JP | 2006174032 A | 6/2006 |
| JP | 2006174045 A | 6/2006 |
| JP | 2006186419 A | 7/2006 |
| JP | 2006519517 A | 8/2006 |
| JP | 2006287422 A | 10/2006 |
| JP | 2006319743 A | 11/2006 |
| JP | 2007013675 A | 1/2007 |
| JP | 2007089137 A | 4/2007 |
| JP | 3976163 | 6/2007 |
| JP | 2007158592 A | 6/2007 |
| JP | 2007174170 A | 7/2007 |
| JP | 2007520961 A | 7/2007 |
| JP | 2007228205 A | 9/2007 |
| JP | 2008011404 A | 1/2008 |
| JP | 2008016907 A | 1/2008 |
| JP | 2008508761 A | 3/2008 |
| JP | 2008508762 A | 3/2008 |
| JP | 2008283232 A | 11/2008 |
| JP | 2008283571 A | 11/2008 |
| JP | 2008543142 A | 11/2008 |
| JP | 2008546361 A | 12/2008 |
| JP | 2009027598 A | 2/2009 |
| JP | 2009522921 A | 6/2009 |
| JP | 2009522922 A | 6/2009 |
| JP | 2009171558 A | 7/2009 |
| JP | 2009527949 A | 7/2009 |
| JP | 2009277182 A | 11/2009 |
| JP | 2009544991 A | 12/2009 |
| JP | 2010539832 A | 12/2010 |
| JP | 2008502212 A | 1/2011 |
| JP | 2011087103 A | 4/2011 |
| KR | 1020030071815 | 9/2003 |
| KR | 1020030074386 A | 9/2003 |
| KR | 20040107152 A | 12/2004 |
| KR | 20040107401 A | 12/2004 |
| KR | 20050009376 A | 1/2005 |
| KR | 100809086 B1 | 3/2008 |
| KR | 20080083299 A | 9/2008 |
| KR | 20090098919 A | 9/2009 |
| KR | 20100028156 A | 3/2010 |
| RU | 99117925 A | 7/2001 |
| RU | 2189629 C2 | 9/2002 |
| RU | 2265960 C2 | 12/2005 |
| RU | 2290768 C1 | 12/2006 |
| RU | 2297663 C2 | 4/2007 |
| RU | 2312390 C2 | 12/2007 |
| RU | 2357279 C2 | 5/2009 |
| TW | 1246841 B | 1/2006 |
| TW | 1354908 | 12/2011 |
| TW | 1355168 | 12/2011 |
| WO | WO9634463 A1 | 10/1996 |
| WO | WO-9750183 A1 | 12/1997 |
| WO | WO9804973 A1 | 2/1998 |
| WO | WO9832231 | 7/1998 |
| WO | WO-9832256 A1 | 7/1998 |
| WO | WO0014921 A1 | 3/2000 |
| WO | WO0018017 | 3/2000 |
| WO | WO0052600 A1 | 9/2000 |
| WO | WO0120786 A1 | 3/2001 |
| WO | WO0157667 A1 | 8/2001 |
| WO | WO0158130 A2 | 8/2001 |
| WO | WO0158131 A2 | 8/2001 |
| WO | WO0227988 A2 | 4/2002 |
| WO | WO0247391 A1 | 6/2002 |
| WO | 02063461 A1 | 8/2002 |
| WO | WO-03046742 A1 | 6/2003 |
| WO | WO03056703 | 7/2003 |
| WO | WO03105350 | 12/2003 |
| WO | WO-03105484 A1 | 12/2003 |
| WO | WO2004008736 A2 | 1/2004 |

(56) References Cited

FOREIGN PATENT DOCUMENTS

| WO | WO2004015948 A1 | 2/2004 |
|---|---|---|
| WO | WO2004019521 A1 | 3/2004 |
| WO | WO2004030273 A1 | 4/2004 |
| WO | WO2004034589 A2 | 4/2004 |
| WO | WO-2004036824 A1 | 4/2004 |
| WO | WO2004040831 A1 | 5/2004 |
| WO | WO-2004047019 A2 | 6/2004 |
| WO | WO2004047455 A1 | 6/2004 |
| WO | WO-2004088988 A1 | 10/2004 |
| WO | WO-2004109538 A1 | 12/2004 |
| WO | WO2005036753 A2 | 4/2005 |
| WO | WO2005041421 A1 | 5/2005 |
| WO | WO2005078982 A1 | 8/2005 |
| WO | WO-2005107123 | 11/2005 |
| WO | WO2005112250 A2 | 11/2005 |
| WO | WO-2006013459 A1 | 2/2006 |
| WO | WO2006020826 A2 | 2/2006 |
| WO | WO-2006036276 | 4/2006 |
| WO | 2006060036 A1 | 6/2006 |
| WO | WO-2006057938 A2 | 6/2006 |
| WO | WO2006084503 A1 | 8/2006 |
| WO | WO-2006116102 A2 | 11/2006 |
| WO | WO-2006135878 A2 | 12/2006 |
| WO | WO2007042916 | 4/2007 |
| WO | 2007078253 A2 | 7/2007 |
| WO | WO2007090834 A2 | 8/2007 |
| WO | WO-2007098397 A2 | 8/2007 |
| WO | WO-2007098480 A1 | 8/2007 |
| WO | 2008011549 A2 | 1/2008 |
| WO | WO-2008023328 A3 | 4/2008 |
| WO | WO2008054100 A1 | 5/2008 |
| WO | 2008086313 A1 | 7/2008 |
| WO | WO2008085013 A1 | 7/2008 |
| WO | WO-2008131023 A1 | 10/2008 |
| WO | 2008144004 A1 | 11/2008 |
| WO | WO2008148708 A1 | 12/2008 |
| WO | WO2008156390 A1 | 12/2008 |
| WO | WO-2009065526 A1 | 5/2009 |
| WO | WO-2009137705 A2 | 11/2009 |
| WO | 2009143741 A1 | 12/2009 |
| WO | WO2010085361 A2 | 7/2010 |
| WO | WO2010088420 A1 | 8/2010 |
| WO | WO2010120804 A1 | 10/2010 |
| WO | WO-2011038013 | 3/2011 |
| WO | WO-2011038034 A1 | 3/2011 |
| WO | 2011059286 A2 | 5/2011 |
| WO | 2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

Supplementary European Search Report, EP02794439—European Search Authority—The Hague, Jan. 13, 2005.

Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.

Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 917-624 XP0000464977.

Bitner, J.R., et al.: "Efficient Generation of the Binary Reflected Gray code and Its Applications," Communications of theACM (1976).

Blomer, et al.: "An XOR-Based Erasure-Resilient Coding Scheme," ICSI Technical Report No. TR-95-048 (1995) [avail. At ftp://ftp.icsi.berkeley.edu/pub/techreports/1995/tr-95-048.pdf].

Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.

Byers, J.W. et al.: "Accessing multiple mirror sites in parallel: using Tornado codes to speed up downloads," 1999, Eighteenth Annual Joint Conference of the IEEE Comupter and Communications Socities, pp. 275-283.

Clark G.C., et al., "Error Correction Coding for Digital Communications, System Applications," Error Correction Coding for Digital Communications, New York, Plenum Press, US, Jan. 1, 1981, pp. 331-341.

Digital Fountain: "Raptor code specification for MBMS file download," 3GPP SA4 PSM AD-HOC #31 (May 21, 2004) XP002355055 pp. 1-6.

Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.

Esaki, et al.: "Reliable IP Multicast Communication Over ATM Networks Using Forward Error Correction Policy," IEICE Transactions on Communications, JP, Institute of Electronics Information and Comm. Eng. Tokyo, vol. E78-V, No. 12, (Dec. 1995), pp. 1622-1637, XP000556183.

Gemmell, et al., "A Scalable Multicast Architecture for One-To-Many Telepresentations", Multimedia Computing and Systems, 1998/Proceedings. IEEE International Conference on Austin, TX, USA Jun. 28-Jul. 1, 1998, Los Alamitos, CA USA, IEEE Comput. Soc, US.

Hershey, et al., "Random Parity Coding (RPC)", 1996 IEEE International Conference on Communications (ICC). Converging Technologies for Tomorrow's Applications. Dallas, Jun. 23-27, 1996, IEEE International Conference on Communications (ICC), New York, IEEE.

Kallel, "Complementary Punctured Convolutional (CPC) Codes and Their Applications", IEEE Transactions on Communications, IEEE Inc., New York, US, vol. 43, No. 6, Jun. 1, 1995, pp. 2005-2009.

Lin, S. et al.: "Error Control Coding-Fundamentals and Applications," 1983, Englewood Cliffs, pp. 288.

Luby, et al., "Analysis of Low Density Codes and Improved Designs Using Irregular Graphs", 1998, Proceedings of the 30th Annual ACM Symposium on Theory of Computing, 1998, pp. 249-258.

Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].

Luby, et al.: "Analysis of Random Processes via and-or Tree Evaluation," ICSI Technical Report No. TR-97-042 (1997) and Proceedings of the 9th Annual ACM Symposium on Discrete Algorithms (1998) [available at ftp://ftp.icsi.berkeley.edu/pub/techreports/1997/tr-97-042.pdf].

Luby, et al.: "Improved Low-Density Parity-Check Codes Using Irregular Graphs and Belief Propagation," International Computer Science Institute Technical Report TR-97-044 (Nov. 1997) [available at ftp://ftp.icsi.berkeley.edu/pub/techreports/1997/tr-97.

Luby, M. et al.: "Efficient Erasure Correction Codes," 2001, IEEE Transactions on Information Theory, Vo. 47, No. 2, pp. 569-584.

Luby, M. et al.: "Practical Loss-Resilient Codes: Tornado Codes," 29th Annual ACM Symposium on Theory of Computing (1997).

Narayanan, et al., "Physical Layer Design for Packet Data Over IS-136", Vehicular Technology Conference, 1997, IEEE 47th Phoenix, AZ, USA May 4-7, 1997, New York, NY, USA, IEEE, US May 4, 1997, pp. 1029-1033.

Nonnenmacher, et al., "Parity-Based Loss Recovery for Reliable Multicast Transmission", IEEE / ACM Transactions on Networking, IEEE Inc. New York, US, vol. 6, No. 4, Aug. 1, 1998, pp. 349-361.

Pursley, et al.: "Variable-Rate Coding for Meteor-Burst Communications," IEEE Transactions on Communications, US, IEEE Inc. New York (1989) vol. 37, No. 11, pp. 1105-1112 XP000074533.

Pursley, M. et al.: "A Correction and an Addendum for Variable-Rate Coding for Meteor-Burst Communications," IEEE Transactions on Communications, vol. 43, No. 12 pp. 2866-2867 (Dec. 1995).

Rizzo, L. "Effective Erasure Codes for Reliable Computer Communication Protocols," Computer Communication Review, 27 (2) pp. 24-36 (Apr. 1997).

(56) References Cited

OTHER PUBLICATIONS

Seshan, S. et al.: "Handoffs in Cellular Wireless Networks: The Daedalus Implementation and Experience," Wireless Personal Communications, NL; Kluwer Academic Publishers, vol. 4, No. 2 (Mar. 1, 1997) pp. 141-162, XP000728589.
Shacham: "Packet Recovery and Error Correction in High-Speed Wide-Area Networks," Proceedings of the Military Communications Conference. (Milcom), US, New York, IEEE, vol. 1, pp. 551-557 (1989) XP000131876.
Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.
Amin Shokrollahi: "LDPC Codes: An Introduction" Internet Citation 2 Apr. 1, 2003 (Apr. 2, 2003), XP002360065 Retrieved from the Internet: URL : http ://www. ipm. ac. ir/IPM/homepage/Amin 2. pdf [retrieved on Dec. 19, 2005].
Hagenauer, J. : "Soft is better than hard" Communications, Coding and Cryptology, Kluwer Publication May 1994, XP002606615 Retrieved from the Internet : URL: http://www. Int. ei.turn. de/veroeffentlic hungen/I994/ccc94h. pdf [retrieved on Oct. 25, 2010].
Luby, Michael G. "Analysis of Random Processes via And-Or Tree Evaluation," Proceedings of the 9th Annual ACM-SIAM Symposium on Discrete Algorithms, 1998, pp. 364-373, (search date: Jan. 25, 2010) URL: <http://portal.acm.prg.citation.cfm?id=314722>.
Rost, S. et al.: "The Cyclone Server Architecture: streamlining delivery of popular content," 2002, Computer Communications, vol. 25, No. 4, pp. 403-412.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.prg.citation.cfm?id=1148681>.
Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.
3GPP, "Transparent end-to-end packet-switched streaming service (PSS): Protocols and codecs (Release 9)," 3GPP TS 26.234, version 9.1.0, Release 9, Sophia Antipolis, Valbonne, FR, (Dec. 2009), 179 pp.
3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.
3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010.
3rd Generation Partnership Project, Technical Specification Group Services and System Aspects Transparent end-to-end packet switched streaming service (PSS), 3GPP file format (3GP) (Release 8), 3GPP Standard, 3GPP TS 26.244, 3rd Generation Partnership Project (3GPP), Mobile Competence Centre, 650, Route Des Lucioles, F-06921 Sophia-Antipolis Cedex, France, No. V8.1.0, Jun. 1, 2009, pp. 1-52, XP050370199.
Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).
Aggarwal, C. et al.: "On Optimal Batching Policies for Video-on-Demand Storage Servers," Multimedia Systems, vol. 4, No. 4, pp. 253-258 (1996).
Alex Zambelli: "IIS Smooth Streaming Technical Overview", Microsoft Mar. 25, 2009, XP002620446, Retrieved from the Internet: URL:http://www.microsoft.com/downloads/en/ details. aspx?FamilyID=03d22583-3ed6-44da-8464-blb4b5ca7520, [retrieved on Jan. 21, 2011].
Aljoscha Smolic et al., "Development of a new MPEG standard for advanced 3D video applications", IEEE International Symposium on Image and Signal Processing and Analysis, Sep. 16, 2009, pp. 400-407, XP031552049, ISBN: 978-953-184-135-1.
Almeroth, et al., "The use of multicast delivery to provide a scalable and interactive video-on-demand service", IEEE Journal on Selected Areas in Communication, 14(6): 1110-1122, (1996).
Bar-Noy, et al., "Competitive on-line stream merging algorithms for media-on-demand", Draft (Jul. 2000), pp. 1-34.
Bar-Noy et al. "Efficient algorithms for optimal stream merging for media-on-demand," Draft (Aug. 2000), pp. 1-43.
Chen, et al., U.S. Patent Application titled "Frame Packing for Asymmetric Stereo Video", filed Feb. 25, 2011.
Chen, et al., U.S. Patent Application titled "One-Stream Coding for Asymmetric Stereo Video", filed Feb. 25, 2011.
Dan, A. et al.: "Scheduling Policies for an On-Demand Video Server with Batching," Proc. ACM Multimedia, pp. 391-398 (Oct. 1998).
Davey, M.C. et al.: "Low Density Parity Check Codes over GF(q)" IEEE Communications Letters, vol. 2, No. 6 pp. 165-167 (1998).
David Singer, et al., "ISO/IEC 14496-15/FDIS, International Organization for Standardization Organization Internationale De Normalization ISO/IEC JTC1/SC29/WG11 Coding of Moving Pictures and Audio", ISO/IEC 2003, Aug. 11, 2003, pp. 1-34.
D.M. Mandelbaum: "An adaptive-feedback coding scheme using incremental redundancy", IEEE Trans on Information Theory, vol. May 1974, May 1974, pp. 388-389, XP002628271, the whole document.
Eager, et al. "Minimizing bandwidth requirements for on-demand data delivery," Proceedings of the International Workshop on Advances in Multimedia Information Systems,p. 80-87 (Indian Wells, CA Oct. 1999).
Eager, et al., "Optimal and efficient merging schedules for video-on-demand servers", Proc. ACM Multimedia, vol. 7, pp. 199-203 (1999).
European Search Report—EP10013231, Search Authority—Hague Patent Office, Mar. 15, 2011 (091826EPD4).
Feng, G., Error Correcting Codes over Z2m for Algorithm-Based Fault-Tolerance, IEEE Transactions on Computers, vol. 43, No. 3, Mar. 1994, pp. 370-374.
Fielding, et al., "Hypertext Transfer Protocol—HTTP/1.1," Network Working Group, RFC 2616, Jun. 1999, 165 pp.
Frojdh, et al., "File format sub-track selection and switching," ISO/IEC JTC1/SC29/WG11 MPEG2009 M16665, London UK., Jul. 2009, 14 pp.
Gao, L. et al.: "Efficient Schemes for Broadcasting Popular Videos," Proc. Inter. Workshop on Network and Operating System Support for Digital Audio and Video, pp. 1-13 (1998).
Grineberg, et al., "Deliverable D3.2 MVC/SVC storage format" Jan. 29, 2009, XP002599508 Retrieved from the Internet: URL:http://www.ist-sea.eu/Public/SEA_D3.2_HHI FF_20090129.pdf [retrieved on Sep. 1, 2010] paragraph [02.3].
He Wenge et al., "Asymmetric Stereoscopic Video Encoding Algorithm Based on Joint Compensation Prediction", IEEE International Conference on Communications and Mobile Computing, Jan. 6, 2009, pp. 191-194, XP031434775, ISBN: 978-0/7695-3501-2.
Hitachi Ltd. et al., "High-Definition Multimedia Interface," Specification Version 1.4, Jun. 5, 2009, 425 pp.
Hua, et al., "Skyscraper broadcasting: A new broadcsting system for metropolitan video-on-demand systems", Proc. ACM SIGCOMM, pp. 89-100 (Cannes, France, 1997).
Ian Trow: "Is 3D Event Coverage Using Existing Broadcast Infrastructure Technically Possible?", International Broadcasting Conference, Sep. 9-13, 2009, XP030081671, pp. 4-5, "3D transmission over broadcast infrastructure" pp. 7-8, "Screen signaling"—Conclusions on 3D systems.
Information Technology—Generic Coding of Moving Pictures and Audio: Systems, Amendment 4: Transport of Multiview Video over ITU-T Rec H.222.0 | ISO/IEC 13818-1 "Text of ISO/IEC 13818-1:2007/FPDAM 4—Transport of Multiview Video over ITU-T Rec H.222.0 | ISO/IEC 13818-1," Lausanne, Switzerland, 2009, 21 pp.
International Standard ISO/IEC 14496-12, Information Technology—Coding of audio-visual objects—Part 12: ISO base media file format, Third Edition, Oct. 15, 2008, 120 pp.
International Telecommunication Union, "ITU-T H.264, Series H: Audiovisual and Multimedia Systems, Infrastructure of audiovisual

(56) References Cited

OTHER PUBLICATIONS services—Coding of moving video, Advanced video coding for generic audiovisual services," Mar. 2010, 669 pp.

ISO/IEC 13818-1, "Information technology—Generic coding of moving pictures and associated audio information: Systems," Second edition, Dec. 1, 2000, 174 pp.

"ISO/IEC JTC 1/SC 29, ISO/IEC FCD 23001-6, Information technology—MPEG systems technologies—Part 6: Dynamic adaptive streaming over HTTP (DASH), Jan. 28, 2011".

"Joint Draft 8.0 on Multiview Video Coding", 28th JVT meeting, Hannover, Germany, Jul. 2008. available from http:// wftp3.itu.int/av-arch/jvt-site/2008_07_Hannover/JVT-AB204.

Juhn, L. et al.: "Adaptive Fast Data Broadcasting Scheme for Video-on-Demand Service," IEEE Transactions on Broadcasting, vol. 44, No. 2, pp. 182-185 (Jun. 1998).

Juhn, L. et al.: "Harmonic Broadcasting for Video-on-Demand Service," IEEE Transactions on Broadcasting, vol. 43, No. 3, pp. 268-271 (Sep. 1997).

Kimata H et al., "Inter-view prediction with downsampled reference pictures", ITU Study Group 16—Video Coding Experts Group—ISO/IEC MPEG & ITU-T VCEG(ISO/IEC JTC1/SC29/WG11 and ITU-T SG16 Q6), No. JVT-W079, Apr. 19, 2007, XP030007039.

Kozamernik F: "Media streaming over the Internet", Internet Citation, Oct. 2002, XP002266291, Retrieved from the Internet: URL: http://www.ebu.ch/trev_292-kozamerni k. pdf [retrieved on Jan. 8, 2004] section "Video codecs for scalable streaming".

Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, CH, Oct. 1, 2007 XP015055125, ISSN: 0000-0003.

Marpe, et al., "The H.264/MPEG4 Advanced Video Coding Standard and its Applications," Standards Report, IEEE Communications Magazine, Aug. 2006, pp. 134-143.

Min-Goo Kim: "On systematic punctured convolutional codes", IEEE Trans on Communications, vol. 45, No. 2, Feb. 1997, XP002628272, the whole document, pp. 133-139.

Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.

Naguib, Ayman, et al., "Applications of Space-Time Block Codes and Interference Suppression for High Capacity and High Data Rate Wireless Systems," IEEE, 1998, pp. 1803-1810.

Ozden, B. et al.: "A Low-Cost Storage Service for Movie on Demand Databases," Proceedings of the 20th Very Large DataBases (VLDB) Conference, Santiago, Chile (1994).

Pa. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).

Pantos R et al., "HTTP Live Streaming; draft-pantos-http-1ive-streaming-OT.txt", HTTP Live Streaming; Draft-Pant0s-HTTP-Live-Streaming-01.txt, Internet Engineering Task Force, IETF; Standardworkingdraft, Internet Society (ISOC) 4, Rue Des Falaises CH- 1205 Geneva, Switzerland, No. 1, Jun. 8, 2009, XP015062692.

Paris, et al., "A low bandwidth broadcasting protocol for video on demand", Proc. International Conference on Computer Communications and Networks, vol. 7, pp. 690-697 (Oct. 1998).

Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).

Perkins, et al.: "Survey of Packet Loss Recovery Techniques for Streaming Audio," IEEE Network; Sep./Oct. 1998, pp. 40-48.

Petition decision for Petition Under 37 C.F.R. § 1.78 to Accept an Unintentionally Delayed Priority Claim under 35 U.S.C. § 120 in U.S. Patent No. 7,532,132, dated Jul. 21, 2011, 2 pages.

Petition under 37 C.F.R. § 1.78 to Accept an Unintentionally Delayed Priority Claim under 35 U.S.C. § 120 in U.S. Patent No. 7,532,132, dated May 27, 2011, 2 pages.

Pless and WC Huffman Eds V S: Algebraic geometry codes, Handbook of Coding Theory, 1998, pp. 871-961, XP002300927.

Qualcomm Europe S A R L: "Baseline Architecture and Definitions for HTTP Streaming", 3GPP Draft; S4-090603_HTTP_Streaming_Architecture, 3rd Generation Partnership Project (3GPP), Mobile Competence Centre; 650, Route Des Lucioles; F-06921 Sophia-Antipolis Cedex; France, No. Kista; Aug. 12, 2009, XP050356889.

Rangan, et al., "Designing an On-Demand Multimedia Service," IEEE Communication Magazine, vol. 30, pp. 5-65, (Jul. 1992).

Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).

Roth, R., et al., "A Construction of Non-Reed-Solomon Type MDS Codes", IEEE Transactions of Information Theory, vol. 35, No. 3, May 1989, pp. 655-657.

Roth, R., "On MDS Codes via Cauchy Matrices", IEEE Transactions on Information Theory, vol. 35, No. 6, Nov. 1989, pp. 1314-1319.

Schwarz, Heiko et al., "Overview of the Scalable Video Coding Extension of the H.264/AVC Standard", IEEE Transactions on Circuits and Systems for Video Technology, vol. 17, No. 9, Sep. 2007, pp. 1103-1120.

Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T Rec. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.

Shokrollahi et al., "Design of Efficient Easure Codes with Differential Evolution", IEEE International Symposium on Information Theory, Jun. 25, 2000, pp. 5-5.

Sincoskie, W. D., "System Architecture for Large Scale Video on Demand Service," Computer Network and ISDN Systems, pp. 155-162, (1991).

Stockhammer, WD 0.1 of 23001-6 Dynamic Adaptive Streaming over HTTP (DASH), MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.

Sullivan et al., Document: JVT-AA007, "Editors' Draft Revision to ITU-T Rec. H.264|IS0/IEC 14496-10 Advanced Video Coding—In Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29-Feb. 3, 2009, pp. 1-683, http://wftp3.itu.int/av-arch/jvt-site/2009_01_Geneva/JVT-AD007.zip.

Sun, et al., "Seamless Switching of Scalable Video Bitstreams for Efficient Streaming," IEEE Transactions on Multimedia, vol. 6, No. 2, Apr. 2004, pp. 291-303.

Thomas Wiegand, et al., "Joint Draft ITU-T Rec. H.264 I ISO/IEC 14496-10 / Amd.3 Scalable video coding", Joint Video Team (JVT) of ISO/IEC MPEG & ITU-T VCEG (ISO/IEC JTC1/SC29/WG11 and ITU-T SG16 Q.6) 24th Meeting: Geneva, Switzerland, Jun. 29-Jul. 5, 2007, pp. 1-559.

Vetro, et al., Document: JVT-AB204 (rev. 1), "Joint Draft 8.0 on Multiview Video Coding," Joint Video Team (JVT) of ISO/IEC MPEG & ITU-T VCEG(ISO/IEC JTC1/SC29/WG11 and ITU-T SG16 Q.6), 28th Meeting: Hannover, DE, Jul. 20-25, 2008, pp. 1-66, http://wftp3.itu.int/av-arch/jvt-site/2008_07_Hannover/JVT-AB204.zip.

Viswanathan, et al., "Metropolitan area video-on-demand services using pyramid broadcasting", Multimedia Systems, 4(4): 197-208 (1996).

Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).

(56) References Cited

OTHER PUBLICATIONS

Viswanathan, et al.: "Publishing in Wireless and Wireline Environments," Ph. D Thesis, Rutgers, The State University of New Jersey (Nov. 1994).
Wenger S., "RTP Payload Format for H.264 Video", Network Working Group, Feb. 2005, pp. 1-84.
Wong, J.W., "Broadcast delivery", Proceedings of the IEEE, 76(12): 1566-1577, (1988).
Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.
Ying Chen et al., "Coding techniques in Multiview Video Coding and Joint Multiview Video Model", Picture Coding Symposium, 2009, PCS 2009, IEEE, Piscataway, NJ, USA, May 6, 2009, pp. 1-4, XP031491747, ISBN: 978-1-4244-4593-6.
Zorzi, et al.: "On the Statistics of Block Errors in Bursty Channels," IEEE Transactions on Communications, vol. 45, No. 6, Jun. 1997, pp. 660-667.
"3rd Generation Partnership Project; Technical Specification Group Services and System Aspects; Transparent end-to-end packet switched streaming service (PSS); 3GPP file format (3GP) (Release 9)", 3GPP Standard; 3GPP TS 26.244. 3RD Generation Partnership Project (3GPP), Mobile Competence Centre; 650, Route Des Lucioles; F-06921 Sophia-Antpolis Cedex; France, No. V9.2.0, Jun. 9, 2010, pp. 1-55, XP050441544, [retrieved on Jun. 9, 2010].
Afzal et al., "Video Streaming over MBMS: A System Design Approach", Journal of Multimedia, Vol, 1, No. 5, Aug. 2006, pp. 25-35.
Amon P et al "File Format for Scalable Video Coding", IEEE Transactions on Circuits and Systems for Video Technology, IEEE Service Center, Piscataway, NJ, US, vol. 17, No. 9, Sep. 1, 2007, pp. 1174-1185, XP011193013, ISSN: 1051-8215, DOI:10.1109/TCSVT. 2007.905521.
Anonymous; [Gruneberg, K., Narasimhan, S. And Chen, Y., editors] "Text of ISO/IEC 13818-1:2007/PDAM 6 MVC operation point descriptor", 90 MPEG Meeting; Oct. 26-30, 2009; Xian; (Motion Picture Expertgroup or ISO/IEC JTC1/SC29/WG11), No. N10942, Nov. 19, 2009, XP030017441.
Anonymous: "Text of ISO/IEC 14496-12 3rd Edition", 83 MPEG Meeting; Jan. 14-18, 2008; Antalya; (Motion Pictureexpert Group or ISO/IEC JTC1/SC29/WG11), No. N9678, Apr. 22, 2008, XP030016172.
Anonymous: "Text of ISO/IEC 14496-15 2nd edition", 91 MPEG Meeting; Jan. 18-22, 2010; Kyoto; (Motion Picture Expertgroup or ISO/IEC JTC1/SC29/WG11) No. N11139, Jan. 22, 2010, XP030017636.
Apple Inc, "On the time-stamps in the segment-inbox for HTTP streaming (26.244, R9)", TSG-SA4#58 meeting, Vancouver, Canada, Apr. 2010, p. 5.
Charles Lee L.H, "Error-Control Block Codes for Communications Engineers", 2000, Artech House, XP002642221 pp. 39-45.
Fernando et al., "HTTP Streaming of MPEG Media—Response to CfP", 93 MPEG Meeting; Jul. 26-30, 2010; Geneva; (Motion Picture Expert Group or ISO/IEC JTC1/SCE29/WG11), No. M17756, Jul. 22, 2010, XP030046346.
Plank J. S., "A Tutprial of Reed-Solomon Coding for Fault-Tolerance I N Raid-Like Systems", Software Practice & Experience, Wiley & Sons, Bognor Regis, GB, vol. 27, No. 9, Sep. 1, 1997, pp. 995-1012, XP00069594.
Pyle at al., "Microsoft HTTP Smooth Streaming: Microsoft response to the Call for Proposal on HTTP Streaming", 93 MPEG Meeting; Jul. 26-30, 2010; Geneva; (Motion Picture Expert Group or ISO/IEC JTC1/SCE29/WG11), No. M17902, Jul. 22, 2010, XP030046492.
Qualcomm Incorporated: "Use Cases and Examples for Adaptive HTTP Streaming", 3GPP Draft; S4-100408-Usecases-HSD, 3RD Generation Partnership Project (JGPP), Mobile Competence Centre; 650, Route Des Lucioles; F-06921 Sophia-Antipolis Cedex; France, vol. SA WG4, No. Prague, Czech Republic: 20100621, Jun. 17, 2010, XP050438085, [retrieved on Jun. 17, 2010].

REALNETWORKS Inc et al "Format for HTTP Streaming Media Presentation Description", 3GPP Draft; S4-100020, 3RD Generation Partnership Project (3GPP), Mobile Competence Centre; 650, Route Des Lucioles; F-06921 Sophia-Antipolis Cedex; France, vol. SA VG4, No. S t Julians, Malta; Jan. 25, 2010, Jan. 20, 2010, XP050437753, [retrieved on Jan. 20, 2010].
Research in Motion UK Limited: "An MPD delta file for HTTP Streaming", 3GPP Draft; S4-100453, 3RD Generation Partnership Project (SGPP), Mobile Competence Centre; 650, Route Des Lucioles : F-06921 Sophia-Antipolis Cedex; France, vol. SA WG4, No. Prague, Czech Republic; Jun. 21, 2010, Jun. 16, 2010; XP050438066, [retrieved on Jun. 16, 2010].
Rhyu et al, "Response to Call for Proposals on HTTP Streaming of MPEG Media", 93 MPEG Meeting; Jul. 26-30, 2010; Geneva; (Motion Picture Expert Group or ISO/IEC JTC1/SCE29/WG11) No. M17779, Jul. 26, 2010, XP030046369.
Telefon AB LM Ericsson et al., "Media Presentation Description in HTTP Streaming", 3GPP Draft; 34-100080-MPD, 3RD Generation Partnership Project (3GPP), Mobile Competence Centre; 650, Route Des Lucioles; F-06921 Sophia-Antipolis Cedex: France, vol. SA WG4, No. St Julians, Malta; Jan. 25, 2010, Jan. 20, 2010, XP050437773, [retrieved on Jan. 20, 2010].
Wang,"On Random Access", Joint Video Team (JVT) of ISO/IEC MPEG & ITU-T VCEG (ISO/IEC JTC1ISC29/WG11 and ITU-T SG16 Q.6), 4th Meeting: Klagenfurt, Austria, Jul. 22-26, 2002, p. 13.
Ying Chen et al: "Response to the CfP on HTTP Streaming: Adaptive Video Streaming based on AVC", 93 MPEG Meeting; Jul. 26-30, 2010; Geneva; (Motion Picture Expert Group or ISO/IEC JTC1/SC29/WG11), No. M17909, Jul. 26, 2010, XP030046499.
Albanese, A., et al., "Priority Encoding Transmission", IEEE Transactions on Information Theory, vol. 42, No. 6, pp. 1-22, (Nov. 1996).
Anonymous: "Text of ISO/IEC 14496-12:2008/PDAM 2 Sub-track selection & switching", 91. Mpeg Meeting; Jan. 18-22, 2010; Kyoto; (Motion Picture Expertgroup or ISO/IEC JTC1/SC29/WG11), No. N11137, Jan. 22, 2010, XP030017634, ISSN: 0000-0030.
Byers, J.W. et al.: "Accessing multiple mirror sites in parallel: using Tornado codes to speed up downloads," 1999, Eighteenth Annual Joint Conference of the IEEE Comupter and Communications Socities, pp. 275-283, Mar. 21, 1999, XP000868811.
Choi S: "Temporally enhanced erasure codes for reliable communication protocols" Computer Networks, Elsevier Science Publishers B.V., Amsterdam, NL, vol. 38, No. 6, Apr. 22, 2002, pp. 713-730, XP004345778, ISSN: 1389-1286, DOI:10.1016/S1389-1286(01)00280-8.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.com/journals/ijdmb/2009/614178.html> [retrieved on May 12, 2010].
"Digital Video Broadcasting (DVB); Guidelines for the implementation of DVB-IP Phase 1 specifications; ETSI TS 102 542" ETSI Standards, Lis, Sophia Antipoliscedex, France, vol. BC, No. V1.2.1, Apr. 1, 2008, XP014041619 ISSN: 0000-0001 pp. 43, 66, 70, 71.
DVB-IPI Standard: DVB BlueBook A086r4 (03/07) Transport of MPEG 2 Transport Streatm (TS) Based DVB Services over IP Based Networks, ETSI Technical Specification 102 034 v1.3.1.
Gasiba, Tiago et al., "System Design and Advanced Receiver Techniques for MBMS Broadcast Services" PROC. 2006 International Conference on Communications (ICC 2006), Jun. 1, 2006, pp. 5444-5450, XP031025781 ISBN: 978-1-4244-0354-7.
Goya!: "Multiple Description Coding: Compression Meets the Network," In Signal Processing Magazine, IEEE, vol. 18., Issue 5 (Sep. 2001) pp. 74-93 URL:http://www.rle.mitedu/stir/documents/Goyal_SigProcMag2001_MD.pdf [Nov. 4, 2007].
Gozalvez D et, al: "Mobile reception of DVB-T services by means of AL-FEC protection" PROC. IEEE Intern. Symposium on Broadband Multimedia Systems and Broadcasting (BMSB '09), IEEE, Piscataway, NJ, USA, May 13, 2009, pp. 1-5, XP031480155 ISBN: 978-1-4244-2590-7.
IETF RFC 2733: Rosenberg, J. et al. "An RTP Payload Format for Generic Forward Error Correction," Network Working Group, RFC 2733 (Dec. 1999).

(56) References Cited

OTHER PUBLICATIONS

ISO/IEC JTC1/SC29/WG11: "Requirements on HTTP Streaming of MPEG Media", 92. MPEG Meeting; Apr. 19-23, 2010; Dresden; No. N11340, May 14, 2010, XP030017837, ISSN: 0000-0029.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol. 3, Mar. 18, 2005, pp. 1097-1100, XP010792442, DOI: 10.1109/ICASSP.2005.1415905 ISBN: 978-0/7803-8874-1.
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Luby, et al., "FLUTE—File Delivery over Unidirectional Transport", IETF RFC 3926, pp. 1-35, (Oct. 2004).
Luby et, al. "Layered Coding Transport (LCT) Building Block", IETF RFC 5651, pp. 1-42, (Oct. 2009).
Luby, M., et, al. "Forward Error Correction (FEC) Building Block", IETF RFC 5052, pp. 1-31, (Aug. 2007).
Luby M et al: "IPTV Systems, Standards and Architectures: Part II -Application Layer FEC in IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Luby, M., et al., "Raptor Forward Error Correction Scheme for Object Delivery", IETF RFC5053, pp. 1-46 (Sep. 2007).
Luby, M., et al., "RaptorQ Forward Error Correction Scheme for Object Delivery", IETF draft ietf-rmt-bb-fec-raptorq-04, Reliable Multicast Transport, pp. 1-68, (Aug. 24, 2010).
Luby, M., et al., "Request for Comments: 3453: The Use of Forward Error Correction (FEC) in Reliable Multicast," Internet Article, [Online] Dec. 2002, pp. 1-19.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
McCanne, et al., "Low-Complexity Video Coding for Receiver-Driven Layered Multicast", IEEE Journal on Selected Areas in Communication IEEE Service Center, Aug. 1, 1997, vol. 15, No. 6, pp. 983-1001, Piscataway, US, XP011054678, ISSN: 0733-8716.
Mimnaugh, A et, al. "Enabling Mobile Coverage for DVB-T" Digital Fountain Whitepaper Jan. 29, 2008, pp. 1-9, XP002581808 Retrieved from the Internet: URL:http://www.digitalfountain.com/ufiles/library/DVB-T-whitepaper.pdf> [retrieved on May 10, 2010].
Nokia: "Reed-Solomon Code Specification for. MBMS Download and Streaming Services", 3GPP Draft; S4-050265_RS_SPEC, 3RD Generation Partnership Project (3GPP), Mobile Competence Centre; 650, Route Des Lucioles; F-06921 Sophia-Antipolis Cedex; France, vol. SA WG4, No. San Diego, USA; Apr. 15, 2005, XP050287675, [retrieved on Apr. 15, 2005].
Nokia Corp., "Usage of 'mfra' box for Random Access and Seeking," S4-AHI127, 3GPP TSG-SA4 Ad-Hoc Meeting, Dec. 14-16, 2009, Paris, FR, 2 pp.
Roca, V., et, al. "Low Density Parity Check (LDPC) Staircase and Triangle Forward Error Correction (FEC) Schemes", IETF RFC 5170 (Jun. 2008), pp. 1-34.
Tsunoda T., et al., "Reliable Streaming Contents Delivery by Using Multiple Paths," Technical Report of the Institute of Electronics, Information and Communication Engineers, Japan, Mar. 2004, vol. 103, No. 692, pp. 187-190, NS2003-331, IN2003-286.
U.S. Appl. No. 12/840,146, filed Jul. 20, 2010, by Ying Chen et al.
U.S. Appl. No. 12/908,537, filed Oct. 20, 2010, by Ying Chen et al.
U.S. Appl. No. 12/908,593, filed Oct. 20, 2010, by Ying Chen et al.
U.S. Appl. No. 13/082,051, filed Apr. 7, 2011, by Ying Chen et al.
U.S. Appl. No. 13/205,559, filed Aug. 8, 2011, by Ying Chen et al.
U.S. Appl. No. 13/205,565, filed Aug. 8, 2011, by Ying Chen et al.
U.S. Appl. No. 13/205,574, filed Aug. 8, 2011, by Ying Chen et al.
Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010, XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].
Watson, M., et, al. "Asynchronous Layered Coding (ALC) Protocol Instantiation", IETF RCF 5775, pp. 1-23, (Apr. 2010).
Cataldi at al., "Sliding-Window Raptor Codes for Efficient Scalable Wireless Video Broadcasting With Unequal Loss Protction", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.
Gracie et al., "Turbo and Turbo-Like Codes: Principles and Applications in Telecommunicatons", Proceedings of the IEEE, Jun. 1, 2007, pp. 1228-1254, vol. 95, No. 6, IEEE, XP011189323, ISSN: 0018-9219, DOI: 10.1109/JPROC.2007.895197.
Huawei et al., "Implict mapping between CCE and PUCCH for ACK/NACK TDD", 3GPP Draft; R1-082359, 3RD Generation Partnership Project (3GPP), Mobile Competence Centre; 650, Route Des Lucioles; F-06921 Sophia-Antipolis Cedex; France, vol. RAN WG1, No. Warsaw, Poland, Jun. 24, 2008, XP050110650, [retrieved on Jun. 24, 2008].
International Search Report and Written Opinion—PCT/US2012/024737—ISA/EPO—May 11, 2012.
Kimura et al., "A Highly Mobile SDM-0FDM System Using Reduced-Complexity-and-Latency Processing",IEEE Intenational Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.
Luby Qualcomm Incorporated, "Universal Object Delivery using RaptorQ; draft-luby-uod-raptorq-OO.txt", Internet Society (ISOC), Mar. 7, 2011, pp 1-10, XP015074424, [retrieved on Mar. 7, 2011].
MacKay, "Fountain codes capacity approaching codes design and implementation", IEE Proceedings: Communications, Dec. 9, 2005, pp. 1062-1068, vol. 152, No. 6, Institution of Electrical Engineers, XP006025749. ISSN: 1350-2425, DOI: 1049/IP-C0M:20050237.
Todd, "Error Correction Coding: Mathematical Methods and Algorithms", Mathematical Methods and Algorithms, Jan. 1, 2005, pp. 451-534, Wiley, XP002618913.
Wiegand T et al.," WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010.
Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, CH, Nov. 21-30, 2011, pp. 259.
Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27-May 7, 2012, JCTVC-I1003_d21, pp. 290.
Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.
Bross et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.
Bross et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.
European Search Report—EP10013235—Search Authority—The Hague—Aug. 20, 2012.
European Search Report—EP10013236—Search Authority—The Hague—Jul. 12, 2012.

(56) References Cited

OTHER PUBLICATIONS

"International Preliminary Report on Patentability—PCT/US2011/044284, The International Bureau of WIPO—Geneva, Switzerland, Oct. 8, 2012."
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Jiang., File Format for Scalable Video Coding, PowerPoint Presentation for CMPT 820, Summer 2008.
Pantos, "HTTP Live Streaming draft-pantos-http-live-streaming-02", Informational, Internet-Draft, Intended status: Informational, Expires: Apr. 8, 2010, http://toolsiettorg/html/draft-pantos-http-live-streaming-02, pp. 1-20, Oct. 5, 2009.
Supplementry European Search Report—EP08746007—Search Authority—Munich—Sep. 27, 2012.
Wiegand et al., "WD3: Working Draft 3 of High-Efficiency Video Coding," Document JCTVC-E603, 5th Meeting: Geneva, CH, Mar. 16-23, 2011, 193 pp.
Wiegand T. et al., "WD2: Working Draft 2 of High-Efficiency Video Coding", Jan. 28, 2011, No. JCTVC-D503, Jan. 28, 2011, XP002679642, Retrieved from the Internet: URL: http://wftp3.itu.int/av-archictvc-site/2011_01_D_Daegu/ [retrieved on Jul. 11, 2012].
Yamanouchi N., et al., "Internat Multimedia Transmission with Packet by Using forward Error Correction," Proceedings of DPS workshop, The Informantion Processing Society of Japan, Dec. 6, 2000, vol. 2000, No. 15, pp. 145-150.
Anonymous: "Technologies under Consideration", 100. MPEG Meeting; Apr. 30-5, 2012; Geneva; (Motion Picture Expert Group or ISO/IEC JTC1 /SC29/WG11) No. N12682, Jun. 7, 2012, XP030019156.
Gil A., et al., "Personalized Multimedia Touristic Services for Hybrid Broadcast/Broadband Mobile Receivers," IEEE Transactions on Consumer Electronics, 2010, vol. 56 (1), pp. 211-219.
Hannuksela M.M., et al., "DASH: Indication of Subsegments Starting with Sap, 97. Mpeg Meeting; Jul. 18-22, 2011; Torino; (Motion Picture Expert Group or ISO/IEC JTC1/SC29/WG11)" No. m21096, Jul. 21, 2011, XP030049659.
Hannuksela M.M., et al., "ISOBMFF: SAP definitions and 'sidx' box", 97. MPEG Meeting; Jul. 18-22, 2011; Torino; (Motion Picture Expert Group or ISO/IEC JTC1/SC29/WG11) No. m21435, Jul. 22, 2011, XP030049998.
Li, M., et al., "Playout Buffer and Rate Optimization for Streaming over IEEE 802.11 Wireless Networks", Aug. 2009, Worcester Polytechnic Institute, USA.
Roumy a., et al., "Unequal Erasure Protection and Object Bundle Protection with the Generalized Object Encoding Approach", Inria-00612583, Version 1, Jul. 29, 2011, 25 pages.
Stockhammer T., et al., "DASH: Improvements on Representation Access Points and related flags", 97. MPEG Meeting; Jul. 18-22, 2011; Torino; (Motion Picture Expert Group or ISO/IEC JTC1/SC29/WG11) No. m20339, Jul. 24, 2011, XP030048903.
Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.
3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3RD Generation Partnership Project (3GPP), Mobile Competence Centre; 650, Route Des Lucioles; F-06921 Sophia-Antipolis Cedex; France, vol. SA WG4, No. V10.0.0, Jun. 17, 2011, pp. 1-94, XP050553206, [retrieved on Jun. 17, 2011].
Atis: "PTV Content on Demand Service", IIF-WT-063R44, Nov. 11, 2010, pp. 1-124, XP055045168, Retrieved from the Internet: URL:ftp://vciegits.bldrdoc.gov/Documents/VQEG_Atlanta_Nov10/MeetingFiles/Liaison/IIF-WT-063R44_Content_on_Demand.pdf [retrieved on Nov. 22, 2012].
Bouazizi I., et al., "Proposals for ALC/FLUTE server file format (14496-12Amd.2)", 77. MPEG Meeting; Jul. 17-21, 2006; Klagenfurt; (Motion Pictureexpert Group or ISO/IEC JTC1/SC29/WG11), No. M13675, Jul. 12, 2006, XP030042344, ISSN: 0000-0236.
European Search Report—EP10013232—Search Authority—The Hague—Feb. 28, 2013.
Frojdh P., et al., "Study on 14496-12:2005/PDAM2 ALU/FLUTE Server File Format", 78.MPEG Meeting; Oct. 23-27, 2006; Hangzhou: (Motion Picturexpert Group or ISO/IEC JTC1/SC29/WG11) No. M13855, Oct. 13, 2006, XP030042523, ISSN: 0000-0233.
International Search Report and Written Opinion—PCT/US2012/053394—ISA/EPO—Feb. 6, 2013.
Luby et al., RaptorQ Forward Error Correction Scheme for Object Delivery draft-ietf-rmt-bb-fec-raptorq-00, Qualcomm, Inc. Jan. 28, 2010.
Michael G et al., "Improved low-density parity-check codes using irregular graphs", Information Theory, IEEE Transactions on, Feb. 2001, vol. 47, No. 2, pp. 585-598.
Motorola et al: "An Analysis of DCD Channel Mapping to Boast File Delivery Sessions; OMA-CD-DCD-2007-0112-INP_DCD_Channel_Mapping_to_BCAST_File_Delivery", OMA-CD-DCD-2007-0112-INP_DCD_Channel_Mapping_To_BCAST_File_Delivery, Open Mobile Alliance (OMA), 4330 La Jolla Village Dr., Suite 110 San Diego, CA 92122; USA Oct. 2, 2007, pp. 1-13, XP064036903.
Ohashi a et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Schulzrinne, et al., "Real Time Streaming Protocol (RTSP)" Network Working Group, Request for Comments: 2326, Apr. 1998, pp. 1-92.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/etsits/126300_126399/126346/06.01.00_60/ts_126346v060100p.pdf.
Anonymous: "Technologies under Consideration", 98. MPEG Meeting; Nov. 28-Feb. 12, 2011; Geneva; (Motion Picture Expert Group or ISO/IEC JTC1/SC29/WG11) No. N12330, Dec. 3, 2011, XP030018825.
Anonymous: "Text of ISO/IEC IS 23009-1 Media Presentation Description and Segment Formats", 98. MPEG Meeting; Nov. 28-Feb. 12, 2012; Geneva; (Motion Picture Expert Group or ISO/IEC JTC1/SC29/WG11) No. N12329, Jan. 6, 2012, XP030018824.
"Digital Video Broadcasting (DVB); Framing structure, channel coding and modulation for digital terrestrial television; ETSI EN 300 744" ETSI Standards, Lis, Sophia Antipolis Cedex, France, V1.6.1, pp. 9, Jan. 10, 2009.
Kim J., et al., "Enhanced Adaptive Modulation and Coding Schemes Based on Multiple Channel Reportings for Wireless Multicast Systems", 62nd IEEE Vehicular Technology Conference, VTC-2005-Fall, Sep. 25-28, 2005, vol. 2, pp. 725-729, XP010878578, DOI: 1 0.11 09/Vetecf.2005.1558019, ISBN: 978-0/7803-9152-9.
Moriyama, S., "5. Present Situation of Terrestrial Digital Broadcasting in Europe and USA", Journal of The Institute of Image Information and Television Engineers, Nov. 20, 1999, vol. 53, No. 11, pp. 1476-1478.
Qualcomm Incorporated: "RaptorQ Technical Overview", pp. 1-12, Oct. 1, 2010.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.

(56) References Cited

OTHER PUBLICATIONS

Makoto N., et al., "On Tuning of Blocking LU decomposition for VP2000 series" the 42th Information Processing Society of Japan Conference (1st term in 1991), Feb. 25, 1991, pp. 71-72, 4B-8.
Miller G., et al., "Bounds on the maximum likelihood decoding error probability of low density parity check codes", Information Theory, 2000. Proceedings. IEEE International Symposium on, 2000, p. 290.
Muramatsu J., et al., "Low density parity check matrices for coding of multiple access networks", Information Theory Workshop, 2003. Proceedings. 2003 IEEE, Apr. 4, 2003, pp. 304-307.
Samukawa, H. "Blocked Algorithm for LU Decomposition" Journal of the Information Processing Society of Japan, Mar. 15, 1993, vol. 34, No. 3, pp. 398-408.
3GPP TSG-SA4 #57 S4-100015, IMS based PSS and MBMS User Service extensions, Jan. 19, 2010, URL : http://www.3gpp.org/ftp/tsg_sa/WG4_CODEC/TSGS4_57/docs/S4-100015.zip.
3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010 P.85-102,URL,http://www.3gpp.org/ftp/TSG_SA/WG4_CODEC/TSGS4_59/Docs/S4-100511.zip, 26234-930.zip.
Lee, J.Y., "Description of Evaluation Experiments on ISO/IEC 23001-6, Dynamic Adaptive Streaming over HTTP", ISO/IEC JTC1/SC29/WG11MPEG2010/N11450, Jul. 31, 2010, 16 pp.
Luby M., "Simple Forward Error Correction (FEC) Schemes," draft-luby-rmt-bb-fec-supp-simple-00.txt, pp. 1-14, Jun. 2004.
Luby M., "LT Codes", Foundations of Computer Science, 2002, Proceedings, The 43rd Annual IEEE Symposium on, 2002.
Morioka S., "A Verification Methodology for Error Correction Circuits over Galois Fields", Tokyo Research Laboratory, IBM Japan Ltd, pp. 275- 280, Apr. 22-23, 2002.
Qualcomm Incorporated: "Adaptive HTTP Streaming: Complete Proposal", 3GPP TSGSA4 AHI Meeting S4-AHI170, Mar. 2, 2010, URL, http://www.3gpp.org/Ftp/tsg_sa/WG4_CODEC/Ad-hoc_MBS/Docs_AHI/S4-AHI170.zip, S4- AH170_Cr_AdaptiveHTTPStreaming-Full.doc.
Qualcomm Incorporated: "Corrections to 3GPP Adaptive HTTP Streaming", 3GPP TSG-SA4 #59 Change Request 26.234 CR0172 S4-100403, Jun. 16, 2010, URL, http://www.3gpp.org/FTP/tsg_sa/WG4_CODEC/TSGS4_59/Docs/54-100403.zip, S4-100403_CR_26234-0172-AdaptiveHTTPStreaming-Re1-9.doc.
Chikara S., et al., "Add-on Download Scheme for Multicast Content Distribution Using LT Codes", IEICE. B, Communications, Aug. 1, 2006, J89-B (8), pp. 1379-1389.
Gerard F., et al., "HTTP Streaming MPEG media—Response to CFP", 93. MPEG Meeting, Geneva Jul. 26, 2010 to Jul. 30, 2010.
Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.
Tetsuo M., et al., "Comparison of Loss Resilient Ability between Multi-Stage and Reed-Solomon Coding ", Technical report of IEICE. CQ, Communication Quality, vol. 103 (178), Jul. 4, 2003, pp. 19-24.
Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.
Watson M., et al., "Forward Error Correction (FEC) Framework draft-ietf-fecframe-framework11," 2011, pp. 1-38, URL,http://tools.ietf.org/pdf/draft-ietf-fecframe-framework-11.pdf.
Watson M., et al., "Raptor FEC Schemes for FECFRAME draft-ietf-fecframe-raptor-04," 2010, pp. 1-21, URL,http://tools.ietf.org/pdf/draft-ietf-fecframe-raptor-04.pdf.
Ramsey B, "HTTP Status: 206 Partial Content and Range Requests," May 5, 2008 obtained at http://benramsey.com/blog/2008/05/206-partial-content-and-range-requests/.

* cited by examiner

MULTI STAGE CODE GENERATOR AND DECODER FOR COMMUNICATION SYSTEMS

CROSS-REFERENCE TO RELATED APPLICATIONS

This is a continuation application of U.S. patent application Ser. No. 11/354,256, filed Feb. 13, 2006 to be issued May 18, 2010 as U.S. Pat. No. 7,720,174 which is a continuation application of U.S. patent application Ser. No. 10/032,156 filed Dec. 21, 2001, now U.S. Pat. No. 7,068,729, issued Jun. 27, 2006 entitled "Multi-Stage Code Generator and Decoder for Communication Systems," each of which is herein incorporated by reference in its entirety for all purposes.

BACKGROUND OF THE INVENTION

The present invention relates to encoding and decoding data in communications systems and more specifically to communication systems that encode and decode data to account for errors and gaps in communicated data.

Transmission of files between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

Another consideration in selecting a code is the protocol used for transmission. In the case of the global internetwork of networks known as the "Internet" (with a capital "I"), a packet protocol is used for data transport. That protocol is called the Internet Protocol or "IP" for short. When a file or other block of data is to be transmitted over an IP network, it is partitioned into equal size input symbols and input symbols are placed into consecutive packets. The "size" of an input symbol can be measured in bits, whether or not the input symbol is actually broken into a bit stream, where an input symbol has a size of M bits when the input symbol is selected from an alphabet of $2^M$ symbols. In such a packet-based communication system, a packet oriented coding scheme might be suitable. A transmission is called reliable if it allows the intended recipient to recover an exact copy of the original file even in the face of erasures in the network. On the Internet, packet loss often occurs because sporadic congestion causes the buffering mechanism in a router to reach its capacity, forcing it to drop incoming packets. Protection against erasures during transport has been the subject of much study.

The Transport Control Protocol ("TCP") is a point-to-point packet control scheme in common use that has an acknowledgment mechanism. TCP is good for one-to-one communications, where the sender and recipient both agree on when the transmission will take place and be received and both agree on which transmitters and receivers will be used. However, TCP is often not suitable for one-to-many or many-to-many communications or where the sender and the recipient independently determine when and where they will transmit or receive data.

Using TCP, a sender transmits ordered packets and the recipient acknowledges receipt of each packet. If a packet is lost, no acknowledgment will be sent to the sender and the sender will resend the packet. Packet loss has a number of causes. With protocols such as TCP/IP, the acknowledgment paradigm allows packets to be lost without total failure, since lost packets can just be retransmitted, either in response to a lack of acknowledgment or in response to an explicit request from the recipient. Either way, an acknowledgment protocol requires a back channel from the recipient to the sender that is used heavily at times when the number of lost packets is large.

Although acknowledgment-based protocols are generally suitable for many applications and are in fact widely used over the current Internet, they are inefficient, and sometimes completely infeasible, for certain applications as such as those described in U.S. Pat. No. 6,307,487 issued to Michael G. Luby entitled "Information Additive Code Generator and Decoder for Communication Systems" (hereinafter "Luby I"). Furthermore, acknowledgment-based protocols do not scale well to broadcasting, where one sender is sending a file simultaneously to multiple users. For example, suppose a sender is broadcasting a file to multiple recipients over a satellite channel. Each recipient may experience a different pattern of packet loss. Protocols that rely on acknowledgment data (either positive or negative) for reliable delivery of the file require a back channel from each recipient to the sender, and this can be prohibitively expensive to provide. Furthermore, this requires a complex and powerful sender to be able to properly handle all of the acknowledgment data sent from the recipients. Another drawback is that if different recipients lose different sets of packets, rebroadcast of packets missed only by a few of the recipients causes reception of useless duplicate packets by other recipients.

An alternative to an acknowledgment-based protocol that is sometimes used in practice is a carousel-based protocol. A carousel protocol partitions an input file into equal length input symbols, places each input symbol into a packet, and then continually cycles through and transmits all the packets. A major drawback with a carousel-based protocol is that if a recipient misses even one packet, then the recipient has to wait another entire cycle before having a chance at receiving the missed packet. Another way to view this is that a carousel-based protocol can cause a large amount of useless duplicate data reception. For example, if a recipient receives packets from the beginning of the carousel, stops reception for a while, and then starts receiving again at the beginning of the carousel, a large number of useless duplicate packets are received.

One solution that has been proposed to solve the above problems is to avoid the use of an acknowledgment-based protocol, and instead use Forward Error-Correction (FEC) codes, such as Reed-Solomon codes or Tornado codes, or chain reaction codes which are information additive codes, to increase reliability. With these codes, output symbols are generated from the content and sent instead of just sending the input symbols that constitute the content. Erasure correcting codes, such as Reed-Solomon or Tornado codes, generate a fixed number of output symbols for a fixed length content. For example, for K input symbols, N output symbols might be generated. These N output symbols may comprise the K original input symbols and N−K redundant symbols. If storage permits, then the sender can compute the set of output symbols for each content only once and transmit the output symbols using a carousel protocol.

One problem with some FEC codes is that they require excessive computing power or memory to operate. Another problem is that the number of output symbols must be determined in advance of the coding process. This can lead to inefficiencies if the loss rate of packets is overestimated, and can lead to failure if the loss rate of packets is underestimated.

For traditional FEC codes, the number of possible output symbols that can be generated is of the same order of magnitude as the number of input symbols the content is partitioned into. Typically, most or all of these output symbols are generated in a preprocessing step before the sending step. These output symbols have the property that all the input symbols can be regenerated from any subset of the output symbols equal in length to the original content or slightly longer in length than the original content.

Embodiments described in Luby I (referred to herein as "chain reaction codes") provide a different form of forward error-correction that addresses the above issues. For chain reaction codes, the pool of possible output symbols that can be generated is typically orders of magnitude larger than the number of the input symbols, and a random output symbol from the pool of possibilities can be generated very quickly. For chain reaction codes, the output symbols can be generated on the fly on an as needed basis concurrent with the sending step. Chain reaction codes have the property that all input symbols of the content can be regenerated from any subset of a set of randomly generated output symbols slightly longer in length than the original content.

In one embodiment of a chain reaction code, each output symbol is obtained as the Exclusive-Or (XOR, denoted by $\oplus$) of some of the input symbols. If K denotes the total number of input symbols, then each output symbol is, on average, the XOR of $c*\ln(K)$ input symbols, where $\ln(K)$ is the natural logarithm of K and c is a suitable constant. For example, where K is 60,000, each output symbol is the XOR of, on average, 28.68 input symbols, and where K is 10,000, each output symbol is the XOR of, on average, 22.86 input symbols. A large number of XOR's results in a longer computation time of the output symbols as each such operation involves fetching data from memory, performing the XOR operation, and updating memory locations.

One property of the output symbols produced by a chain reaction encoder is that a receiver is able to recover the original file as soon as enough output symbols have been received. Specifically, to recover the original K input symbols with a high probability, the receiver needs approximately K+A output symbols. The ratio A/K is called the "relative reception overhead." The relative reception overhead depends on the number K of input symbols, and on the reliability of the decoder. For example, in one specific embodiment, and where K is equal to 60,000, a relative reception overhead of 5% ensures that the decoder successfully decodes the input file with a probability of at least $1-10^{-8}$, and where K is equal to 10,000, a relative reception overhead of 15% ensures the same success probability of the decoder. In one embodiment, the relative reception overhead of chain reaction codes can be computed as $(13*sqrt(K)+200)/K$, where $sqrt(K)$ is the square root of the number of input symbols K. In this embodiment the relative reception overhead of chain reaction codes tends to be larger for small values of K.

In embodiments in which output symbols are encoded using the XOR function, a chain reaction decoder's main computational operation is performing XOR's of memory locations. The number of such XOR's scales in the same way as for the chain reaction encoder.

Chain reaction codes are extremely useful for communication over a packet based network. However, they can be fairly computationally intensive. For example, in some specific embodiments of chain reaction codes, when the number of input symbols K is 60,000, then computation of each output symbols requires fetching, on average, 28.68 randomly selected input symbols and XOR'ing them. Because the number of files that can be simultaneously served by a server is inversely proportional to the number of operations needed for every output symbol, it would be useful to decrease the number of operations needed for every output symbol. Decreasing the latter by a factor of say, three, increases the number of files that can be simultaneously served from one server by a factor of three.

Another property of chain reaction codes is that they require a reception overhead that can be relatively large for a given target success probability. For example, as pointed out above, in some specific embodiments of chain reaction codes, if K is 10,000, then a relative reception overhead of 15% ensures a decoding success probability of at least $1-10^{-8}$. The reception overhead tends to increase for smaller K. For example, in some specific embodiments of chain reaction codes, if K is 1000, a relative reception overhead of 61% ensures successful decoding with the same probability. Moreover, decreasing the target error probability to a number around $10^{-12}$, as required by certain applications such as high speed transmission of content over a satellite network, calls for an even larger reception overhead.

BRIEF SUMMARY OF THE INVENTION

According to one embodiment of the invention, a method of encoding data for transmission from a source to a destination over a communications channel is provided. The method operates on an ordered set of input symbols and includes generating a plurality of redundant symbols from the input symbols. The method also includes generating a plurality of output symbols from a combined set of symbols including the input symbols and the redundant symbols, wherein the number of possible output symbols is much larger than the number of symbols in the combined set of symbols, wherein at least one output symbol is generated from more than one symbol in the combined set of symbols and from less than all of the symbols in the combined set of symbols, and such that the ordered set of input symbols can be regenerated to a desired degree of accuracy from any predetermined number of the output symbols.

According to another embodiment of the invention, a system for encoding data for transmission from a source to a destination over a communications channel is provided. The system comprises a static encoder coupled to receive a plurality of input symbols, the plurality of input symbols generated from data to be transmitted. The static encoder includes a redundant symbol generator that generates a plurality of redundant symbols based on the input symbols. The system additionally comprises a dynamic encoder coupled to receive the plurality of input symbols and the plurality of redundant symbols. The dynamic encoder includes an output symbol generator that generates a plurality of output symbols from a combined set of symbols including the plurality of input symbols and the plurality of redundant symbols, wherein the number of possible output symbols is much larger than the number of symbols in the combined set, wherein at least one output symbol is generated from more than symbol from the combined set and from less than all of the symbols in the combined set, and such that the ordered set of input symbols can be regenerated to a desired degree of accuracy from any predetermined number of the output symbols.

According to yet another embodiment of the invention, a method of receiving data transmitted from a source over a communications channel is provided. The method includes receiving output symbols, wherein each output symbol is generated from at least one symbol in a combined set of input symbols and redundant symbols, wherein at least one output symbol is generated from more than one symbol in the combined set and less than all of the symbols in the combined set, wherein the number of possible output symbols is much larger than the number of symbols in the combined set, wherein the input symbols are from an ordered set of input symbols, and wherein the redundant symbols are generated from the input symbols. The method also includes upon receiving any predetermined number, N, of the output symbols, regenerating at least a subset of the symbols in the combined set from the N output symbols, the subset including a plurality of regenerated input symbols and a plurality of regenerated redundant symbols. The method further includes, if the step of regenerating at least a subset of the symbols from the N output symbols does not regenerate the input symbols to a desired degree of accuracy, regenerating at least some of unregenerated input symbols from the plurality of regenerated redundant symbols and/or some of the plurality of regenerated input symbols.

According to still another embodiment of the invention, a system for receiving data transmitted from a source over a communications channel is provided. The system comprises a receive module coupled to a communications channel for receiving output symbols transmitted over the communications channel, wherein each output symbol is generated from at least one symbol in a combined set of input symbols and redundant symbols, wherein at least one output symbol is generated from more than one symbol in the combined set and less than all of the symbols in the combined set, wherein the number of possible output symbols is much larger than the number of symbols in the combined set, wherein the input symbols are from an ordered set of input symbols, wherein the redundant symbols are generated from the input symbols. The system additionally comprises a dynamic decoder that, upon receiving a predetermined number, N, of the output symbols, decodes a subset of the symbols in the combined set from the N output symbols, the subset including a plurality of decoded input symbols and a plurality of decoded redundant symbols. The system further comprises a static decoder that decodes at least some of undecoded input symbols, if any, from the plurality of decoded redundant symbols.

According to yet another embodiment of the invention, a computer data signal embodied in a carrier wave is provided. The computer data signal includes a plurality of output symbols, wherein the plurality of output symbols represents symbols generated from a combined set of symbols including an ordered set of input symbols and the redundant symbols, wherein the redundant symbols are generated from the input symbols, wherein the number of possible output symbols is much larger than the number of symbols in the combined set of symbols, wherein at least one output symbol is generated from more than one symbol in the combined set of symbols and from less than all of the symbols in the combined set of symbols, and such that a receiver of the data signal can regenerate the ordered set of input symbols to a desired degree of accuracy from any predetermined number of the output symbols.

Numerous benefits are achieved by way of the present invention. For example, in a specific embodiment, the computational expense of encoding data for transmission over a channel is reduced. In another specific embodiment, the computational expense of decoding such data is reduced. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

DETAILED DESCRIPTION OF SPECIFIC EMBODIMENTS

Figure 1:
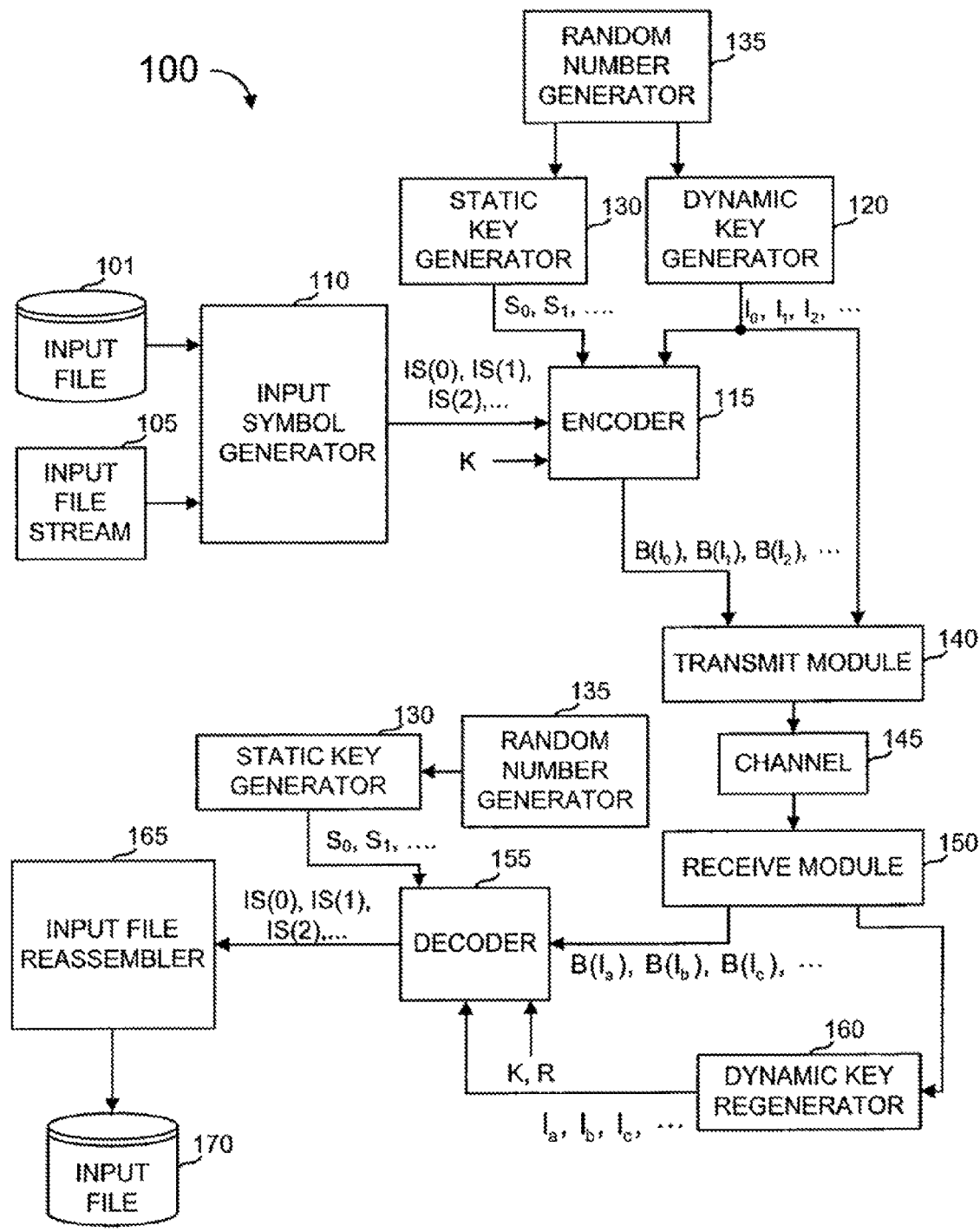
FIG. 1 is a block diagram of a communications system according to one embodiment of the present invention.

The present disclosure references U.S. Pat. No. 6,307,487 (Luby I), and U.S. Pat. No. 6,320,520 issued to Michael G. Luby entitled "Information Additive Group Code Generator and Decoder for Communication Systems" (hereinafter "Luby II"), the entire disclosures of which are herein incorporated by reference for all purposes. Luby I and Luby II provide teachings of systems and methods that can be employed in certain embodiments according to the present invention. It is to be understood, however, that these systems and methods are not required of the present invention, and many other variations, modifications, or alternatives can also be used.

In the specific embodiments described herein, a coding scheme denoted as "multi-stage coding" is described, preceded by an explanation of the meaning and scope of various terms used in this description.

Multi-stage encoding, as described herein, encodes the data in a plurality of stages. Typically, but not always, a first stage adds a predetermined amount of redundancy to the data. A second stage then uses a chain reaction code, or the like, to produce output symbols from the original data and the redundant symbols computed by the first stage of the encoding. In one specific embodiment of the present invention, the received data is first decoded using a chain reaction decoding process. If that process is not successful in recovering the original data completely, a second decoding step can be applied.

One advantage of some embodiments described herein, is that fewer arithmetic operations are necessary to produce output symbols, as compared to chain reaction coding alone, as will be described below. Another advantage of some specific embodiments that include a first stage of encoding and a second stage of encoding is that the first stage of encoding and the second stage of encoding can be done at separate times and/or by separate devices, thus partitioning the computational load. This can be an advantage, for instance, if it is desired to perform a portion of the encoding substantially concurrently with the transmission. Particularly, the first stage of encoding can be performed well in advance of the transmission, while the second stage of encoding can be performed substantially concurrently with the transmission. It is to be understood however, that in some embodiments, the first and second stages of encoding can both be performed substantially concurrently with transmission, and/or with one device. Many other variations, modifications, and alternatives will be apparent to those skilled in the art after review of this disclosure.

In embodiments of multi-stage encoding, redundant symbols are generated from the input file during the first stage of encoding. In these embodiments, in the second stage of encoding, output symbols are generated from the combination of the input file and the redundant symbols. In some of these embodiments, the output symbols can be generated as needed. In embodiments in which the second stage comprises chain reaction encoding, each output symbol can be generated without regard to how other output symbols are generated. Once generated, these output symbols can then be placed into packets and transmitted to their destination, with each packet containing one or more output symbols. Non-packetized transmission techniques can be used instead or as well.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

Transmission is the process of transmitting data from one or more senders to one or more recipients through a channel in order to deliver a file. A sender is also sometimes referred to as the encoder. If one sender is connected to any number of recipients by a perfect channel, the received data can be an exact copy of the input file, as all the data will be received correctly. Here, we assume that the channel is not perfect, which is the case for most real-world channels. Of the many channel imperfections, two imperfections of interest are data erasure and data incompleteness (which can be treated as a special case of data erasure). Data erasure occurs when the channel loses or drops data. Data incompleteness occurs when a recipient does not start receiving data until some of the data has already passed it by, the recipient stops receiving data before transmission ends, the recipient chooses to only receive a portion of the transmitted data, and/or the recipient intermittently stops and starts again receiving data. As an example of data incompleteness, a moving satellite sender might be transmitting data representing an input file and start the transmission before a recipient is in range. Once the recipient is in range, data can be received until the satellite moves out of range, at which point the recipient can redirect its satellite dish (during which time it is not receiving data) to start receiving the data about the same input file being transmitted by another satellite that has moved into range. As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in communication systems design, detectable errors can be considered equivalent to erasures by simply dropping all data blocks or symbols that have detectable errors.

In some communication systems, a recipient receives data generated by multiple senders, or by one sender using multiple connections. For example, to speed up a download, a recipient might simultaneously connect to more than one sender to transmit data concerning the same file. As another example, in a multicast transmission, multiple multicast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is not redundant among the streams, even when the transmission rates are vastly different for the different streams, and when there are arbitrary patterns of loss.

In general, a communication channel is that which connects the sender and the recipient for data transmission. The communication channel could be a real-time channel, where the channel moves data from the sender to the recipient as the channel gets the data, or the communication channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the communication channel.

When the sender and recipient are separated by a communication channel in which symbols can be erased, it is preferable not to transmit an exact copy of an input file, but instead to transmit data generated from the input file that assists with recovery of erasures. An encoder is a circuit, device, module or code segment that handles that task. One way of viewing the operation of the encoder is that the encoder generates output symbols from input symbols, where a sequence of input symbol values represent the input file. Each input symbol would thus have a position, in the input file, and a value. A decoder is a circuit, device, module or code segment that reconstructs the input symbols from the output symbols received by the recipient. In multi-stage coding, the encoder and the decoder are further divided into sub-modules each performing a different task.

In embodiments of multi-stage coding systems, the encoder and the decoder can be further divided into sub-modules, each performing a different task. For instance, in some embodiments, the encoder comprises what is referred to herein as a static encoder and a dynamic encoder. As used herein, a "static encoder" is an encoder that generates a number of redundant symbols from a set of input symbols, wherein the number of redundant symbols is determined prior to encoding. Examples of static encoding codes include Reed-Solomon codes, Tornado codes, Hamming codes, Low Density Parity Check (LDPC) codes, etc. The term "static decoder" is used herein to refer to a decoder that can decode data that was encoded by a static encoder.

As used herein, a "dynamic encoder" is an encoder that generates output symbols from a set of input symbols, where the number of possible output symbols is orders of magnitude larger than the number of input symbols, and where the number of output symbols to be generated need not be fixed. One example of a dynamic encoder is a chain reaction encoder, such as the encoders described in Luby I and Luby II. The term "dynamic decoder" is used herein to refer to a decoder that can decode data that was encoded by a dynamic encoder.

Embodiments of multi-stage coding need not be limited to any particular type of input symbol. Typically, the values for the input symbols are selected from an alphabet of $2^M$ symbols for some positive integer M. In such cases, an input symbol can be represented by a sequence of M bits of data from the input file. The value of M is often determined based on, for example, the uses of the application, the communication channel, and/or the size of the output symbols. Additionally, the size of an output symbol is often determined based on the application, the channel, and/or the size of the input symbols. In some cases, the coding process might be simplified if the output symbol values and the input symbol values were the same size (i.e., representable by the same number of bits or selected from the same alphabet). If that is the case, then the input symbol value size is limited when the output symbol value size is limited. For example, it may be desired to put output symbols in packets of limited size. If some data about a key associated with the output symbols were to be transmitted in order to recover the key at the receiver, the output symbol would preferably be small enough to accommodate, in one packet, the output symbol value and the data about the key.

As an example, if an input file is a multiple megabyte file, the input file might be broken into thousands, tens of thousands, or hundreds of thousands of input symbols with each input symbol encoding thousands, hundreds, or only few bytes. As another example, for a packet-based Internet channel, a packet with a payload of size of 1024 bytes might be appropriate (a byte is 8 bits). In this example, assuming each packet contains one output symbol and 8 bytes of auxiliary information, an output symbol size of 8128 bits ($(1024-8)*8$) would be appropriate. Thus, the input symbol size could be chosen as $M=(1024-8)*8$, or 8128 bits. As another example, some satellite systems use the MPEG packet standard, where the payload of each packet comprises 188 bytes. In that example, assuming each packet contains one output symbol and 4 bytes of auxiliary information, an output symbol size of 1472 bits ($(188-4)*8$), would be appropriate. Thus, the input symbol size could be chosen as $M=(188-4)*8$, or 1472 bits. In a general-purpose communication system using multi-stage coding, the application-specific parameters, such as the input symbol size (i.e., M, the number of bits encoded by an input symbol), might be variables set by the application.

Each output symbol has a value. In one preferred embodiment, which we consider below, each output symbol also has associated therewith an identifier called its "key." Preferably, the key of each output symbol can be easily determined by the recipient to allow the recipient to distinguish one output symbol from other output symbols. Preferably, the key of an output symbol is distinct from the keys of all other output symbols. There are various forms of keying discussed in previous art. For example, Luby I describes various forms of keying that can be employed in embodiments of the present invention.

Multi-stage coding is particularly useful where there is an expectation of data erasure or where the recipient does not begin and end reception exactly when a transmission begins and ends. The latter condition is referred to herein as "data incompleteness." Regarding erasure events, multi-stage coding shares many of the benefits of chain reaction coding described in Luby I. In particular, multi-stage output symbols are information additive, so any suitable number of packets can be used to recover an input file to a desired degree of accuracy. These conditions do not adversely affect the communication process when multi-stage coding is used, because the output symbols generated with multi-stage coding are information additive. For example, if a hundred packets are lost due to a burst of noise causing data erasure, an extra hundred packets can be picked up after the burst to replace the loss of the erased packets. If thousands of packets are lost because a receiver did not tune into a transmitter when it began transmitting, the receiver could just pickup those thousands of packets from any other period of transmission, or even from another transmitter. With multi-stage coding, a receiver is not constrained to pickup any particular set of packets, so it can receive some packets from one transmitter, switch to another transmitter, lose some packets, miss the beginning or end of a given transmission and still recover an input file. The ability to join and leave a transmission without receiver-transmitter coordination helps to simplify the communication process.

In some embodiments, transmitting a file using multi-stage coding can include generating, forming or extracting input symbols from an input file, computing redundant symbols, encoding input and redundant symbols into one or more output symbols, where each output symbol is generated based on its key independently of all other output symbols, and transmitting the output symbols to one or more recipients over a channel. Additionally, in some embodiments, receiving (and reconstructing) a copy of the input file using multi-stage coding can include receiving some set or subset of output symbols from one of more data streams, and decoding the input symbols from the values and keys of the received output symbols.

Aspects of the invention will now be described with reference to the figures.

System Overview

FIG. 1 is a block diagram of a communications system 100 that uses multi-stage coding. In communications system 100, an input file 101, or an input stream 105, is provided to an input symbol generator 110. Input symbol generator 110 generates a sequence of one or more input symbols (IS(0), IS(1), IS(2), ...) from the input file or stream, with each input symbol having a value and a position (denoted in FIG. 1 as a parenthesized integer). As explained above, the possible values for input symbols, i.e., its alphabet, is typically an alphabet of $2^M$ symbols, so that each input symbol codes for M bits of the input file. The value of M is generally determined by the use of communication system 100, but a general purpose system might include a symbol size input for input symbol generator 110 so that M can be varied from use to use. The output of input symbol generator 110 is provided to an encoder 115.

Static key generator 130 produces a stream of static keys $S_0, S_1, \ldots$. The number of the static keys generated is generally limited and depends on the specific embodiment of encoder 115. The generation of static keys will be subsequently described in more detail. Dynamic key generator 120 generates a dynamic key for each output symbol to be generated by the encoder 115. Each dynamic key is generated so that a large fraction of the dynamic keys for the same input file are unique. For example, Luby I describes embodiments of key generators that can be used. The outputs of dynamic key generator 120 and the static key generator 130 are provided to encoder 115.

From each key I provided by dynamic key generator 120, encoder 115 generates an output symbol, with a value B(I), from the input symbols provided by the input symbol generator. The operation of encoder 115 will be described in more detail below. The value of each output symbol is generated based on its key, on some function of one or more of the input symbols, and possibly one or more redundant symbols that had been computed from the input symbols. The collection of input symbols and redundant symbols that give rise to a specific output symbol is referred to herein as the output symbol's "associated symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder 115 to select the associates. If K is not known in advance, such as where the input is a streaming file, K can be just an estimate. The value K might also be used by encoder 115 to allocate storage for input symbols and any intermediate symbols generated by encoder 115.

Encoder 115 provides output symbols to a transmit module 140. Transmit module 140 is also provided the key of each such output symbol from the dynamic key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a dynamic key regenerator 160. Dynamic key regenerator 160 regenerates the dynamic keys for the received output symbols and provides these dynamic keys to decoder 155. Static key generator 163 regenerates the static keys $S_0, S_1, \ldots$ and provides them to decoder 155. The static key generator has access to random number generator 135 used both during the encoding and the decoding process. This can be in the form of access to the same physical device if the random numbers are generated on such device, or in the form of access to the same algorithm for the generation of random numbers to achieve identical behavior. Decoder 155 uses the keys provided by dynamic key regenerator 160 and static key generator 163 together with the corresponding output symbols, to recover the input symbols (again IS(0), IS(1), IS(2), ...). Decoder 155 provides the recovered input symbols to an input file reassembler 165, which generates a copy 170 of input file 101 or input stream 105.

An Encoder

Figure 2:
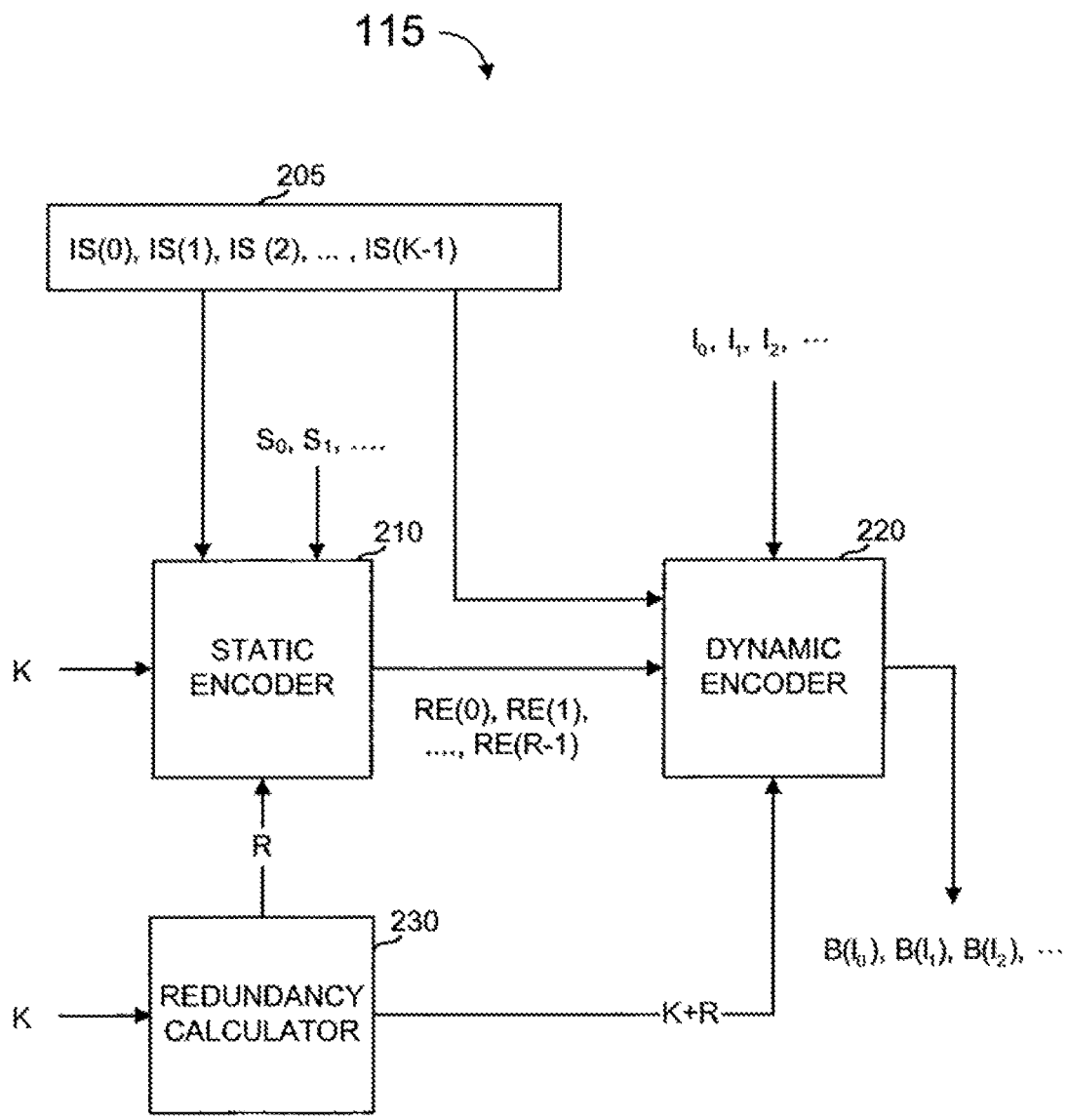
FIG. 2 is a block diagram an encoder according to one embodiment of the present invention.

FIG. 2 is a block diagram of one specific embodiment of encoder 115 shown in FIG. 1. Encoder 115 comprises a static encoder 210, a dynamic encoder 220, and a redundancy calculator 230. Static encoder 210 receives the following inputs: a) original input symbols IS(0), IS(1), ..., IS(K−1) provided by the input symbol generator 110 and stored in an input symbol buffer 205; b) the number K of original input symbols; c) static keys $S_0$, $S_1$, ... provided by the static key generator 130; and d) a number R of redundant symbols. Upon receiving these inputs, static encoder 210 computes R redundant symbols RE(0), RE(1), ..., RE(R−1) as will be described below. Typically, but not always, the redundant symbols have the same size as the input symbols. In one specific embodiment, the redundant symbols generated by static encoder 210 are stored in input symbol buffer 205. Input symbol buffer 205 may be only logical, i.e., the file may be physically stored in one place and the positions of the input symbols within symbol buffer 205 could only be renamings of the positions of these symbols within the original file.

Dynamic encoder 220 receives the input symbols and the redundant symbols, and generates output symbols as will be described in further detail below. In one embodiment in which the redundant symbols are stored in the input symbol buffer 205, dynamic encoder 220 receives the input symbols and redundant symbols from input symbol buffer 205.

Redundancy calculator 230 computes the number R of redundant symbols from the number K of input symbols. This computation is described in further detail below.

In situations where the speed of generating output symbols is a critical resource, the input file could be encoded using static encoder 210 and stored on an intermediate device before the transmission of output symbols starts. This device could be, for example, an attached storage device at a different physical location than dynamic encoder 220, it could be included in the same physical device as dynamic encoder 220, etc. In the case where the file has been encoded with static encoder 210 well in advance of encoding with dynamic encoder 220, the computational device that implements dynamic encoder 220 need not devote resources to static encoding. Thus, it could devote more resources to dynamic encoding in order to, for example, increase the speed of generating output symbols for the input file, generate output symbols for other files, perform other tasks, etc. Whether or not static encoding can or should be performed in advance of dynamic encoding is dependent upon the particular implementation.

Overview of Static Encoder

Figure 3:
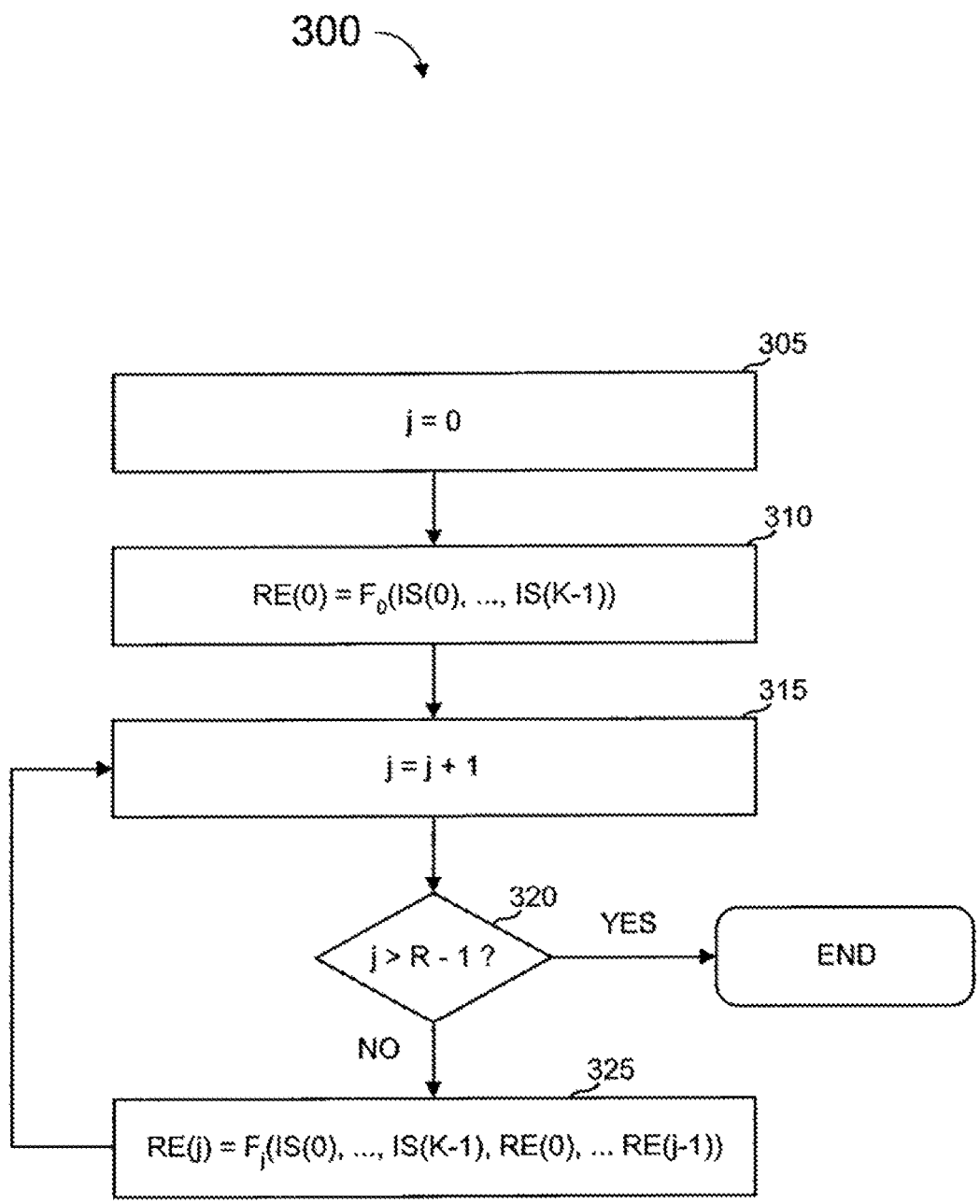
FIG. 3 is a simplified block diagram of a method of generating redundant symbols according to one embodiment of the present invention.
Figure 4:
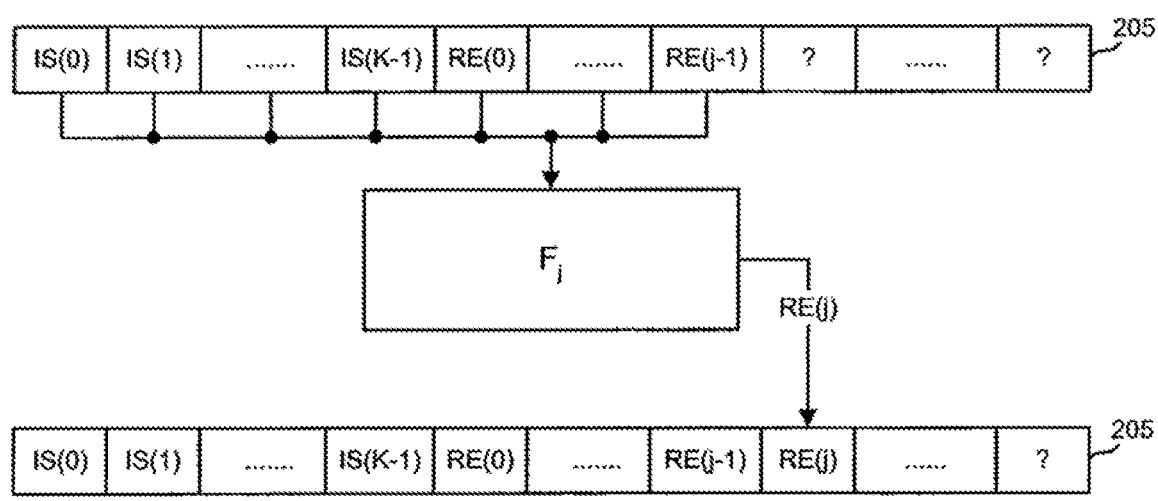
FIG. 4 is a simplified block diagram of the basic operation of a static encoder according to one embodiment of the present invention.

The general operation of static encoder 210 will be described with reference to FIGS. 3 and 4. FIG. 3 is a simplified flow diagram illustrating one embodiment of a method of statically encoding. In a step 305, a variable j, which keeps track of how many redundant symbols have been generated, is set to zero. Then, in a step 310, a first redundant symbol RE(0) is computed as a function $F_0$ of at least some of the input symbols IS(0), IS(K−1). Then, in a step 315, the variable j is incremented. Next, in a step 320, it is tested whether all of the redundant symbols have been generated (i.e., is j greater than R−1?). If yes, then the flow ends. Otherwise, the flow proceeds to step 325. In step 325, RE(j) is computed as a function $F_j$ of the input symbols IS(0), ..., IS(K−1) and of the previously generated redundant symbols RE(0), ..., RE(j−1), where $F_j$ need not be a function that depends on every one of the input symbols or every one of the redundant symbols. Steps 315, 320, and 325 are repeated until R redundant symbols have been computed.

Referring again to FIGS. 1 and 2, in some embodiments, static encoder 210 receives one or more static keys $S_0$, $S_1$, ... from static key generator 130. In these embodiments, the static encoder 210 uses the static keys to determine some or all of functions $F_0$, $F_1$, ... $F_{j-1}$. For example, static key $S_0$ can be used to determine function $F_0$, static key $S_1$ can be used to determine function $F_1$, etc. Or, one or more of static keys $S_0$, $S_1$, ... can be used to determine function $F_0$, one or more of static keys $S_0$, $S_1$, ... can be used to determine function $F_1$, etc. In other embodiments, no static keys are needed, and thus static key generator 130 is not needed.

Referring now to FIGS. 2 and 3, in some embodiments, the redundant symbols generated by static encoder 210 can be stored in input symbol buffer 205. FIG. 4 is a simplified illustration of the operation of one embodiment of static encoder 210. Particularly, static encoder 210 generates redundant symbol RE(j) as a function Fj of input symbols IS(0), IS(K−1), RE(0), RE(j−1), received from input symbol buffer 205, and stores it back into input symbol buffer 205. The exact form of the functions $F_0$, $F_1$, ..., $F_{R-1}$ depends on the particular application. Typically, but not always, functions $F_0$, $F_1$, ..., $F_{R-1}$ include an exclusive OR of some or all of their corresponding arguments. As described above, these functions may or may not actually employ static keys generated by static key generator 130 of FIG. 1. For example, in one specific embodiment described below, the first few functions implement a Hamming code and do not make any use of the static keys $S_0$, $S_1$, ..., whereas the remaining functions implement a Low-Density Parity-Check code and make explicit use of the static keys.

Overview of Dynamic Encoder

Figure 5:
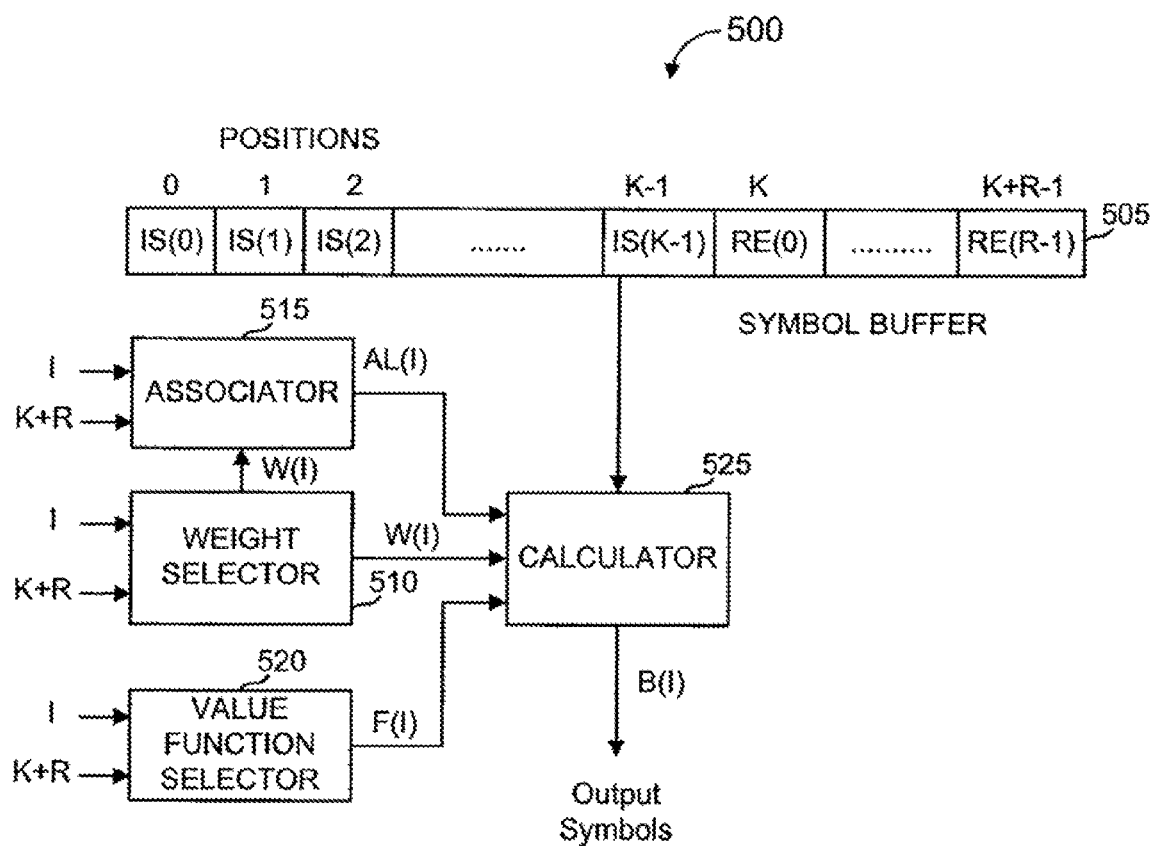
FIG. 5 is a simplified block diagram of a dynamic encoder according to one embodiment of the present invention.

Referring again to FIG. 2, dynamic encoder 220 receives input symbols IS(0), ..., IS(K−1) and the redundant symbols RE(0), ..., RE(R−1) and a key I for each output symbol it is to generate. The collection comprising the original input symbols and the redundant symbols will be referred to as the collection of "dynamic input symbols" hereafter. FIG. 5 is a simplified block diagram of one embodiment of a dynamic encoder. This encoder is similar to embodiments of encoders described in Luby I. Luby I describes further details on the operation of such an encoder.

Dynamic encoder 500 includes a weight selector 510, an associator 515, a value function selector 520 and a calculator 525. As shown in FIG. 5, the K+R dynamic input symbols are stored in a dynamic symbol buffer 505. In one embodiment, dynamic symbol buffer 505 is input symbol buffer 205 of FIG. 2. In other embodiments, dynamic symbol buffer 505 is separate from input symbol buffer 205. Dynamic key I (provided by the dynamic key generator 120 shown in FIG. 1) is an input to weight selector 510, associator 515 and value function selector 520. The number of dynamic input symbols K+R is also provided to these three components, 510, 515 and 520. Calculator 525 is coupled to receive outputs from weight selector 510, associator 515 and value function selector 520, and to receive symbols from dynamic symbol buffer 505. Calculator 525 generates output symbol values. It should be understood that other equivalent arrangements to the elements shown in FIG. 5 might be used, and that this is but one example of an encoder according to the present invention. For instance, Luby I and Luby II describe other encoders that can be used in other embodiments according to the present invention.

In operation, the K+R dynamic input symbols are received from input symbol buffer 205 and stored in dynamic input symbol buffer 505. As explained above, each dynamic input symbol has a position (for example, the position of an input symbol may be its original position in the input file) and a value. The dynamic input symbols need not be stored in dynamic input symbol buffer 505 in their respective order, so long as the position of stored dynamic input symbols can be determined.

Using key I and the number of dynamic input symbols K+R, weight selector 510 determines the number W(I) of dynamic input symbols that are to be "associates" of the output symbol having key I. Using key I, weight W(I), and the number of dynamic input symbols K+R, associator 515 determines a list AL(I) of positions of dynamic input symbols associated with the output symbol. It should be understood that W(I) need not be separately or explicitly calculated if associator 515 can generate AL(I) without knowing W(I) ahead of time. Once AL(I) is generated, W(I) can be easily determined because it is the number of associates in AL(I).

Associator 515 is a mapper that receives as input a key I, a number N, and a number t and produces a list X(0), . . . , X(t−1) of integers between 0 and N−1. Preferably, these integers are distinct and uniformly distributed on their range. For example, in the case of dynamic encoder 500 in FIG. 5, N is equal to K+R, t is equal to W(I), and AL(I) is the list X(0), . . . , X(t−1).

The mapping given by associator 515 can take a variety of forms. It can have access to a source of truly random or pseudorandom bits to make its output random. However, it should be chosen to produce the same output by both encoder and decoder for the same key I, the same N, and the same t. To satisfy this requirement, a pseudorandom sequence could be generated by both encoder and decoder seeded with the key I. Instead of a pseudorandom sequence, a truly random sequence might be used for computing the output, but for that to be useful, the random sequence used for generating the output would need to be communicated to the decoder.

Referring again to FIG. 5, once I, W(I) and AL(I) are known, the value B(I) of the output symbol is calculated by calculator 525 based on a value function F(I). One property of a suitable value function is that it would allow the value for an associate indicated by AL(I) to be determined from output symbol value B(I) and from the values for the other W(I)−1 associates indicated by AL(I). One preferred value function used in this step is the XOR value function, since it satisfies this property, is easily computed and easily inverted. However, other suitable value functions might be used instead. For example, Luby II describes other suitable value functions that can be used.

If used, value function selector 520 determines a value function F(I) from key I and from K+R. In one variation, the value function F(I) is the same value function F for all I. In that variation, value function selector 520 is not needed and calculator 525 can be configured with the value function F. For example, the value function might be XOR for all I, i.e., the output symbol value is an XOR (exclusive OR) of the values of all of its associates.

For each key I, weight selector 510 determines a weight W(I) from I and K+R. In one variation, weight selector 510 selects W(I) by using the key I to first generate a random looking number and then uses this number to look up the value of W(I) in a distribution table that is stored within, or accessible by, weight selector 510. A more detailed description of how such a distribution table might be formed and accessed is described below. Once weight selector 510 determines W(I), this value is provided to associator 515 and to calculator 525.

Using list AL(I), weight W(I) and either the value function F(I) provided by value function selector 520 or a preselected value function F, calculator 525 accesses the W(I) dynamic input symbols referenced by AL(I) in dynamic input symbol buffer 505 to calculate the value, B(I), for the current output symbol. An example of a procedure for calculating AL(I) is described below, but another suitable procedure might be used instead. Preferably, the procedure gives each input symbol a roughly even chance of being selected as an associate for a given output symbol and does the selection in a way that the decoder can replicate if the decoder does not already have AL(I) available to it.

Dynamic encoder 500 then outputs B(I). In effect, dynamic encoder 500 performs the action illustrated in FIG. 6, namely, to generate an output symbol value B(I) as some value function of selected input symbols. In the example shown, the value function is XOR, the weight W(I) of the output symbol is 3, and the associated dynamic input symbols (the associates) are at positions 0, 2, and K+R−2 and have respective values IS(0), IS(2) and RE(R−2). Thus, the output symbol is calculated as:

$$B(I)=IS(0)\oplus IS(2)\oplus RE(R-2)$$

for that value of I. In case the value function XOR is used, it is understood that the redundant symbols have the same number of bits as the original symbols IS(0), . . . , IS(K−1) and these in turn have the same number of bits as the output symbols.

The generated output symbols are then transmitted and received as described above. Herein, it is assumed that some of the output symbols might have been lost or gotten out of order, or were generated by one or more encoders. It is assumed, however, that the output symbols that are received have been received with an indication of their key and some assurance their values B(I) are accurate. As shown in FIG. 1, those received output symbols, together with their corresponding keys reconstructed from their indication by dynamic key regenerator 160, the values K and R, and the static keys $S_0, S_1, \ldots$ regenerated by static key generator 163, are the input to decoder 155.

Static Encoder

The main function of the static encoder is to add redundant information to the original data in such a way that recovery of the original data is possible in face of erasures. Such redundant information can assist a decoder to recover the input symbols that a dynamic decoder could not recover. In typical applications, the static encoder should be efficient in terms of the number of redundant symbols required to guarantee recovery to a desired degree of accuracy in the face of erasures, and/or in terms of the computational expense of the encoding process and/or the decoding process. For instance, for a given target erasure rate p which is, in applications, dictated by the performance of the dynamic decoder, the aim is to make the number R of redundant symbols as small as possible while guaranteeing fast recovery of the original data if at most a fraction p of the data is lost. A class of codes satisfying these requirements is that of LDPC codes, well-known to those skilled in the art. While these codes can recover the original data in many cases, there are infrequent occasions in which they recover everything but two or three of the original input symbols. Thus, in some embodiments, prior to LDPC encoding, the input data is first encoded using a code that can recover the original data if there are two or three erasures. This first encoding generates a first plurality of redundant symbols. After this first encoding, the plurality of the original symbols and the first plurality of redundant symbols are encoded using an LDPC encoder. The extended Hamming code, which is well-known to those skilled in the art and which is described briefly below, is suitable for the purpose of the first level of encoding, as it can recover the original data if there are three or less erasures, and does so by adding a small number of redundant symbols. It is to be understood that other types of encoding can also be used. For instance, in some applications, it may be acceptable that all but two or three of the input symbols are recovered. Thus, in such applications, an LDPC code alone may be appropriate. Additionally, other types of encoding might be appropriate for a particular application such as Reed-Solomon, Tornado, etc. Therefore, it is to be understood that many types of encodings alone or in combination can be used according other embodiments of the present invention.

Figure 7:
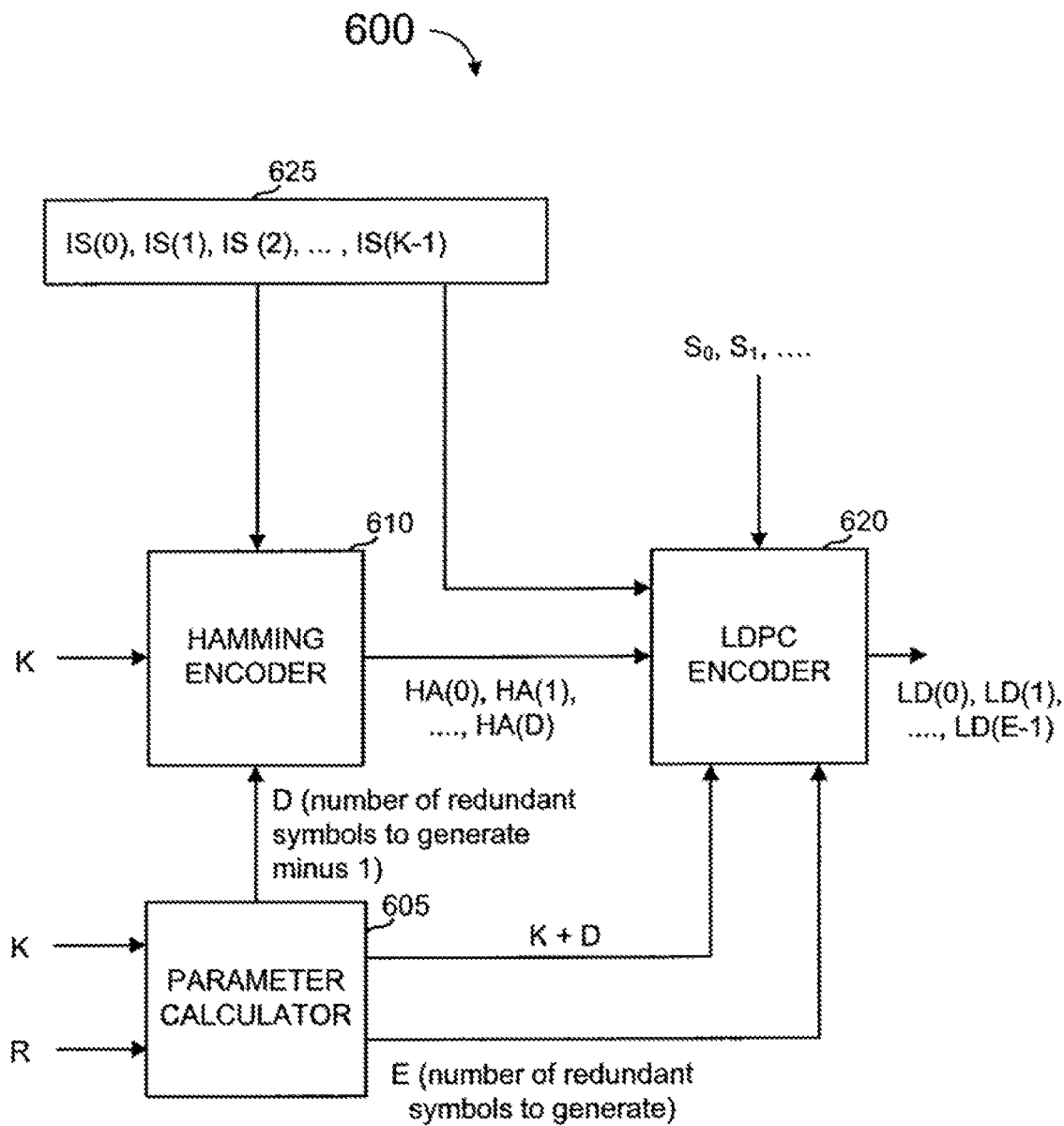
FIG. 7 is a simplified block diagram of a static encoder according to one embodiment of the present invention.

FIG. 7 is a simplified block diagram of one specific embodiment of a static encoder according to the present invention. Static encoder 600 comprises a parameter calculator 605, a Hamming encoder 610, and a low-density-parity-check (LDPC) encoder 620. Parameter calculator 605 receives the number K of input symbols and the number R of redundant symbols to be generated, and generates parameters D and E. D is an indication of the number of redundant symbols to be generated by Hamming encoder 610, and E is an indication of the number of redundant symbols to be generated by LDPC encoder 620. Parameter D is provided to Hamming encoder 610 and parameter E is provided to LDPC encoder 620.

Hamming encoder 610 is coupled to receive the input symbols IS(0), ..., IS(K−1) from an input symbol buffer 625, the number K of input symbols, and the parameter D. In response, Hamming encoder 610 generates D+1 redundant symbols HA(0), HA(1), ..., HA(D) according to a Hamming code. In one embodiment, input symbol buffer 625 is input symbol buffer 205 of FIG. 2. The Hamming encoding process adds D+1 redundant symbols to the original K input symbols, wherein D is the smallest number such that $2^D - D - 1 \geq K$. As is known to those skilled in the art, the redundant symbols are chosen in such a way that for any possible setting of the input symbols such that not all of them are zeros, at least four of the symbols among the plurality of the input symbols and the corresponding redundant symbols are nonzero. This property guarantees correction of at least three erasures. Hamming encoder 610 can be implemented in any number of ways known to those skilled in the art of error-correcting and erasure-correcting codes.

LDPC encoder 620 is coupled to receive the input symbols IS(0), ..., IS(K−1), the number K+D+1 of input symbols and Hamming encoded redundant symbols, the parameter E, and static keys $S_0, S_1, \ldots$. In response, LDPC encoder 620 generates E redundant symbols according to a LDPC code. The number E of redundant symbols calculated by the LDPC encoder is equal to R−D−1, wherein R is the number of redundant symbols. As is known to those skilled in the art, there are various ways of encoding information using LDPC codes. LDPC codes are described by means of a graph structure comprising a set of message nodes, a set of check nodes and edges connecting message nodes to check nodes. The set of valid LDPC codewords is the set of those settings of the message nodes such that for each check node, the XOR of the neighboring message nodes is zero. In certain applications, it is preferable for the message nodes to all have the same degree, i.e., to be connected to the same number of check nodes, as this simplifies the implementation of the encoder, and also makes the calculation of the error probability of the decoder easier. In one specific embodiment of the invention, the number of check nodes to which each message node is connected is four. It has been found that this number provides an acceptable trade-off between the running time/computational load of the encoder and the probability of failure of the decoder. Moreover, it has also been found that it is preferable for the check nodes neighboring a given message node to be randomly chosen among the set of check nodes. LDPC encoder 620 can be implemented in any number of ways known to those skilled in the art of error-correcting and erasure-correcting codes.

Figure 8:
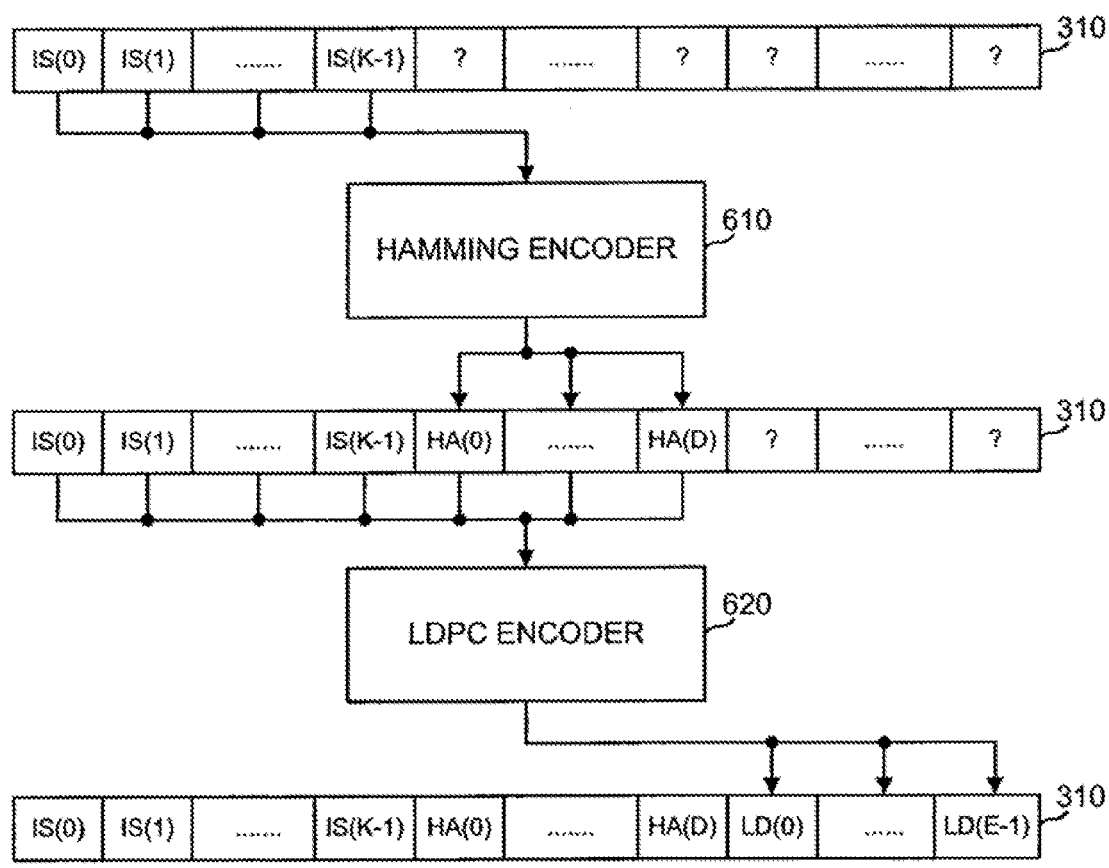
FIG. 8 is a simplified block diagram of the basic operation a static encoder according to one embodiment of the present invention.

FIG. 8 illustrates the operation of one embodiment of the present invention that employs the static encoder shown in FIG. 7. Particularly, Hamming encoder 610 receives the input symbols from input symbol buffer 205 (FIG. 2), and generates D+1 Hamming encoded redundant symbols, which are stored in input symbol buffer 205. Then, LDPC encoder 620 receives the input symbols and the D+1 Hamming encoded redundant symbols from input symbol buffer 205, and generates E LDPC encoded redundant symbols, which are stored in input symbol buffer 205.

As described above, in some embodiments, LDPC encoder 620 receives static keys $S_0, S_1, \ldots$ generated by static key generator 130 of FIG. 1. In one embodiment, static key generator 130 is a random number generator that generates a sequence of random-looking numbers (static keys $S_0, S_1, \ldots$) upon receipt of a seed. The seed can take a variety of forms. For example, it could be the value of a truly random number generator. As another example, the seed could be a string obtained in a deterministic way from a CPU clock. Whatever the seed is, it should be communicated to the decoder so that the same sequence of static keys can be generated by the decoder. It many applications, it will be advantageous to have a seed which is not too large. In many applications the seed could be a 32 bit integer, or a 64 bit integer.

Figure 6:
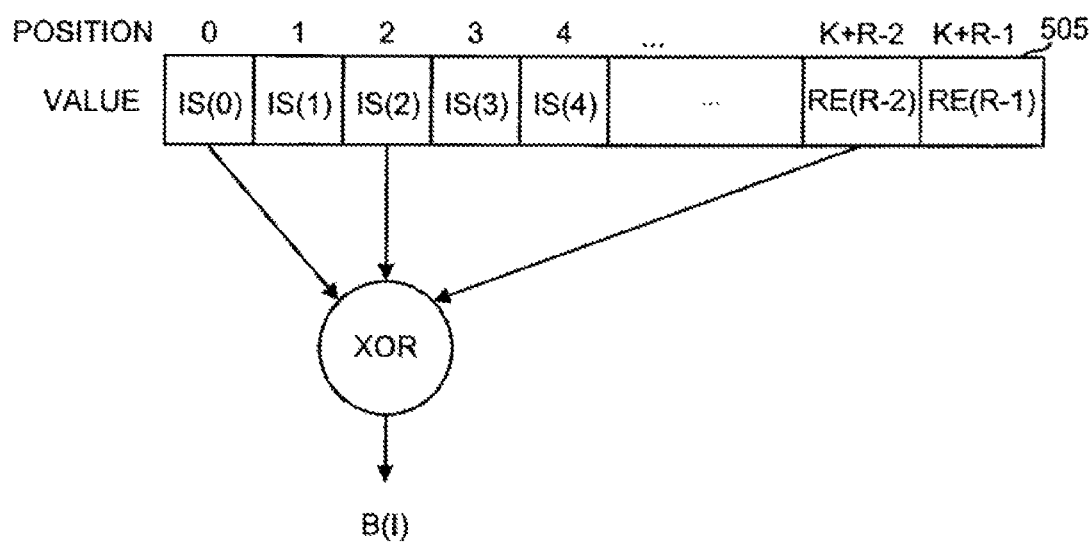
FIG. 6 is a simplified block diagram of a basic operation of a dynamic encoder according to one embodiment of the present invention.
Figure 9:
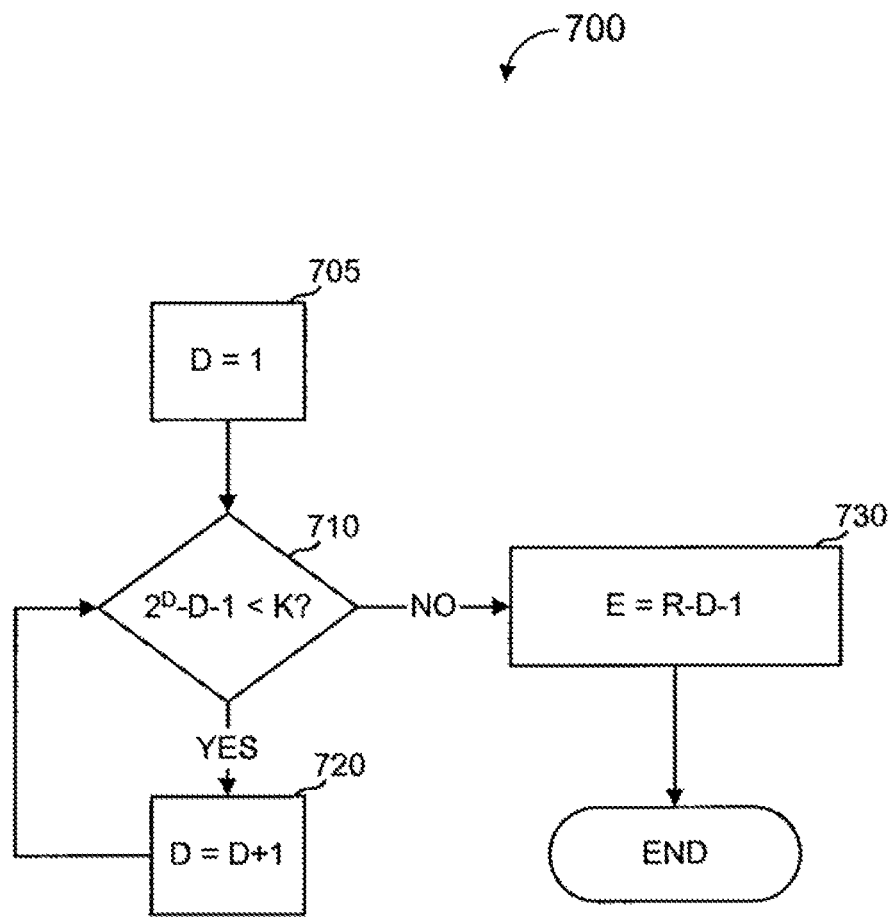
FIG. 9 is a simplified diagram of a method for calculating encoding parameters according to one specific embodiment of a static encoder.

In one specific embodiment of static encoder 600 illustrated in FIG. 6, the parameter D is calculated as the largest integer D such that $2^D - D - 1$ is greater than or equal to the number K of input symbols. Additionally, the parameter E is calculated as R−D−1. FIG. 9 is a simplified flow diagram illustrating one embodiment of a parameter calculator, such as parameter calculator 605 of FIG. 7, that calculates parameter D and E as described above. First, in a step 705, parameter D is initialized to one. Then, in step 710, it is determined whether $2^D - D - 1$ is less than K. If no, then the flow proceeds to step 730. If yes, the flow proceeds to step 720, where the parameter D is incremented. Then, the flow proceeds back to step 710. Once D has been determined, then, in step 730, the parameter E is calculated as R−D−1.

Referring again to FIG. 1, in some particular applications, the file or stream to be transmitted over channel 145 is rather small. For example, the input file could be a short audio message or the content of a web-page comprising some tens of kilobytes. The particular embodiments of a static encoder described above may be less than optimal in such scenarios. For instance, some of the above-described embodiments may lead to inefficient use of memory and processor speed, and hence slower reconstruction of the data. Also, some of the above-described embodiments may require a larger reception overhead to reconstruct the data within reliability parameters set by the user of the system. Additionally, some of the above-described embodiments may lead reconstruction of the data that is less reliable than desired.

Figure 10:
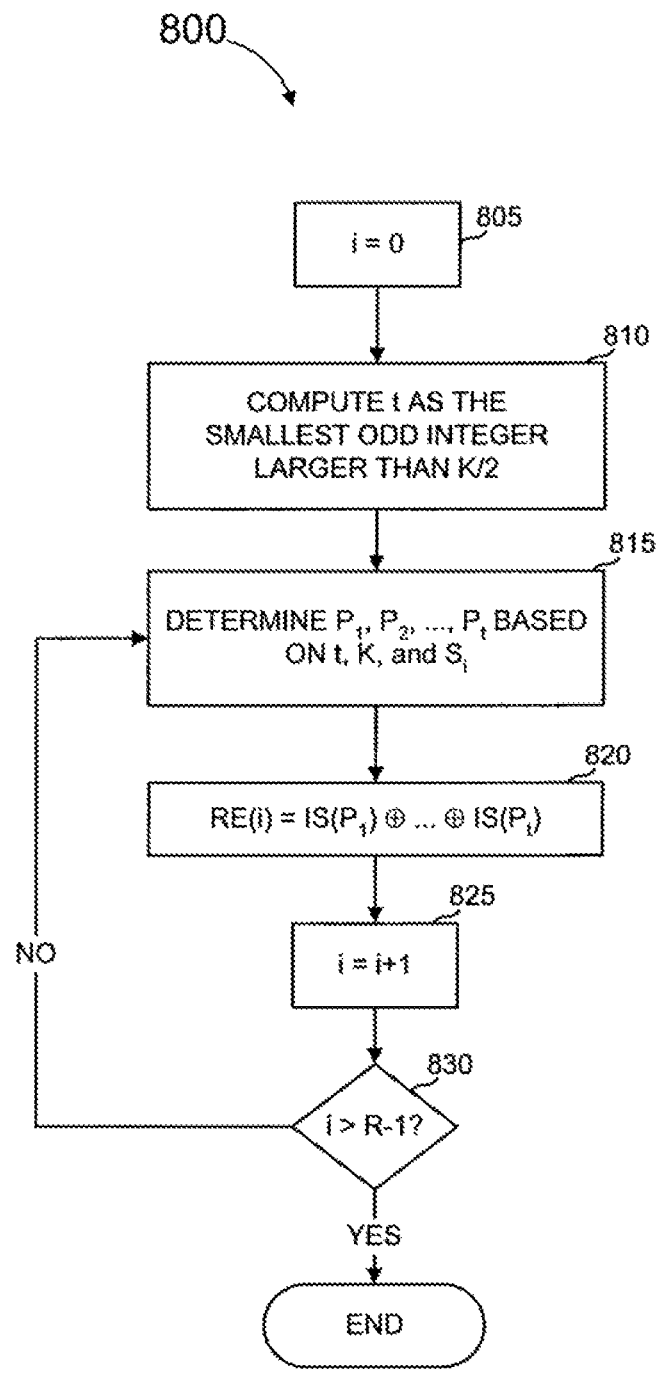
FIG. 10 is a simplified flow diagram of a static encoder according to another embodiment of the present invention.

It has been found that the failure probability of the decoder increases when the number of input symbols is decreased. It has also been found that this is largely because the encoding process does not create enough information about the original content if the size of the original content is relatively small. Therefore, another embodiment of an encoder might be used that generates redundant symbols that convey more information about the original symbols. FIG. 10 is a simplified flow diagram of such an encoder according to one embodiment of the present invention, which will now be described.

First, in step 805, a variable i is initialized to zero. Variable i keeps track of the number of redundant symbols already generated. In step 810, a number t is calculated as the smallest odd integer greater than or equal to K/2. In step 815, values $P_1, P_2, \ldots, P_t$ are generated based on K, t, and a static key $S_i$. The values $P_1, P_2, \ldots, P_t$ indicate the positions of input symbols that will be used to generate a redundant symbol. In one particular embodiment, an associator such as associator 515 of FIG. 5 is used to generate $P_1, P_2, \ldots, P_t$. In particular, the value t can be provided as the W(I) input, the value K can be provided as the K+R input, and the static key $S_i$ can be provided as the key I input. It should be noted that many different values of t would yield similar coding effects, and thus this particular choice is only an example.

In step 820, the value of RE(i) is computed as the XOR of the values $IS(P_1), IS(P_2), \ldots, IS(P_t)$. In step 825, the variable i is incremented by one to prepare computation of the next redundant symbol, and in step 830, it is determined whether all the redundant symbols have been computed. If not, then the flow returns to step 815.

Decoder Overview

Figure 11:
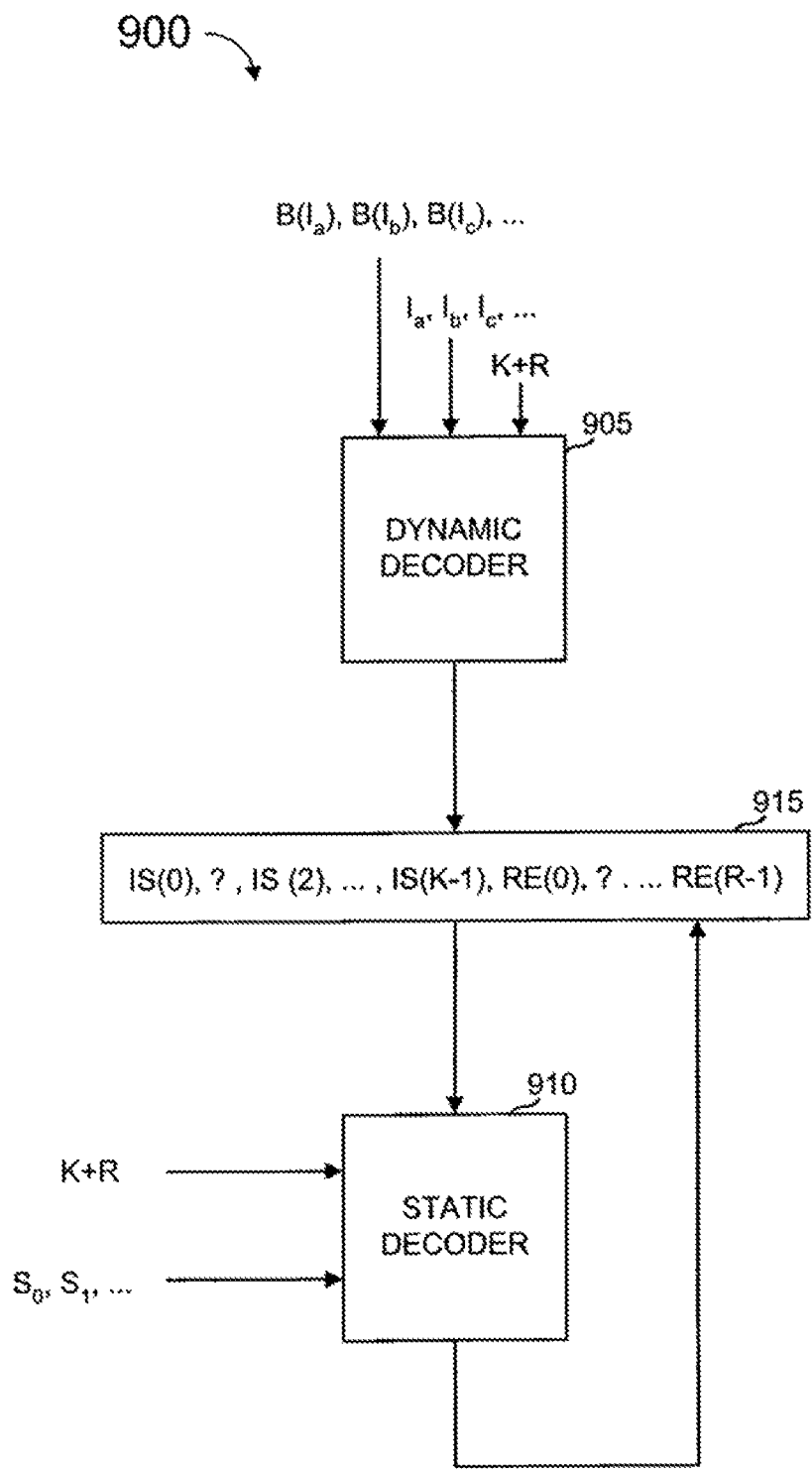
FIG. 11 is a simplified block diagram of a decoder according to one embodiment of the present invention.

FIG. 11 is a simplified block diagram illustrating one embodiment of a decoder according to the present invention. Decoder 900 can be used, for example, to implement decoder 155 of FIG. 1.

Decoder 900 comprises a dynamic decoder 905 and a static decoder 910. Dynamic decoder 905 receives the output symbols $B(I_a), B(I_b), \ldots$ from receive module 150 in FIG. 1, and dynamic keys $I_a, I_b, I_c, \ldots$ from dynamic key regenerator 160. Upon reception of these data, dynamic decoder 905 attempts to reconstruct the input symbols $IS(0), \ldots, IS(K-1)$ and the redundant symbols $RE(0), \ldots, RE(R-1)$. One advantage of some embodiments of the present invention is that dynamic decoder 905 need not finish the decoding all of the input symbols. Rather, static decoder 910 can be used to decode input symbols that dynamic decoder 905 did not recover.

Input symbols and redundant symbols recovered by dynamic decoder 905 are stored in a reconstruction buffer 915. Upon completion of dynamic decoding, static decoder 910 attempts to recover any input symbols not recovered by dynamic decoder 905, if any. In particular, static decoder 910 receives input symbols and redundant symbols from reconstruction buffer 915. Additionally, static decoder 910 receives static keys $S_0, S_1, \ldots$, if used, from static key generator 130 (FIG. 1). Referring again to FIG. 1, in one specific embodiment, the static keys can be regenerated by communicating a common seed through communication channel 145 to random number generator 135 which drives static key generator 130. The recovered input symbols are provided to input file reassembler 165.

Figure 12:
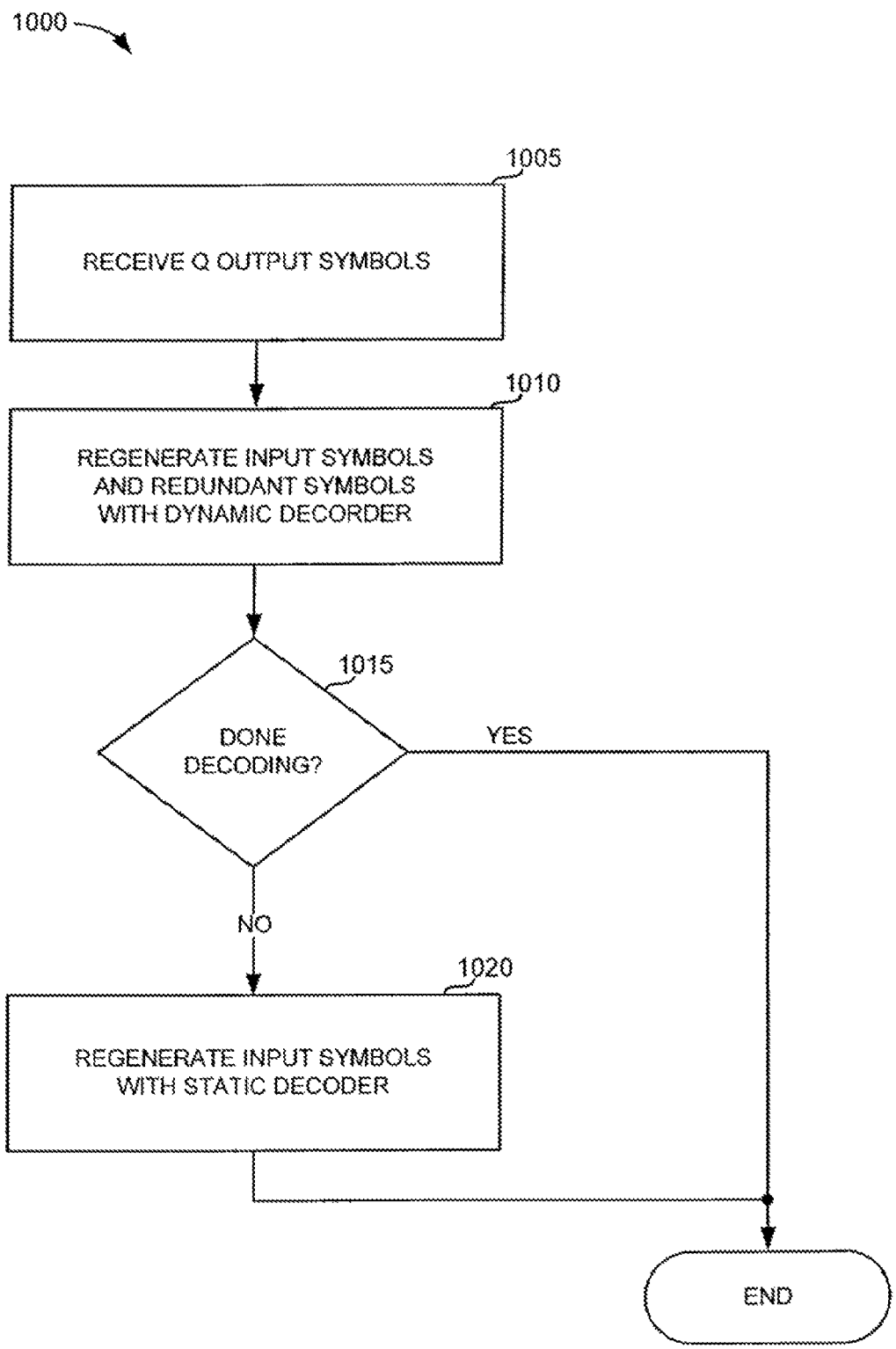
FIG. 12 is a simplified flow diagram of an operation of a decoder according to one embodiment of the present invention.

FIG. 12 is a simplified flow diagram illustrating one embodiment of a method for decoding according to the present invention. In step 1005, Q output symbols are received by the decoder. The value of Q can depend on the number of input symbols and the specific dynamic encoder used. The value of Q can also depend on the desired degree of accuracy to which the decoder can recover the input symbols. For example, if it is desired that the decoder can recover all of the input symbols with a high probability, then Q should be chosen to be larger than the number of input symbols. Particularly, in some applications, when the number of input symbols is large, Q can be less than 3% larger than the number of original input symbols. In other applications, when the number of input symbols is small, Q can be at least 10% larger than the number of input symbols. Specifically, Q can be chosen as the number K of input symbols plus a number A, where A is chosen to ensure that the decoder can regenerate all of the input symbols with a high probability. Determination of the number A is described in more detail below. If it is acceptable for the decoder to be unable to decode all of the input symbols (either sometimes or always), then Q can be less than K+A, equal to K, or even less than K. Clearly, one aim of an overall coding system will often be to decrease the number Q as much as possible, while maintaining good probabilistic guarantees on the success of the decoding process with respect to the desired degree of accuracy.

In step 1010, dynamic decoder 905 regenerates input symbols and redundant symbols from the Q received output symbols. It is to be understood, that steps 1005 and 1010 can be performed substantially concurrently. For example, dynamic decoder 905 can begin regenerating input symbols and redundant symbols prior to the decoder receiving Q output symbols.

After dynamic decoder 905 has processed Q output symbols, then it is determined whether the input symbols have been recovered to a desired degree of accuracy. The desired degree of accuracy may be, for example, all of the input symbols, or some number, percentage, etc., less than all of the input symbols. If yes, then the flow ends. If no, then the flow proceeds to step 1020. In step 1020, static decoder 910 attempts to recover any input symbols that dynamic decoder 905 was unable to recover. After static encoder 910 has processed the input symbols and redundant symbols recovered by dynamic encoder 905, then the flow ends.

Figure 13:
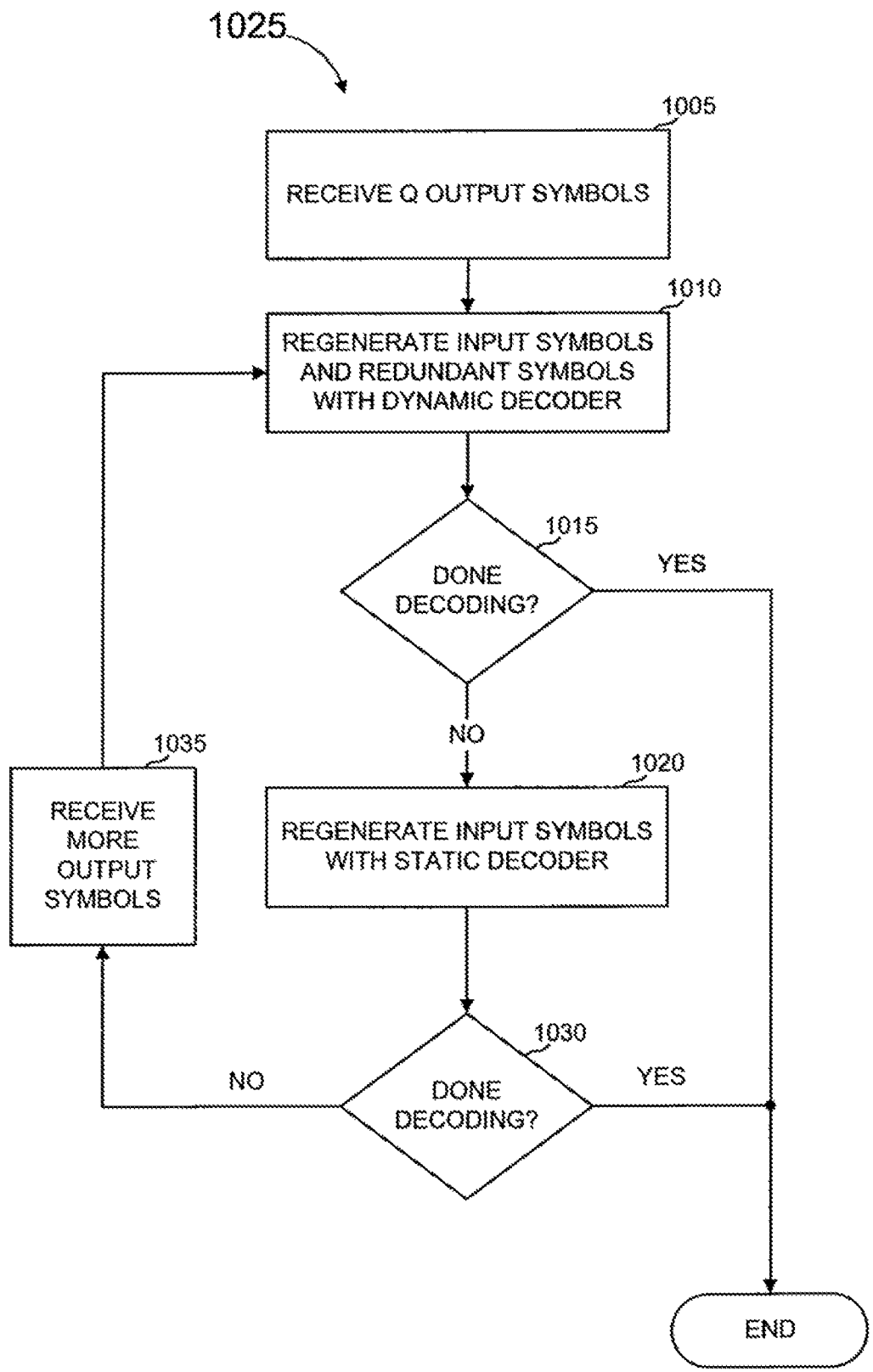
FIG. 13 is a simplified flow diagram of an operation of a decoder according to another embodiment of the present invention.

FIG. 13 is a simplified flow diagram illustrating another embodiment of a method for decoding according to the present invention. This embodiment is similar to that described with respect to FIG. 12, and includes steps 1005, 1010, 1015, and 1020 in common. But, after step 1020, the flow proceeds to step 1030, in which it is determined whether the input symbols have been recovered to a desired degree of accuracy. If yes, then the flow ends. If no, then the flow proceeds to step 1035. In step 1035, one or more additional output symbols are received. Then, the flow proceeds back to step 1010, so that dynamic decoder 905 and/or static decoder 910 can attempt to recover the remaining unrecovered input symbols.

Figure 14:
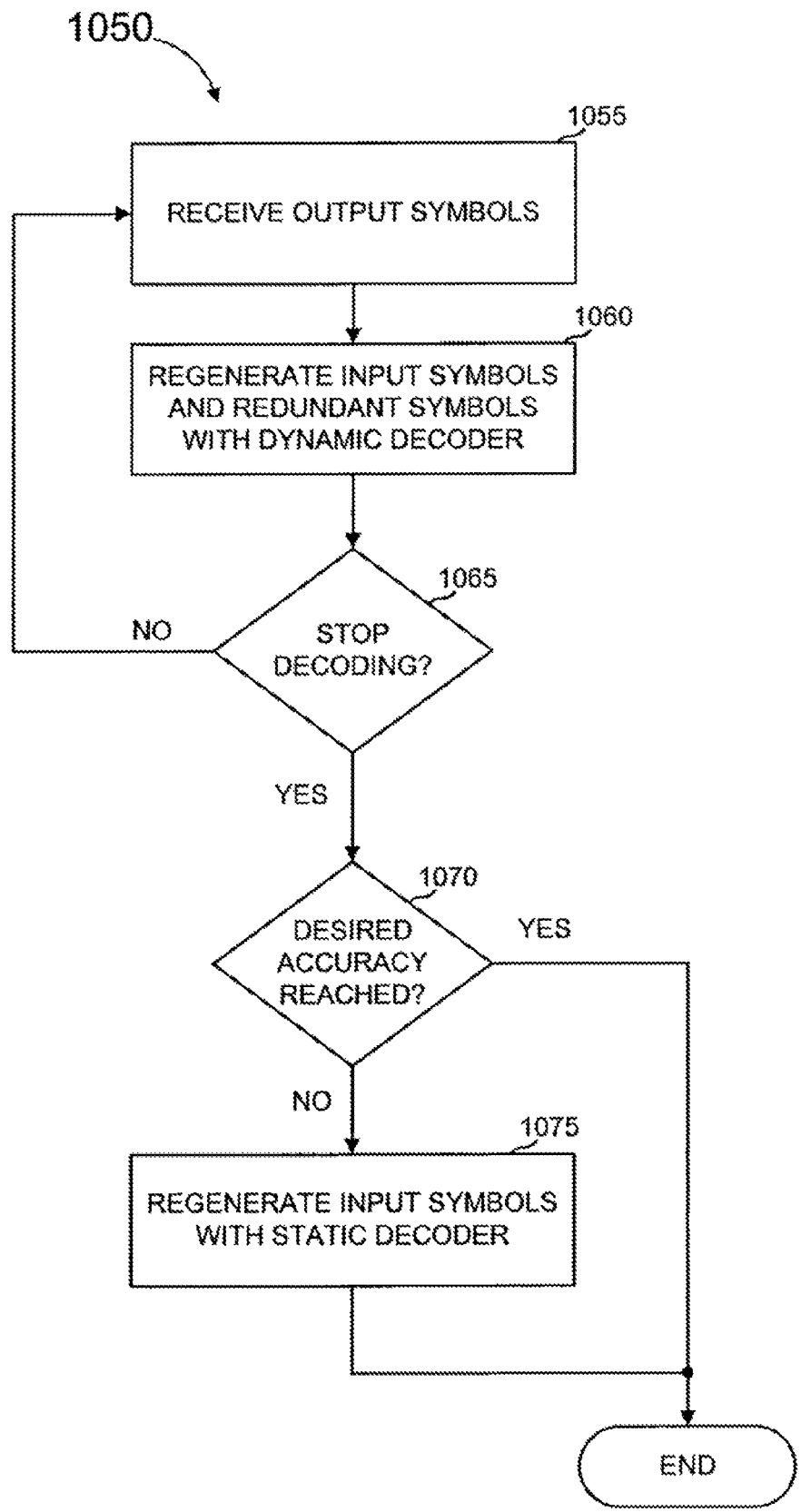
FIG. 14 is a simplified flow diagram of an operation of a decoder according to yet another embodiment of the present invention.

FIG. 14 is a simplified flow diagram illustrating yet another embodiment of a method for decoding according to the present invention. In step 1055, output symbols are received by the decoder, and in step 1060, dynamic decoder 905 regenerates input symbols and redundant symbols from the received output symbols. Then, in step 1065, it is determined whether dynamic decoding should be ended. This determination can be based on one or more of the number of output symbols processed, the number of input symbols recovered, the current rate at which additional input symbols are being recovered, the time spent processing output symbols, etc.

It is to be understood that steps 1055, 1060 and 1065 can be performed substantially concurrently. For example, dynamic decoder 905 can begin regenerating input symbols and redundant symbols as the decoder continues to receive output symbols. Additionally, an evaluation of whether to stop the dynamic decoding process can be performed periodically while output symbols are being received and/or while output symbols are being processed by dynamic decoder 905.

In step 1065, if it is determined that dynamic decoding is not to be stopped, then the flow proceeds back to step 1055. But, if in step 1065, it is determined to end dynamic decoding, then the flow proceeds to step 1070. In step 1070, it is determined whether the input symbols have been recovered to a desired degree of accuracy. If yes, then the flow ends. If no, then the flow proceeds to step 1075. In step 1075, static decoder 910 attempts to recover any input symbols that dynamic decoder 905 was unable to recover. After static encoder 910 has processed the input symbols and redundant symbols recovered by dynamic encoder 905, the flow ends.

Dynamic Decoder

Figure 15:
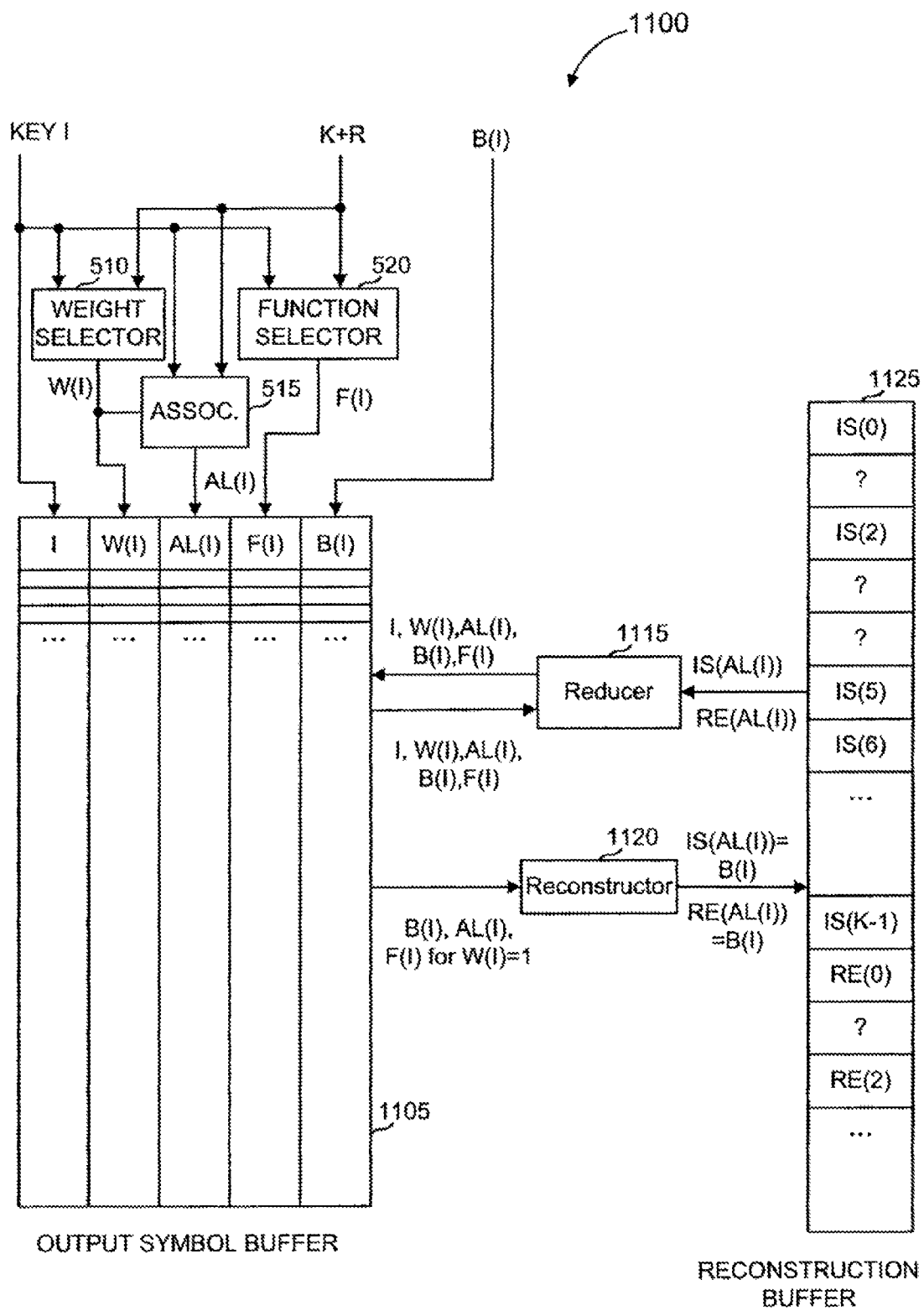
FIG. 15 is a simplified block diagram of a dynamic decoder according to one embodiment of the present invention.

FIG. 15 shows one embodiment of dynamic decoder according to the present invention. Dynamic decoder 1100 includes similar components as those of dynamic encoder

500 shown in FIG. 5. Decoder 1100 is similar to embodiments of chain reaction decoders described in Luby I and Luby II. Dynamic decoder 1100 comprises a weight selector 510, an associator 515, a value function selector 520, an output symbol buffer 1105, a reducer 1115, a reconstructor 1120 and a reconstruction buffer 1125. As with the encoder, value function selector 520 and the space in output symbol buffer 1105 allocated for storing the description of the value function are optional and might not be used if the value function was the same for all output symbols. Several entries of reconstruction buffer 1125 are shown, with some input symbols reconstructed and with others as yet unknown, indicated by question marks. For example, in FIG. 15, the input symbols at positions 0, 2, 5, 6, and K−1 and the redundant symbols at positions 0 and 2 have been recovered and the input symbols at positions 1, 3 and 4 and the redundant symbol at position 1 have yet to be recovered.

In operation, for each received output symbol with key I and value B(I), decoder 1100 does the following. Key I is provided to value function selector 520, weight selector 510 and associator 515. Using K+R, and dynamic key I, weight selector 510 determines weight W(I). Using K+R, dynamic key I, and W(I), associator 515 produces the list AL(I) of W(I) positions of input and redundant symbols associated with the output symbol. Optionally, using K+R and I, value function selector 520 selects value function F(I). Then, I, B(I), W(I) and AL(I), and optionally F(I), are stored in a row of output symbol buffer 1105. Value function selector 520, weight selector 510 and associator 515 perform the same operation for decoder 1105 as described for dynamic encoder 220 (FIG. 2). In particular, the value function F(I), the weight W(I) and the list AL(I) produced by value function selector 520, by weight selector 510 and associator 515 in FIG. 15 are the same for the same dynamic key I as for the corresponding parts shown in FIG. 5. If K and R vary from input file to input file, they can be communicated from the encoder to the decoder in any conventional manner, such as including it in a message header.

Reconstructor 1120 scans output symbol buffer 1105 looking for output symbols stored there that have weight one, i.e., W(I)=1 and AL(I) lists the position of just one associate. Those symbols are referred to herein as members of a "decodable set." For value functions with the properties described above, output symbols of weight one are in the decodable set because a value of a dynamic input symbol can be determined from that output symbol. Of course, if a value function were used that would allow dynamic input symbols to be decoded under a condition other than having a weight of one, that condition would be used to determine whether an output symbol is in the decodable set. For clarity, the examples described here assume that the decodable set is those output symbols with weight one, and extensions of these examples to other value function decodable conditions should be apparent from this description.

When reconstructor 1120 finds an output symbol that is in the decodable set, the output symbol's value B(I), and optionally the value function F(I), is used to reconstruct the dynamic input symbol listed in AL(I) and the reconstructed dynamic input symbol is placed into reconstruction buffer 1125 at the appropriate position for that input or redundant symbol. If the indicated input or redundant symbol had already been reconstructed, the reconstructor 1120 could drop the newly reconstructed dynamic input symbol, overwrite the existing reconstructed input or redundant symbol, or compare the two and issue an error if they differ. Where the value function is an XOR of all the associates, the input or redundant symbol value is simply the output symbol's value. Reconstructor 1120 thus reconstructs input and redundant symbols, but only from output symbols in the decodable set. Once an output symbol from the decodable set is used to reconstruct an input or redundant symbol it can be deleted to save space in output symbol buffer 1105. Deleting the "used up" output symbol also ensures that reconstructor 1120 does not continually revisit that output symbol.

Initially, reconstructor 1120 waits until at least one output symbol is received that is a member of the decodable set. Once that one output symbol is used, the decodable set would be empty again, except for the fact that some other output symbol might be a function of only that one reconstructed input or redundant symbol and one other input or redundant symbol. Thus, reconstructing one input or redundant symbol from a member of the decodable set might cause other output symbols to be added to the decodable set. The process of reduction of output symbols to add them to the decodable set is performed by reducer 1115.

Reducer 1115 scans output symbol buffer 1105 and reconstruction buffer 1125 to find output symbols that have lists AL(I) that list positions of input or redundant symbols that have been recovered. When reducer 1115 finds such a "reducible" output symbol with key I, reducer 1115 obtains the value IS(h) of a recovered dynamic input symbol at position h and modifies B(I), W(I) and AL(I) as follows:

B(I) is reset to B(I)⊕IS(h)

W(I) is reset to W(I)−1

AL(I) is reset to AL(I) excluding h

In the equations above, it is assumed that the value function was an XOR of all the associates' values. Note that XOR is its own inverse—if that were not the case and another value function was used originally to compute the output symbol, then the inverse of that value function would be used here by reducer 1115. As should be apparent, if the values for more than one associate are known, the equivalent of the above equations can be calculated to make B(I) dependent only on any unknown associate values (and adjust W(I) and L(I) accordingly).

The action of reducer 1115 reduces the weights of output symbols in output symbol buffer 1105. When an output symbol's weight is reduced to one (or other decodable condition occurs for other value functions), then that output symbol becomes a member of the decodable set, which can then be acted upon by reconstructor 1120. In practice, once a sufficient number of output symbols are received, reducer 1115 and reconstructor 1120 create a chain reaction decoding, with reconstructor 1120 decoding the decodable set to recover more dynamic input symbols, reducer 1115 using those freshly recovered input or redundant symbols to reduce more output symbols so they are added to the decodable set, and so on, until the decodable set is empty.

The decoder shown in FIG. 15 partially reconstructs input and redundant symbols in a straightforward manner, without much consideration to memory storage, computation cycles or transmission time. Where the decoder memory, decoding time or transmission time (which constrains the number of output symbols that are received) are limited, the decoder can be optimized to better use those limited resources. Examples of such optimizations are described, e.g., in Luby I and Luby II. Those optimizations can be used for dynamic decoding of multi-stage codes as well. Additionally, it is to be understood that other variations and equivalent decoders can be used.

Static Decoder

Figure 16:
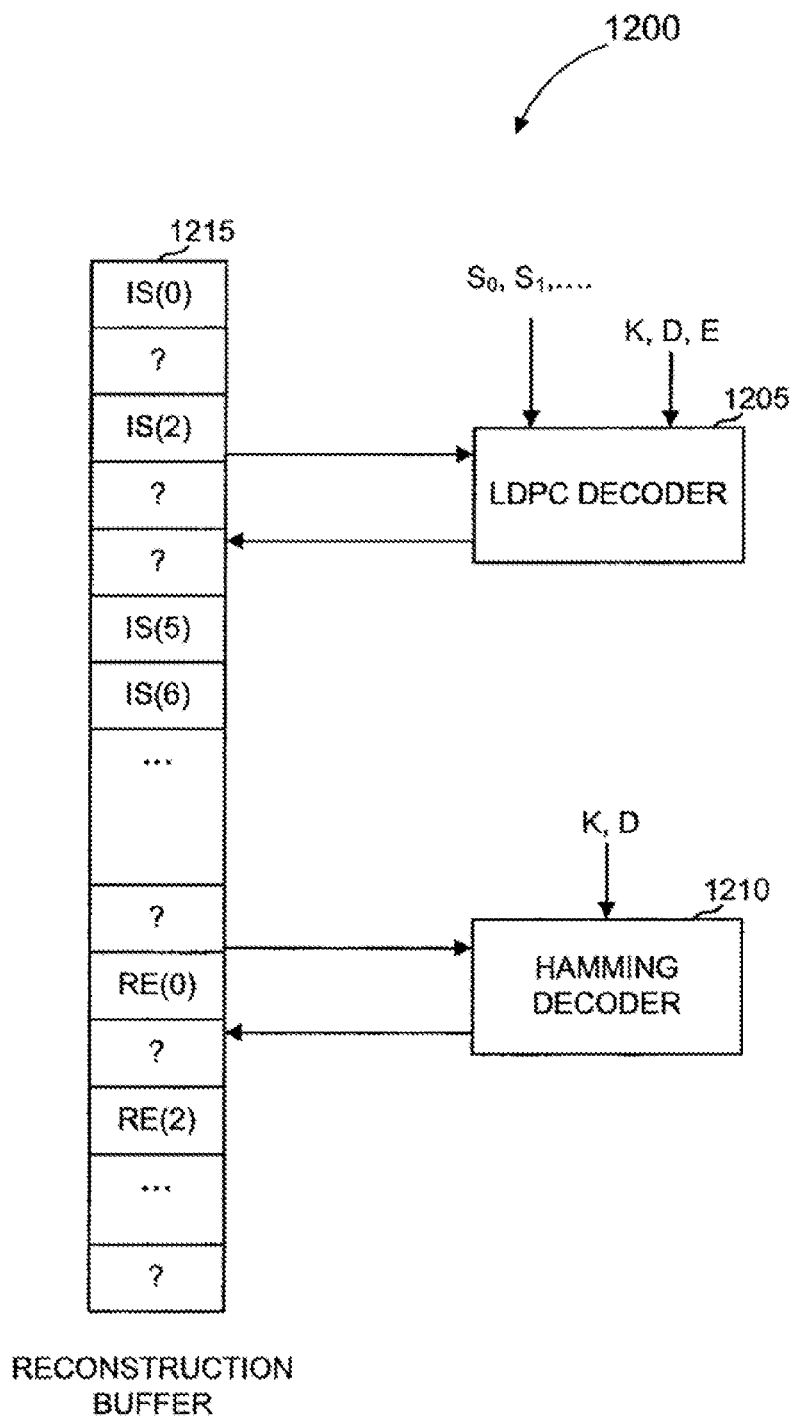
FIG. 16 is a simplified block diagram of a static decoder according to one embodiment of the present invention.

FIG. 16 is a simplified block diagram illustrating one embodiment of a static decoder. This embodiment can be used when the data is encoded with a static encoder such as described with reference to FIG. 7. Static decoder 1200 comprises a LDPC decoder 1205 and a Hamming decoder 1210. The LDPC decoder 1205 receives input symbols and redundant symbols from a reconstruction buffer 1215, and attempts to reconstruct those symbols of reconstruction buffer 1215 unrecovered after the decoding step of the dynamic decoder. In some embodiments, reconstruction buffer 1215 is reconstruction buffer 1125 (FIG. 15). LDPC decoder 1205 receives the static keys $S_0, S_1, \ldots$ generated by the static key generator 130. Additionally, LDPC decoder 1205 receives the number K of input symbols, the number D of redundant Hamming symbols, and the number E of redundant LDPC symbols. LDPC decoder 1205 recovers as many of the input and redundant symbols as possible in a manner well known to those skilled in the art, and writes those values into their corresponding positions in the reconstruction buffer 1215.

Hamming decoder 1210 is also coupled to receive input symbols and redundant symbols from the reconstruction buffer 1215. Additionally, Hamming decoder 1210 receives the number K of input symbols, and the number D, where D+1 is the number of redundant Hamming symbols. Hamming decoder 1210 attempts to recover those input symbols not recovered by the dynamic decoder and the LDPC decoder 1205. While the aim of LDPC decoder 1205 is to recover as many as possible input and redundant symbols, Hamming decoder 1210 only attempts to recover the input symbols $IS(0), IS(1), \ldots, IS(K-1)$.

Many variations of LDPC decoders and Hamming decoders are well known to those skilled in the art, and can be employed in various embodiments according to the present invention. In one specific embodiment, Hamming decoder is implemented using a Gaussian elimination algorithm. Many variations of Gaussian elimination algorithms are well known to those skilled in the art, and can be employed in various embodiments according to the present invention.

In certain applications it may be more optimal to use a different type of decoder 155 shown in FIG. 1 than the one described above. For example, if the number K of input symbols is not very large, e.g., less than 1000, the variance involved in the probabilistic process of reception of output symbols may force decoder 155 to collect a number of output symbols that is significantly larger than K in order for the dynamic and the static decoder to correct the required number of erasures. In these cases, a different type of decoder can be used. An embodiment of such a decoder that decodes the data using Gaussian elimination will now be described with reference to FIGS. 17, 18 and 19.

First, referring again to FIG. 1, decoder 155 receives the output symbols $B(I_a), B(I_b), \ldots$ from receive module 150, the keys $I_a, I_b, \ldots$ from dynamic key regenerator 160, and the keys $S_0, S_1, \ldots$ from static key generator 130. Additionally, it receives the value K of input symbols and the value R of redundant symbols. Upon receiving this input, it attempts to reconstruct the input symbols $IS(0), \ldots, IS(K-1)$, which are passed to input file reassembler 165 for further processing.

Figure 17:
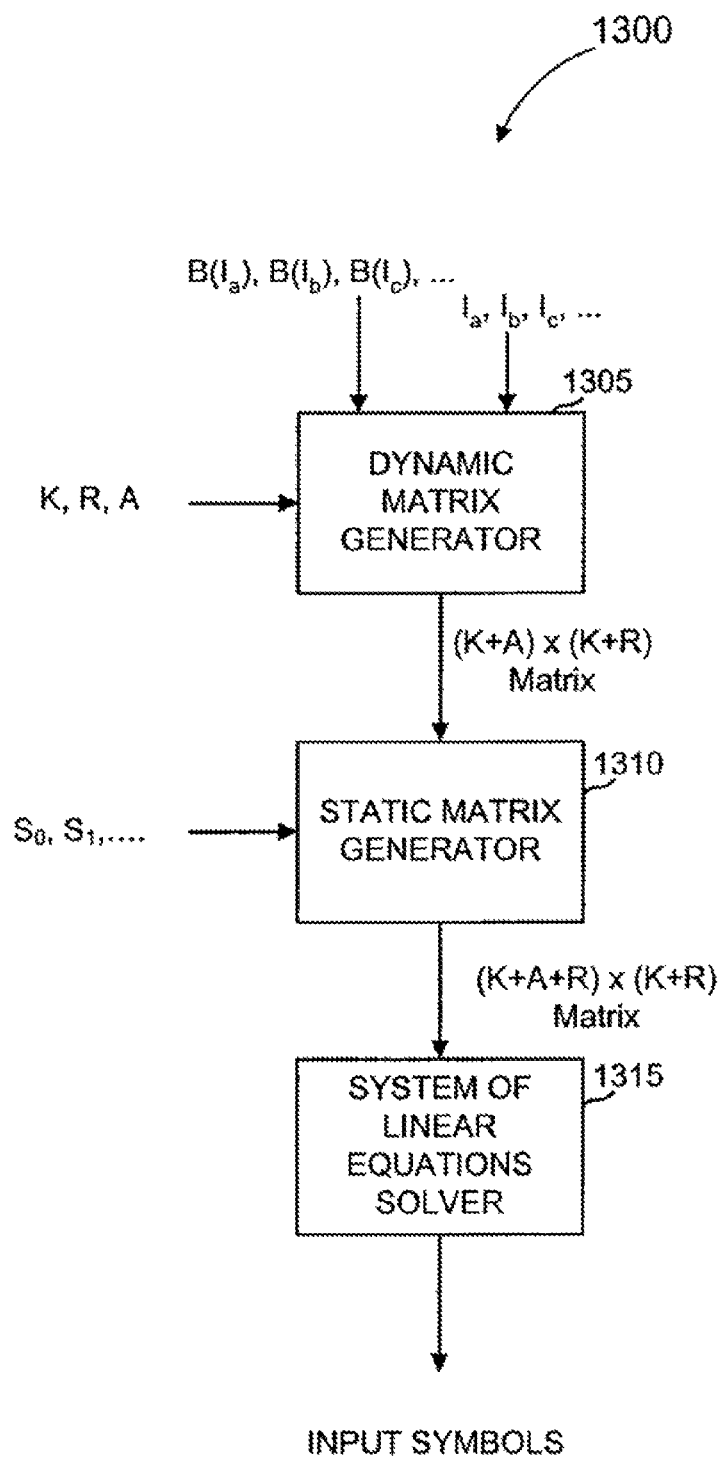
FIG. 17 is a simplified block diagram of a static decoder according to another embodiment of the present invention.

Referring now to FIG. 17, decoder 1300 comprises a dynamic matrix generator 1305 and a static matrix generator 1310. Dynamic matrix generator 1305 receives output symbols $B(I_a), B(I_b), \ldots$, dynamic keys $I_a, I_b, \ldots$, and the parameters K and R. Additionally, dynamic matrix generator 1305 receives another parameter A that describes how many output symbols should be collected (i.e., the number of output symbols collected is K+A). The determination of parameter A typically depends on the method used for dynamic and static encoding and will be described in more detail below. In the following description, the K+A output symbols collected will be referred to as $B(0), B(1), \ldots, B(K+A-1)$. Upon reception of these parameters, a system of linear equations of the form $$C^*\text{Transpose}(IS(0), \ldots, IS(K-1), RE(0), \ldots, RE(R-1)) = \text{Transpose}(B(0), \ldots, B(K+A-1))$$

is set up by dynamic matrix generator 1305 in which C is a matrix of format (K+A)×(K+R). Generation of matrix C by dynamic matrix generator 1305 will be described in further detail below.

Then, static matrix generator 1310 receives matrix C from dynamic matrix generator 1305, and uses the keys $S_0, S_1, \ldots$ to augment matrix C by R more rows to obtain a system of equations $$M^*\text{Transpose}(IS(0), \ldots, IS(K-1), RE(0), \ldots, RE(R-1)) = \text{Transpose}(B(0), \ldots, B(K+A-1), 0, \ldots, 0),$$

wherein the last R entries of the right hand vector are zero, and wherein M is of format (K+A+R)×(K+R). Finally, a system of linear equations solver 1315 is employed to solve this system of equations M and to obtain some or all of the input symbols $IS(0), \ldots, IS(K-1)$. In one specific embodiment, system of linear equations solver 1315 employs a Gaussian elimination algorithm to solve the system of linear equations.

Figure 18:
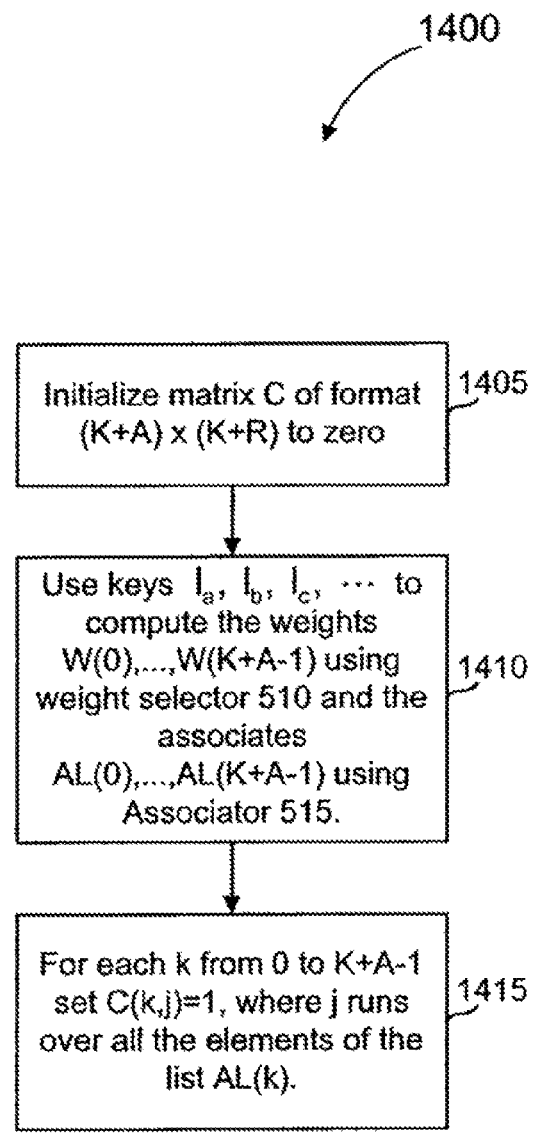
FIG. 18 is a simplified flow diagram of an operation of a decoder according to an embodiment of the present invention.

Dynamic matrix generator 1305 and static matrix generator 1310 will now be described in further detail with reference to dynamic encoder 500 of FIG. 5 and static encoder 210 in FIG. 2. FIG. 18 is a simplified flow diagram illustrating one embodiment of a method employed by dynamic matrix generator 1305. In step 1405, dynamic matrix generator 1205 initializes a matrix C of format (K+A)×(K+R) to all zeros. Next, in step 1410, the keys $I_a, I_b, \ldots$ are used in conjunction with weight selector 510 and associator 515 to generate the weights $W(0), \ldots, W(K+A-1)$, and the lists $AL(0), \ldots, AL(K+A-1)$, respectively. Each of the lists AL(k) comprises W(k) integers in the range $0, \ldots, K+R-1$. In step 1415, these integers are used to compute C(k,l) with AL(k)=(a(0), a(W(k)-1)) and entries C(k,a(0)), C(k,a(W(k)-1)) are set to 1. As explained above, matrix C gives rise to a system of equations for the unknowns (IS(0), ..., IS(K-1), RE(0), RE(R-1)) in terms of the received symbols (B(0), ..., B(K+A-1)). The reason is the following: once dynamic encoder chooses weight W(k) and associate list AL(k)=(a(0), ..., a(W(k)-1)), the corresponding output symbol B(k) is obtained as $$B(k) = L(a(0)) \oplus L(a(1)) \oplus \ldots \oplus L(a(W(k)-1)),$$

wherein L(j) denotes the unknown value of reconstruction buffer 1925 at position j. These equations, accumulated for all values of k between 0 and K+A-1, give rise to the desired system of equations.

Figure 19:
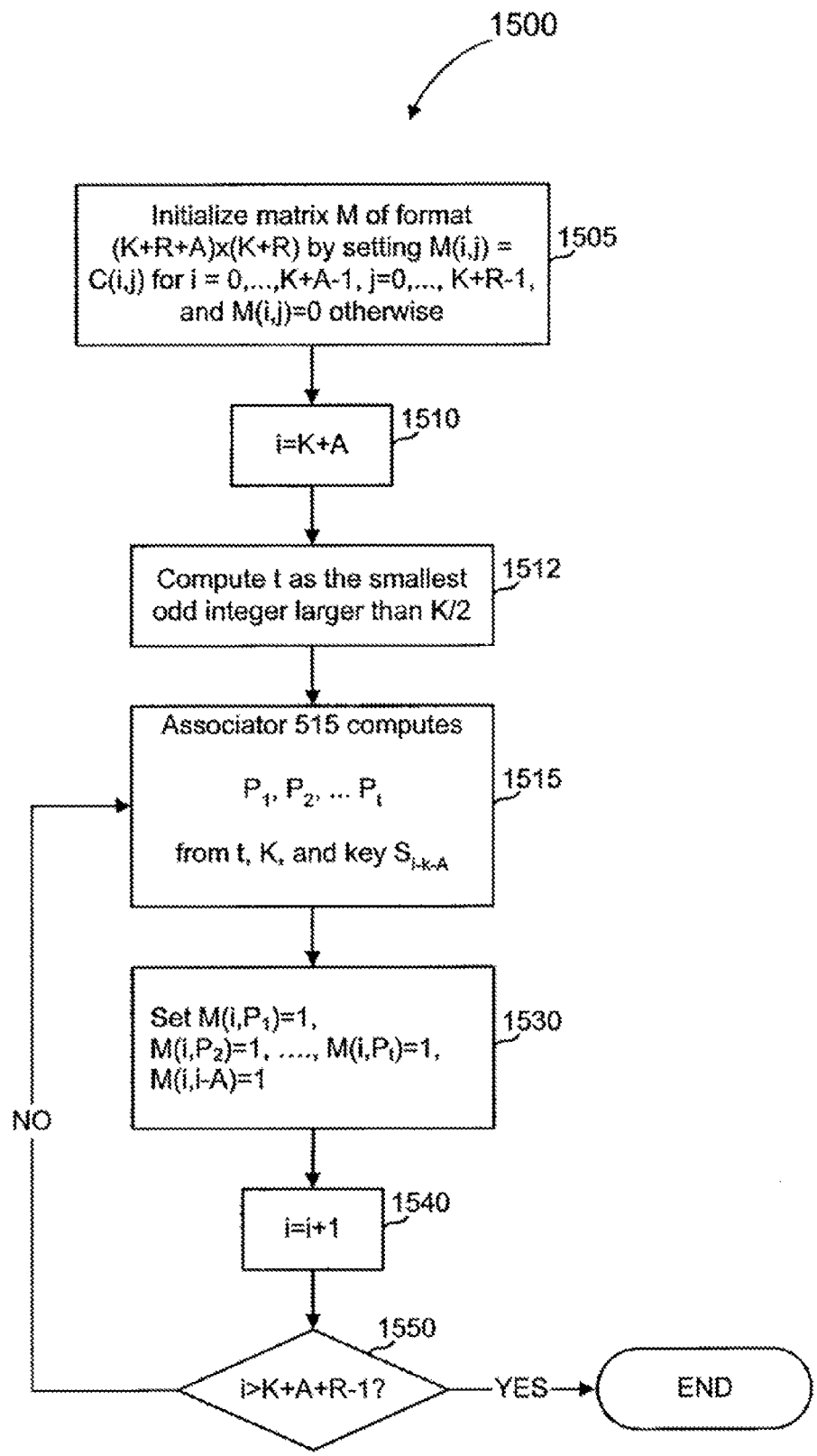
FIG. 19 is a simplified flow diagram of another operation of a decoder according to an embodiment of the present invention.

FIG. 19 is a simplified flow diagram illustrating one embodiment of a method employed by static matrix generator 1310. This embodiment will be described with reference to FIG. 10. In step 820 of FIG. 10, note that redundant symbol RE(i) is calculated as $RE(i) = IS(P_1) \oplus \ldots \oplus IS(P_t)$, and $P_1, P_2, \ldots, P_t$ are computed as in step 815 upon reception of key $S_i$. This means that $IS(P_1) \oplus \ldots \oplus IS(P_t) \oplus RE(i) = 0$. Stated in terms of the positions of the reconstruction buffer, this means that $L(P_1) \oplus \ldots \oplus L(P_t) \oplus L(i+K) = 0$. Setting entries $(i, P_1), \ldots, (i, P_t), (i, i-A)$ of M equal to 1, where i runs from K+A to K+A+R-1, a matrix M is obtained that describes a system of linear equations for the unknowns (IS(0), ..., IS(K-1), RE(0), ..., RE(R-1)) with respect to the received symbols $B(0), \ldots, B(K+A+1)$, as described above.

In step 1505, matrix M of format (K+R+A)×(K+R) is initialized by letting the first K+A rows of M equal to the matrix C calculated by dynamic matrix generator 1305. The remaining rows of M are initialized to zero. Next, in step 1510, a variable i is initialized to K+A. This variable keeps track of the last R rows of M. In step 1512, the number t of associates of the redundant symbol i-K-A is computed. This step is similar to step 810 of FIG. 8. In particular, if another choice of t is preferred during the static encoding process given in FIG. 8, then this choice should be taken also for the variable t computed in step 1512. In step 1515, associator 515 computes indices $P_1, \ldots, P_t$ between 0 and K−1 from static key $S_i$, number of input symbols K, and the integer t. Then, the corresponding positions of the matrix M are set to 1 in step 1530. The increment in step 1540 and the test in step 1550 ensure that all the last R rows of M are visited and computed.

In some instances, the embodiment shown in FIGS. 17, 18 and 19 may be more optimal than other embodiments describe herein because it allows for collecting relatively fewer output symbols for successful decoding than other embodiments. The choice of the decoder depends to a large extent on the application, and, for example, whether or not the number of collected output symbols is a critical resource.

An Associator Implementation

Referring again to FIG. 5, one embodiment of associator 515 is described in Luby I. There, the number N should be a prime number. In operation, when this embodiment is used to compute AL(I), the input size K+R is adjusted so that it is prime. In the present invention, the number of redundant symbols is chosen large enough so that K+R is prime. In some applications, the condition that the input N is a prime is rather restrictive.

Figure 20:
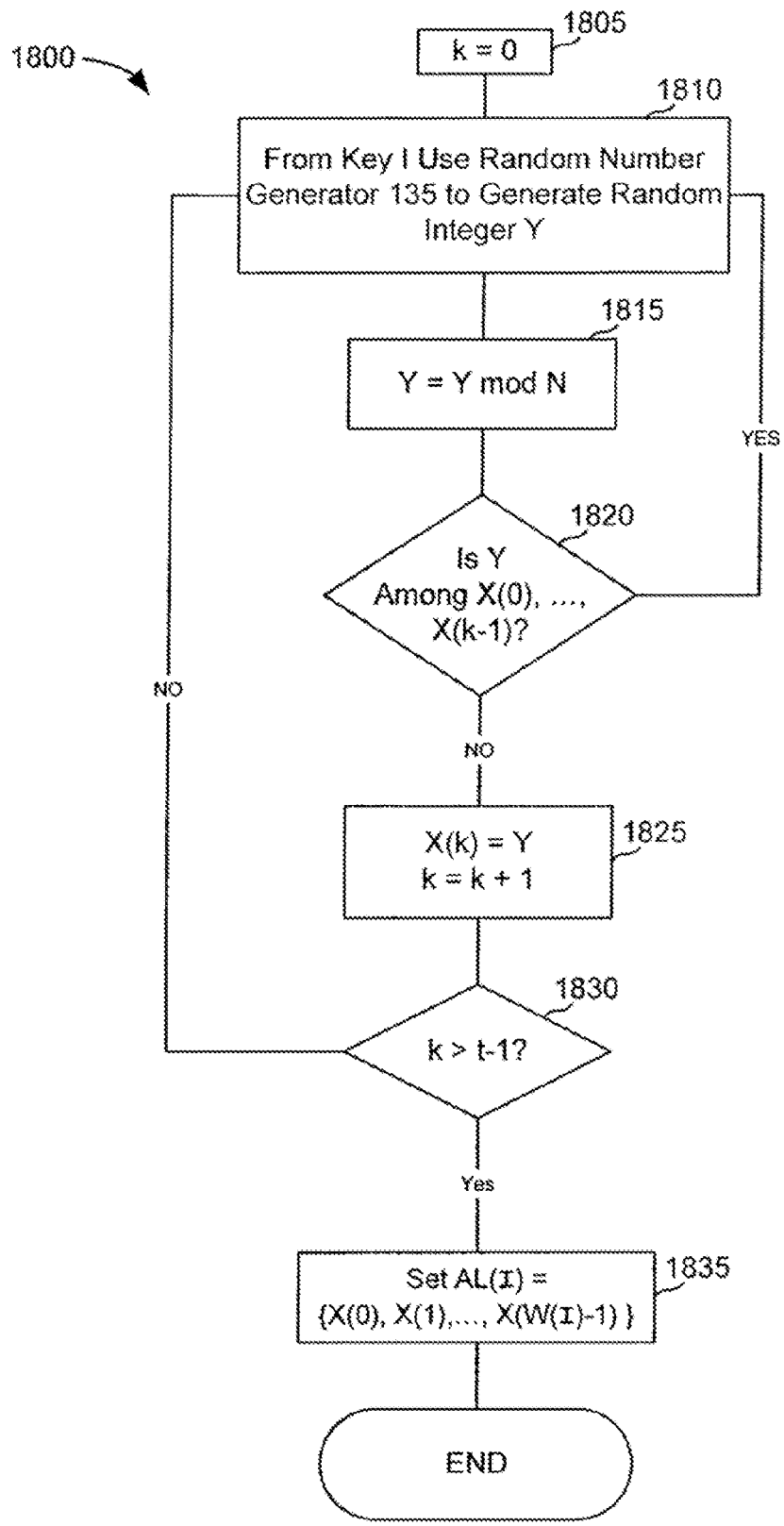
FIG. 20 is a simplified flow diagram of an associator according to one embodiment of the present invention.

Another embodiment of a method for implementing an associator 520 for which N need not be a prime number is shown in FIG. 20. First, in a step 1805, a variable k is initialized to zero. Then, in a step 1810, a random integer Y is generated. In one specific embodiment, the key I for the output symbol is used to seed a random number generator. Then, in step 1815, the integer Y is taken modulo the number N to produce a number between 0 and N−1. In step 1820, the candidate number Y is tested against other numbers Y previously generated (X(0), X(1), . . . ). If the number Y had been previously generated, then the flow returns to step 1810. Otherwise, in step 1825, it is included in a list X(0), X(1), . . . . Then, in step 1830, it is determined whether W(I) numbers have been generated. If not, then the flow returns to step 1810. The result of the flow illustrated in FIG. 20 is a list of W(I) numbers X(0), X(1), . . . , X(W(I)−1), where each number X in the list is a unique integer between 0 and N−1. Then, in a step 1835, the list AL(I) is set as the numbers X(0), X(1), . . . X(W(I)−1).

A Weight Selector Implementation

The performance and efficiency of the encoder/decoder is dependent on the distribution of weights of the output symbols generated by dynamic encoder 220 as shown in FIG. 2, and some distributions are better than others. In particular, the choice of the parameter A describing the excess of the number of collected output symbols compared to the number K of input symbols is primarily affected by the choice of the weight distribution. The operational aspects of weight selection are discussed below, followed by a description of some important weight distributions. The block diagram of FIG. 21 and the flow diagram of FIG. 22 are used to illustrate these concepts.

The task of weight selector 510 shown in FIG. 5 is the following: upon reception of a key I, and a length K+R, the weight selector outputs an integer W(I) in the range 0 through K+R−1, called the weight. Unlike associator 515, which ideally generates integers uniformly with a uniform random distribution, the output of the weight selector 510 is desirably not uniform but skewed in favor of certain weights, as is described below.

Figure 21:
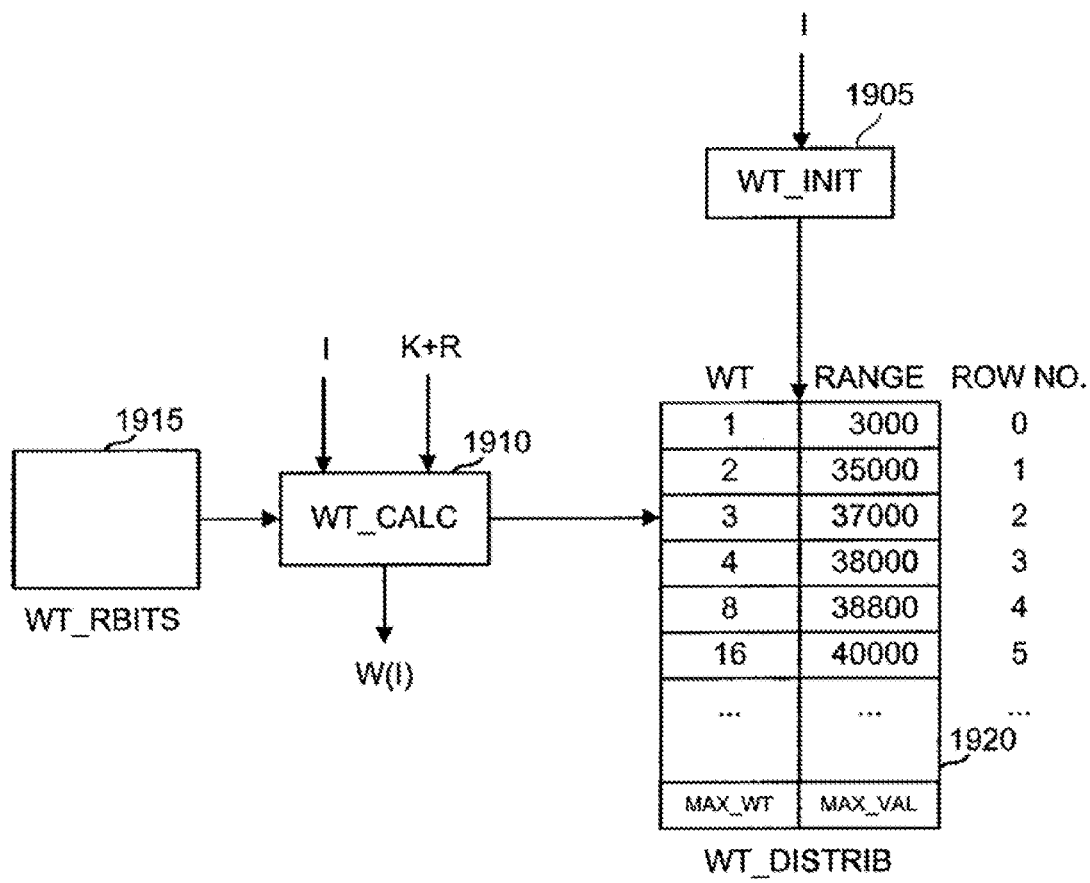
FIG. 21 is a simplified block diagram of a weight selector according to one specific embodiment of the present invention.
Figure 22:
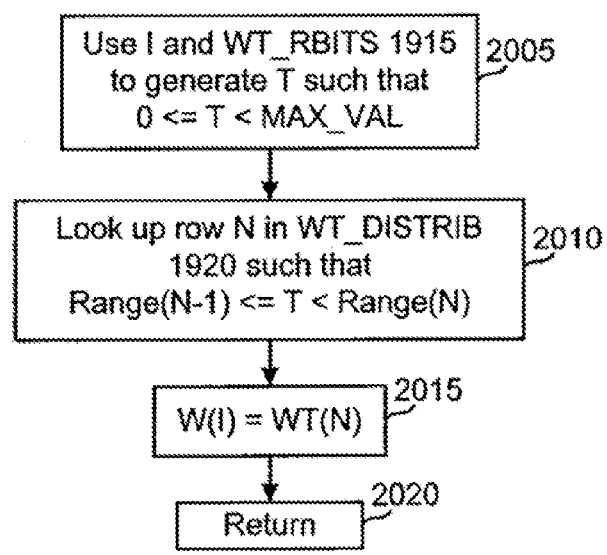
FIG. 22 is a simplified flow diagram of a process that can be used by a weight selector according to an embodiment of the present invention.

As shown in FIG. 21, weight selector 510 comprises two processes WT_INIT 1905 and WT_CALC 1910, and two tables WT_RBITS 1915 and WT_DISTRIB 1920. Process WT_INIT 1905 is invoked only once when the first key is passed in to initialize table WT_DISTRIB 1920. The design of WT_DISTRIB 1920 is an important aspect of the system, and is considered later in much more detail. Process WT_CALC 1910 is invoked on each call to produce a weight W(I) based on a key I. As shown in the flow diagram of FIG. 22, WT_CALC 1910 uses the key I and random bits stored in table WT_RBITS 1915 to generate a random number T (2005). Then, the value of T is used to select a row number N in table WT_DISTRIB 1920.

As shown in FIG. 21, the entries in the RANGE column of WT_DISTRIB 1920 are an increasing sequence of positive integers ending in the value MAX_VAL, and the WT column is an increasing sequence of positive integers ending in the value MAX_WT. The set of possible values for T are the integers between zero and MAX_VAL−1. A desirable property is that T is equally likely to be any value in the range of possible values. The value of N is determined by searching the RANGE column until an N is found that satisfies RANGE(N−1)≤T<RANGE(N) (2010). Once an N is found, the value of W(I) is set to WT(N), the N-th entry of the WT column of the table WT_DISTRIB, and this is the returned weight (2015, 2020). In FIG. 21 for the example table shown, if T is equal to 38,500, then N is found to be 4, and thus W(I) is set to WT(4)=8. In a preferred embodiment, the rows of WT-DIST 1920 are organized in such a way that RANGE(N)−RANGE(N−1) is decreasing in value as N increases. This minimizes the average search time through WT_DIST 1920 to find the weight corresponding to the value of T when a sequential search starting from the first row is used. In other embodiments other arrangements of the rows may be preferable, and other search methodologies can be employed, such as a binary search.

Selecting a Weight Distribution

A weight distribution should be selected for a given the coding process so that an input file can be fully reconstructed with: a) as few output symbols as possible, b) as few operations as possible, and c) as much reliability as possible. Typically, all these optimization criteria can be met by the right choice of the weight distribution for output symbols, i.e., the distribution of W(I) over all I, and the distribution of associates over the output symbols, i.e., the memberships of AL(I) over all I. It should be emphasized that while the decoding process can be applied regardless of the weight distribution and the distribution on the choice of the associates, the preferred embodiments will use weight distributions and distributions on the choice of associates specifically chosen for near optimal performance. In fact, many distributions will perform well, as small variations in the chosen distribution may lead to only small changes in performance.

One methodology for determining the distributions in one preferred embodiment will now be described. The actual weight distributions used depend on the number K of input symbols. The distributions are given below, together with a range $(K_{min}, K_{max})$, a factor β, and a relative overhead α. This has the following meaning: Given K with $K_{min} \le K \le K_{max}$, the number R of redundant symbols is calculated as the smallest integer greater than or equal to β*K; the number of output symbols collected should be at least (1+α)*K, i.e., parameter A described above is the smallest integer greater than or equal to α*K. In case the first version of the associator 520 is used, then R should additionally satisfy the condition that K+R is prime, i.e., R is the smallest prime number greater than or equal to β*K. If the application does not require the primality of K+R, then R can be chosen as the smallest integer greater than or equal to β*K.

The distributions themselves are given as a table of the form

| Weight 1 | P1 |
| Weight 2 | P2 |
| Weight 3 | P3 |
| ... | ... | where P1 is the corresponding probability of Weight 1, P2 is the corresponding probability of Weight 2, etc., and where the sum of P1, P2, ... is one. This means that the table WT_DISTRIB 1920 of FIG. 21 has the form

| Weight 1 | MAX_VAL*P1 |
| Weight 2 | MAX_VAL*(P1 + P2) |
| Weight 3 | MAX_VAL*(P1 + P2 + P3) |
| ... | ... |

General guidelines used in computing the tables herein will now be described. One goal of the design is to have a nonzero number of output symbols of reduced weight one as far into the dynamic decoding process as possible. Preferably, one would like for this number to be greater than zero all the way to the end of the dynamic decoding. However, a mathematical analysis shows that this is only possible if the average weight of an output symbol is at least proportional to the logarithm of the number K of input symbols, and this is how several of the weight distributions described in Luby I are designed. Some embodiments of the present invention significantly reduce this average weight to a fixed constant independent of K. As a result, the number of output symbols of reduced weight one cannot be expected to be larger than zero throughout the entire dynamic decoding process.

An initial step in the design of the weight distribution is obtaining an expression for the expected number of dynamic input symbols whose value could be obtained from output symbols currently in the decodable set during the dynamic decoding process when a fraction x of the dynamic input symbols have not yet been recovered. This expression is a function of the fractions P1, P2, ..., Pk of output symbols of weight 1, 2, ..., k, and of the ratio between the number of collected output symbols and the number of input and redundant symbols. In the following, we denote this ratio by $\gamma$. It is seen that $\gamma=(1+\alpha)/(1+\beta)$. A mathematical analysis of this quantity shows that the expected number of such dynamic input symbols can be represented as $$K*(1+\beta)*(x-e^{-(1+\gamma)*\omega(1-x)}), \quad (1)$$

where x denotes the fraction of dynamic input symbols that are not yet recovered during the dynamic decoding process, and $\omega(x)$ is the polynomial $$P1+2*P2*x+3*P3*x^2+\ldots+k*Pk*x^{k-1}. \quad (2)$$

Since this number is only the expectation of a quantity, which is statistical in nature, it is subject to variations. An analysis of this variation reveals that it is proportional to the square root of the expected number of input symbols not yet recovered, i.e., to the square root of $x*K*(1+\beta)$. To have a reasonable guarantee that the number of input symbols that are neighbors of output symbols of reduced weight one is always positive, P1, ..., Pk and $\gamma$ should be chosen in such a way that $$K*(1+\beta)*(x-e^{-(1+\gamma)*\omega(1-x)})>c*\mathrm{sqrt}(x*K*(1+\beta)), \quad (3)$$

wherein this inequality should hold for all values of x between a given positive real number $\epsilon$ and 1, and c is a positive real number larger than one. The larger c is, the better the guarantee on the success of the decoding process. The smaller $\epsilon$ is, the fewer unrecovered input symbols there are at the end of the dynamic decoding process. The smaller $\omega(1)$ is, the smaller is the average weight of an output symbol. Given these constraints one can compute for a given $\epsilon$ and a given c a polynomial $\omega(x)$ in which all the coefficients are nonnegative, which satisfies the above inequality for all values of x between $\epsilon$ and 1, and for which $\omega(1)$ is as small as possible. This optimization can be done by a variety of methods, for example using the simplex algorithm after a suitable manipulation of the above inequality.

The actual tables are now given with reference to the above description. The constant c in the above description was chosen to guarantee that the error probability for the overall decoder be less than $10^{-10}$. For K>49251 the error probability is less than $10^{-12}$. These tables are provided merely as examples of weight distributions that can be used. It is to be understood that other weight distributions can also be used.

TABLE 1

Range for K: 9900-14800, $\beta = 0.0081$, $\alpha = 0.1187$

| 1 | 0.018235 |
| 2 | 0.477562 |
| 3 | 0.153565 |
| 4 | 0.102006 |
| 5 | 0.034651 |
| 7 | 0.048352 |
| 8 | 0.06084 |
| 18 | 0.058325 |
| 19 | 0.008401 |
| 70 | 0.008451 |
| 71 | 0.029613 |

TABLE 2

Range for K: 14801-19680, $\beta = 0.0121$, $\alpha = 0.084$

| 1 | 0.019314 |
| 2 | 0.483582 |
| 3 | 0.160754 |
| 4 | 0.081631 |
| 5 | 0.067541 |
| 8 | 0.094528 |
| 18 | 0.041968 |
| 19 | 0.019462 |
| 66 | 0.007987 |
| 67 | 0.023233 |

TABLE 3

Range for K: 19681-29510, $\beta = 0.0151$, $\alpha = 0.0769$

| 1 | 0.013531 |
| 2 | 0.488250 |
| 3 | 0.164810 |
| 4 | 0.070953 |
| 5 | 0.084243 |
| 8 | 0.050093 |
| 9 | 0.042547 |
| 19 | 0.055060 |
| 62 | 0.00501988 |
| 63 | 0.025491 |

TABLE 4

Range for K: 29511-49250, β = 0.0161, α = 0.0674

| | |
|---|---|
| 1 | 0.013876 |
| 2 | 0.489087 |
| 3 | 0.162276 |
| 4 | 0.081638 |
| 5 | 0.069880 |
| 8 | 0.081339 |
| 9 | 0.014424 |
| 18 | 0.017712 |
| 19 | 0.040774 |
| 66 | 0.014680 |
| 67 | 0.014314 |

TABLE 5

Range for K: 49251-64780, β = 0.015, α = 0.0558

| | |
|---|---|
| 1 | 0.009117 |
| 2 | 0.492843 |
| 3 | 0.165983 |
| 4 | 0.072707 |
| 5 | 0.082303 |
| 8 | 0.056347 |
| 9 | 0.036917 |
| 19 | 0.055616 |
| 65 | 0.022195 |
| 66 | 0.005972 |

TABLE 6

Range K: 64781-79080, β = 0.0114, α = 0.05

| | |
|---|---|
| 1 | 0.007969 |
| 2 | 0.493570 |
| 3 | 0.166220 |
| 4 | 0.072646 |
| 5 | 0.082558 |
| 8 | 0.056058 |
| 9 | 0.037229 |
| 19 | 0.055590 |
| 65 | 0.025023 |
| 66 | 0.003135 |

TABLE 7

Range for K: 79081-98623, β = 0.01134, α = 0.047

| | |
|---|---|
| 1 | 0.007544 |
| 2 | 0.49361 |
| 3 | 0.166458 |
| 4 | 0.071243 |
| 5 | 0.084913 |
| 8 | 0.049633 |
| 9 | 0.043365 |
| 19 | 0.045231 |
| 20 | 0.010157 |
| 66 | 0.010479 |
| 67 | 0.017365 |

TABLE 8

Range for K: 98624-118349, β = 0.01377, α = 0.0424

| | |
|---|---|
| 1 | 0.006495 |
| 2 | 0.495044 |
| 3 | 0.168010 |
| 4 | 0.067900 |
| 5 | 0.089209 |
| 8 | 0.041731 |
| 9 | 0.050162 |
| 19 | 0.038837 |
| 20 | 0.015537 |
| 66 | 0.016298 |
| 67 | 0.010777 |

TABLE 9

Range for K: 118350-∞, β = 0.01579, α = 0.0393

| | |
|---|---|
| 1 | 0.004807 |
| 2 | 0.496472 |
| 3 | 0.166912 |
| 4 | 0.073374 |
| 5 | 0.082206 |
| 8 | 0.057471 |
| 9 | 0.035951 |
| 18 | 0.001167 |
| 19 | 0.054305 |
| 65 | 0.018235 |
| 66 | 0.009100 |

For example, if K=33,000, then the number of redundant symbols could be the smallest integer R greater than K*0.0161=531.3 such that K+R is a prime. That is, R=533. The number of output symbols collected should be at least (1+0.0674)*K which is 35225.

The average weight for Table 1 is around 6.75, and the average weight for Tables 2 through 9 is around 6. These average weights are significantly lower as compared with one embodiment of Luby I described previously where the average weight is 28.68 when K is 60,000.

Coding for Few Input Symbols

Low relative overhead is preferred for an input file of any size. As is seen from the tables above, as the number K of input symbols becomes smaller, the relative overhead α grows. For example, if the input file has 10,000 bytes, and K is chosen to be 10,000 so that each symbol comprises one byte, then the overhead is roughly 11%, which is not desirable for some applications. One way to reduce the overhead would be to increase the number of input symbols K, at the expense of decreasing the size of the input symbols. For example, where an overhead of about 7% is desired, K could be chosen to be 40,000. In this case, the size of the input symbols would be 2 bits. Using input symbols of very small size, however, leads to computational deficiencies in practice.

A solution to this problem is to use a decoder based on Gaussian elimination, such as the embodiment described with respect to FIG. 17. Even though this decoder is not as computationally efficient as the chain reaction decoder combined with any of static encoders described above with respect to the other embodiments, the overhead in combination with very small failure probabilities for the decoder may make this solution desirable in certain applications.

Specifically, when the number K of input symbols is between 800 and 9899, the following weight distribution can be used for dynamic encoder 220:

TABLE 10

Range for K: 800-1600, β = 0.08, α = 0.05

| | |
|---|---|
| 2 | 0.39 |
| 3 | 0.095 |
| 4 | 0.095 |
| 5 | 0.095 |

TABLE 10-continued

Range for K: 800-1600, β = 0.08, α = 0.05

| | |
|---|---|
| 10 | 0.095 |
| 19 | 0.095 |
| 30 | 0.095 |
| 130 | 0.04 |

The 0.08*K redundant symbols are to be generated according to the operation of static encoder such as that describe with respect to FIG. 10. Decoding is done using a decoder such as that described with respect to FIG. 17.

As an example, suppose that an input file has a size of 16,000 bytes. Input symbols are chosen so that they comprise 16 bytes each, so that the number K of input symbols is 1000. Static encoder in FIG. 10 is used to create 80 redundant symbols. Next, dynamic encoder 220 is used together with the above weight distribution to generate output symbols. The receiver collects (1+α)*K=1050 output symbols and provides them to decoder of FIG. 17. Dynamic matrix generator 1305 creates matrix C of format 1050×1080. Static matrix generator 1330 creates a matrix M of format 1130×1080 and hands it off to the system of linear equation solver 1340, which attempts to decode the original 1000 input symbols, i.e., the input file.

Some Properties of Some Multi-stage Codes

In most of the examples described above, the input and output symbols encode for the same number of bits and each output symbol is placed in one packet (a packet being a unit of transport that is either received in its entirety or lost in its entirety). In some embodiments, the communications system is modified so that each packet contains several output symbols. The size of an output symbol value is then set to a size determined by the size of the input symbol values in the initial splitting of the file into input symbols, based on a number of factors. The decoding process remains essentially unchanged, except that output symbols arrive in bunches as each packet is received.

The setting of input symbol and output symbol sizes is usually dictated by the size of the file and the communication system over which the output symbols are to be transmitted. For example, if a communication system groups bits of data into packets of a defined size or groups bits in other ways, the design of symbol sizes begins with the packet or grouping size. From there, a designer would determine how many output symbols will be carried in one packet or group and that determines the output symbol size. For simplicity, the designer would likely set the input symbol size equal to the output symbol size, but if the input data makes a different input symbol size more convenient, it can be used.

The above-described encoding process produces a stream of packets containing output symbols based on the original file. Each output symbol in the stream is generated independently of all other output symbols, and there is no lower or upper bound on the number of output symbols that can be created. A key is associated with each output symbol. That key, and some contents of the input file, determines the value of the output symbol. Consecutively generated output symbols need not have consecutive keys, and in some applications it would be preferable to randomly generate the sequence of keys, or pseudorandomly generate the sequence.

Multi-stage decoding has a property that if the original file can be split into K equal-sized input symbols and each output symbol value is the same length as an input symbol value, then the file can be recovered from K+A output symbols on average, with very high probability, where A is small compared to K. For example, for the weight distributions introduced above, the probability that the value of A exceeds α*K is at most $10^{-12}$ if K is larger than 19,681, and it is at most $10^{-10}$ for any value of K. Since the particular output symbols are generated in a random or pseudorandom order, and the loss of particular output symbols in transit is assumed random, some small variance exists in the actual number of output symbols needed to recover the input file. In some cases, where a particular collection of K+A packets are not enough to decode the entire input file, the input file is still recoverable if the receiver can gather more packets from one or more sources of output packets.

Because the number of output symbols is only limited by the resolution of I, well more than K+A output symbols can be generated. For example, if I is a 32-bit number, 4 billion different output symbols could be generated, whereas the file could include K=50,000 input symbols. In some applications, only a small number of those 4 billion output symbols may be generated and transmitted and it is a near certainty that an input file can be recovered with a very small fraction of the possible output symbols and an excellent probability that the input file can be recovered with slightly more than K output symbols (assuming that the input symbol size is the same as the output symbol size).

In some applications, it may be acceptable to not be able to decode all of the input symbols, or to be able to decode all of input symbols, but with a relatively low probability. In such applications, a receiver can stop attempting to decode all of the input symbols after receiving K+A output symbols. Or, the receiver can stop receiving output symbols after receiving less than K+A output symbols. In some applications, the receiver may even only receive K or less output symbols. Thus, it is to be understood that in some embodiments of the present invention, the desired degree of accuracy need not be complete recovery of all the input symbols.

Further, in some applications where incomplete recovery is acceptable, the data can be encoded such that all of the input symbols cannot be recovered, or such that complete recovery of the input symbols would require reception of many more output symbols than the number of input symbols. Such an encoding would generally require less computational expense, and may thus be an acceptable way to decrease the computational expense of encoding.

It is to be understood that the various functional blocks in the above-described figures may be implemented by a combination of hardware and/or software, and that in specific implementations some or all of the functionality of some of the blocks may be combined. Similarly, it is also to be understood that the various methods described herein may be implemented by a combination of hardware and/or software.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of encoding data for transmission from a source to a destination over a communications channel, the method comprising:
    generating a plurality of redundant symbols from an ordered set of input symbols to be transmitted, wherein each redundant symbol is generated by a function determined at least in part by a static key associated with the redundant symbol; and generating a plurality of output symbols from a combined set of symbols including the input symbols and the redundant symbols, wherein the number of possible output symbols is independent of the number of input symbols in the ordered set of input symbols.

2. The method of claim 1, wherein
each output symbol has a weight representing the number of symbols from the combined set of symbols used to generate that output symbol; and
the weights of the output symbols in the plurality of output symbols are distributed in a way to minimize the number of output symbols or the number of operations needed to regenerate the ordered set of input symbols.

3. The method of claim 1, wherein
each output symbol has a weight representing the number of symbols from the combined set of symbols used to generate that output symbol; and
the weights of the output symbols in the plurality of output symbols are distributed among the output symbols so that the input symbols can be decoded as reliably as possible.

4. A method of decoding output symbols transmitted over a communications channel, the method comprising:
receiving a plurality of encoded output symbols and corresponding keys from the communications channel, wherein the encoded output symbols can be received in an order independent of the order of encoded output symbols previously received;
decoding at least some of the encoded output symbols using a dynamic decoder and the corresponding keys to recover a first set of input symbols and at least some redundant symbols used in the creation of a first subset of the encoded output symbols;
determining whether the decoding process is complete; and
if the decoding process is not complete, decoding at least some of the encoded output symbols using a static decoder to recover a second set of input symbols used in the creation of a second subset of the encoded output symbols that were not decoded by the dynamic decoder, wherein
the number of the encoded output symbols decoded is dependent on a desired degree of accuracy to which the static decoder and the dynamic decoder can recover input symbols that were used to generate the encoded output symbols.

5. A system for encoding data for transmission from a source to a destination over a communications channel, the system comprising:
a static encoder coupled to receive a plurality of input symbols, the plurality of input symbols generated from data to be transmitted, the static encoder including a redundant symbol generator that generates a plurality of redundant symbols based on the input symbols; and
a dynamic encoder coupled to receive the plurality of input symbols and the plurality of redundant symbols, the dynamic encoder including an output symbol generator that generates a plurality of output symbols from a combined set of symbols, the combined set comprising symbols including the plurality of input symbols and the plurality of redundant symbols, wherein the number of possible output symbols is independent of the number of input symbols in the plurality of input symbols.

6. The system of claim 5, wherein
each output symbol has a weight representing the number of symbols from the combined set of symbols used to generate that output symbol; and
the weights of the output symbols in the plurality of output symbols are distributed in a way to minimize the number of output symbols or the number of operations needed to regenerate the plurality of input symbols.

7. The system of claim 5, wherein
each output symbol has a weight representing the number of symbols from the combined set of symbols used to generate that output symbol; and
the weights of the output symbols in the plurality of output symbols are distributed among the output symbols so that the input symbols in the plurality of input symbols can be decoded as reliably as possible.

8. The system of claim 5, wherein
each redundant symbol is associated with a static key; and
each redundant symbol is generated by a function determined at least in part by the static key associated with the redundant symbol.

9. A system for decoding output symbols transmitted over a communications channel wherein the output symbols represent data sent by one or more transmitters, the system comprising:
a receiver input for receiving encoded output symbols, wherein the encoded output symbols can be received in an order independent of the order of encoded output symbols previously received;
memory for storing encoded output symbols received at the receiver input;
a key generator that generates corresponding keys for the received encoded output symbols by extracting or deducing keys from the particular encoded output symbols received, if corresponding keys are not already available to the system;
dynamic decoder logic that decodes, from at least some of the received encoded output symbols and their corresponding keys, to recover a first set of input symbols and at least some redundant symbols used in the creation of a first subset of the encoded output symbols, the dynamic decoder being dynamic in that it can decode symbols generated by an encoder where the number of possible output symbols is independent of the number of input symbols encoding the data sent by the one or more transmitters;
processing logic for determining whether the decoding process is complete; and
static decoder logic that decodes, if the decoding process is not complete, from at least some of the redundant symbols, additional input symbols not decoded by the dynamic decoder logic, to recover a second set of input symbols used in the creation of a second subset of the encoded output symbols that were not decoded by the dynamic decoder, wherein
the number of the encoded output symbols decoded is dependent on a desired degree of accuracy to which the static decoder logic and the dynamic decoder logic can recover input symbols that were used to generate the encoded output symbols.

10. A computer-readable medium that is non-transitory for use with electronics capable of executing instructions read from the computer-readable medium in order to implement encoding data for transmission from a transmitter to at least one receiver over a communications channel, the computer-readable medium having stored thereon:
program code for generating a plurality of redundant symbols from an ordered set of input symbols representing the data to be encoded for transmission, wherein the program code includes program code for generating each redundant symbol by a function determined at least in part by a static key associated with the redundant symbol; and program code for generating a plurality of output symbols derived from a combination of the ordered set of input symbols and the plurality of redundant symbols, wherein the number of possible output symbols that could be generated is independent of the number of input symbols in the ordered set of input symbols.

11. The computer-readable medium of claim 10, wherein
each output symbol has a weight representing the number of symbols from the combined set of symbols used to generate that output symbol; and the weights of the output symbols in the plurality of output symbols are distributed in a way to minimize the number of output symbols or the number of operations needed to regenerate the ordered set of input symbols.

12. The computer-readable medium of claim 10, wherein
each output symbol has a weight representing the number of symbols from the combined set of symbols used to generate that output symbol; and the weights of the output symbols in the plurality of output symbols are distributed among the output symbols so that the input symbols can be decoded as reliably as possible.

13. A computer-readable medium that is non-transitory for use with electronics capable of executing instructions read from the computer-readable medium in order to implement decoding output symbols transmitted over a communications channel wherein the output symbols represent data sent by one or more transmitters, the computer-readable medium having stored thereon:

program code for receiving a plurality of encoded output symbols and corresponding keys from the communications channel, including program code for handling encoded output symbols if they are received in an order independent of the order of encoded output symbols previously received;

program code for decoding at least some of the encoded output symbols using a dynamic decoder and the corresponding keys to recover a first set of input symbols and at least some redundant symbols used in the creation of a first subset of the encoded output symbols;

program code for determining whether the decoding process is complete; and program code for decoding, if the decoding process is not complete, at least some of the encoded output symbols using a static decoder to recover a second set of input symbols used in the creation of a second subset of the encoded output symbols that were not decoded by the dynamic decoder, wherein the program code is configured to process encoded output symbols wherein the number of the encoded output symbols decoded is dependent on a desired degree of accuracy to which the program code for decoding can recover input symbols that were used to generate the encoded output symbols.

14. A computer-readable medium that is non-transitory for use with electronics capable of executing instructions read from the computer-readable medium in order to implement encoding data for transmission from a source to a destination over a communications channel, the computer-readable medium having stored thereon:

program code for generating a plurality of redundant symbols from an ordered set of input symbols representing the data to be encoded for transmission; and program code for generating a plurality of output symbols derived from a combined set of symbols including the ordered set of input symbols and the plurality of redundant symbols, wherein the number of valid output symbols for the ordered set of input symbols is more than an order of magnitude larger than the number of input symbols in the ordered set of input symbols, each output symbol having a weight representing the number of symbols from the combined set used to generate that output symbol, wherein weights of output symbols include at least two distinct values at least one of which is greater than one and less than the number of symbols in the combined set, such that the input symbols in the ordered set of input symbols can be regenerated to a desired degree of accuracy from N of the output symbols that are determined to be valid output symbols, wherein N is an integer.

15. The computer-readable medium of claim 14, wherein N is greater than the number of input symbols in the ordered set of input symbols.

16. The computer-readable medium of claim 14, wherein N is less than or equal to the number of input symbols in the ordered set of input symbols.

17. The computer-readable medium of claim 14, further comprising program code for transmitting the plurality of output symbols over the communications channel.

18. The computer-readable medium of claim 14, wherein
the computer-readable medium further comprises program code for generating a key for each of at least some of the redundant symbols to be generated; and the program code for generating the plurality of redundant symbols includes program code for generating each of the at least some redundant symbols based on the corresponding key.

19. The computer-readable medium of claim 14, wherein the program code for generating the plurality of redundant symbols includes program code for implementing a static encoder having a Low Density Parity Check (LDPC) encoder.

20. A computer-readable medium that is non-transitory for use with electronics capable of executing instructions read from the computer-readable medium in order to implement encoding data for transmission from a source to a destination over a communications channel, the computer-readable medium having stored thereon:

program code for generating a plurality of redundant symbols from an ordered set of input symbols representing the data to be encoded for transmission;

program code for generating a plurality of output symbols derived from a combined set of symbols including the ordered set of input symbols and the plurality of redundant symbols, wherein the number of possible valid output symbols for the ordered set of input symbols is more than an order of magnitude larger than the number of symbols in the combined set, wherein at least one output symbol is generated from more than one symbol from the combined set and from less than all of the symbols in the combined set, such that the ordered set of input symbols can be regenerated to a desired degree of accuracy from any N of the output symbols, wherein N is an integer; and wherein the program code for generating the plurality of redundant symbols includes program code for implementing a first static encoder having a first redundant symbol generator, and program code for implementing a second static encoder having a second redundant symbol generator;

wherein the plurality of redundant symbols includes a plurality of first redundant symbols and a plurality of second redundant symbols;

wherein the program code for implementing the first static encoder having the first redundant symbol generator includes program code for generating the plurality of first redundant symbols based on the input symbols in the ordered set of input symbols; and wherein the program code for implementing the second static encoder having the second redundant symbol generator includes program code for generating the plurality of second redundant symbols based on the input symbols in the ordered set of input symbols and the plurality of first redundant symbols.

21. The computer-readable medium of claim 20, wherein the program code for implementing the first static encoder includes program code for implementing a Hamming encoder; and the program code for implementing the second static encoder includes program code for implementing a Low Density Parity Check (LDPC) encoder.

22. A system for encoding data for transmission from a source to a destination over a communications channel, the system comprising:

a static encoder coupled to receive a plurality of input symbols, the plurality of input symbols generated from data to be transmitted, the static encoder including a redundant symbol generator that generates a plurality of redundant symbols based on the input symbols;

a dynamic encoder coupled to receive the plurality of input symbols and the plurality of redundant symbols, the dynamic encoder including an output symbol generator that generates a plurality of output symbols from a combined set of symbols including the plurality of input symbols and the plurality of redundant symbols, wherein the number of possible valid output symbols for the ordered set of input symbols is more than an order of magnitude larger than the number of symbols in the combined set of symbols, wherein at least one output symbol is generated from more than one symbol in the combined set of symbols and from less than all of the symbols in the combined set of symbols, such that the ordered set of input symbols can be regenerated to a desired degree of accuracy from any N of the output symbols, wherein N is an integer; and wherein at most G input symbols can be regenerated from any number of output symbols, wherein G is less than the number of input symbols in the ordered set of input symbols.

23. A computer-readable medium that is non-transitory for use with electronics capable of executing instructions read from the computer-readable medium in order to implement encoding data for transmission from a source to a destination over a communications channel, the computer-readable medium having stored thereon:

program code for generating a plurality of redundant symbols from an ordered set of input symbols representing the data to be encoded for transmission;

program code for generating a plurality of output symbols derived from a combined set of symbols including the ordered set of input symbols and the plurality of redundant symbols, wherein the number of possible valid output symbols for the ordered set of input symbols is more than an order of magnitude larger than the number of symbols in the combined set of symbols, wherein at least one output symbol is generated from more than one symbol in the combined set of symbols and from less than all of the symbols in the combined set of symbols, such that the ordered set of input symbols can be regenerated to a desired degree of accuracy from any N of the output symbols, wherein N is an integer; and wherein at most G input symbols can be regenerated from any number of output symbols, wherein G is less than the number of input symbols in the ordered set of input symbols.

24. A system for encoding data for transmission from a source to a destination over a communications channel, the system comprising:

a static encoder coupled to receive a plurality of input symbols, the plurality of input symbols generated from data to be transmitted, the static encoder including a redundant symbol generator that generates a plurality of redundant symbols based on the input symbols including, for each redundant symbol:

determining t distinct input symbols according to a distribution; and computing each redundant symbol as the XOR of the t distinct input symbols; and a dynamic encoder coupled to receive the plurality of input symbols and the plurality of redundant symbols, the dynamic encoder including an output symbol generator that generates a plurality of output symbols from a combined set of symbols including the plurality of input symbols and the plurality of redundant symbols, wherein the number of possible valid output symbols for the plurality of input symbols is more than an order of magnitude larger than the number of symbols in the combined set of symbols, wherein at least one output symbol is generated from more than one symbol in the combined set of symbols and from less than all of the symbols in the combined set of symbols, such that the ordered set of input symbols can be regenerated to a desired degree of accuracy from any N of the output symbols, wherein t and N are integers.

25. A computer-readable medium that is non-transitory for use with electronics capable of executing instructions read from the computer-readable medium in order to implement encoding data for transmission from a source to a destination over a communications channel, the computer-readable medium having stored thereon:

program code for generating a plurality of redundant symbols from an ordered set of input symbols representing the data to be encoded for transmission, the program code including:

program code for determining, for each redundant symbol, t distinct input symbols according to a distribution; and program code for computing, for each redundant symbol, each redundant symbol as the XOR of the t distinct input symbols; and program code for generating a plurality of output symbols derived from a combined set of symbols including the ordered set of input symbols and the plurality of redundant symbols, wherein the number of possible valid output symbols for the plurality of input symbols is more than an order of magnitude larger than the number of symbols in the combined set of symbols, wherein at least one output symbol is generated from more than one symbol in the combined set of symbols and from less than all of the symbols in the combined set of symbols, such that the ordered set of input symbols can be regenerated to a desired degree of accuracy from any N of the output symbols, wherein t and N are integers.

26. A system for encoding data for transmission from a source to a destination over a communications channel, the system comprising:
- a static encoder coupled to receive a plurality of input symbols, the plurality of input symbols generated from data to be transmitted, the static encoder including a redundant symbol generator that generates a plurality of redundant symbols based on the input symbols;
- a dynamic encoder coupled to receive the plurality of input symbols and the plurality of redundant symbols, the dynamic encoder including an output symbol generator that generates a plurality of output symbols from a combined set of symbols including the plurality of input symbols and the plurality of redundant symbols, wherein the number of possible valid output symbols for a given set of input symbols is more than an order of magnitude larger than the number of symbols in the combined set of symbols, wherein at least one output symbol is generated from more than one symbol in the combined set of symbols and from less than all of the symbols in the combined set of symbols, such that the ordered set of input symbols can be regenerated to a desired degree of accuracy from any N of the output symbols, wherein N is an integer; and
- a transmitter coupled to receive the plurality of output symbols, the transmitter for transmitting the plurality of output symbols over the communications channel, wherein the plurality of output symbols is generated as needed for transmitting the plurality of output symbols.

27. A computer-readable medium that is non-transitory for use with electronics capable of executing instructions read from the computer-readable medium in order to implement encoding data for transmission from a source to a destination over a communications channel, the computer-readable medium having stored thereon:
- program code for generating a plurality of redundant symbols from an ordered set of input symbols representing the data to be encoded for transmission;
- program code for generating a plurality of output symbols derived from a combined set of symbols including the ordered set of input symbols and the plurality of redundant symbols, wherein the number of possible valid output symbols for a given set of input symbols is more than an order of magnitude larger than the number of symbols in the combined set of symbols, wherein at least one output symbol is generated from more than one symbol in the combined set of symbols and from less than all of the symbols in the combined set of symbols, such that the ordered set of input symbols can be regenerated to a desired degree of accuracy from any N of the output symbols, wherein N is an integer; and
- program code for transmitting the plurality of output symbols over the communications channel, wherein the plurality of output symbols is generated as needed for transmitting the plurality of output symbols.

28. A computer-readable medium that is non-transitory for use with electronics capable of executing instructions read from the computer-readable medium in order to implement receiving data transmitted from a source over a communications channel, the computer-readable medium having stored thereon:
- program code for receiving output symbols transmitted over the communications channel, wherein each output symbol is generated from at least one symbol in a combined set of input symbols and redundant symbols, wherein at least one output symbol is generated from more than one symbol in the combined set and less than all of the symbols in the combined set, wherein the number of possible valid output symbols for a given set of input symbols is more than an order of magnitude larger than the number of symbols in the combined set, wherein the input symbols are from an ordered set of input symbols, wherein the redundant symbols are generated from the input symbols;
- program code for decoding, upon receiving N output symbols, wherein N is an integer, a subset of the symbols in the combined set from the N output symbols, the subset including a plurality of decoded input symbols and a plurality of decoded redundant symbols; and
- program code for decoding at least some undecoded input symbols, if any, from the plurality of decoded redundant symbols.

29. The computer-readable medium of claim 28, wherein the program code for decoding at least some undecoded input symbols includes program code for implementing a static decoder having a Low Density Parity Check (LDPC) decoder.

30. The computer-readable medium of claim 28, wherein the redundant symbols include a plurality of first redundant symbols and a plurality of second redundant symbols, wherein the program code for implementing the static decoder includes:
- program code for implementing a first static decoder for decoding, from the decoded redundant symbols of the plurality of first redundant symbols and the plurality of decoded input symbols, at least one of the undecoded input symbols and undecoded redundant symbols of the plurality of second redundant symbols; and
- program code for implementing a second static decoder for decoding at least one undecoded input symbol from redundant symbols of the plurality of second redundant symbols and the plurality of decoded input symbols.

31. The computer-readable medium of claim 30, wherein
- the program code for implementing the first static decoder includes program code for implementing a Low Density Parity Check (LDPC) decoder; and
- the program code for implementing the second static decoder includes program code for implementing a Hamming decoder.

32. The computer-readable medium of claim 28, wherein the program code for decoding the subset of the symbols in the combined set includes:
- program code for forming a first matrix that indicates, for each received output symbol, the symbols in the combined set associated with the output symbol;
- program code for augmenting the first matrix with information that indicates, for each redundant symbol, the input symbols associated with the redundant symbol; and
- program code for decoding at least some of the input symbols as a solution to a system of equations indicated by the augmented first matrix.

33. A method of encoding data for transmission from a source to a destination over a communications channel, the method comprising:
- generating a plurality of redundant symbols from an ordered set of input symbols generated from data to be transmitted;
- generating a plurality of output symbols from a combined set of symbols including the ordered set of input symbols and the plurality of redundant symbols, wherein the number of possible valid output symbols for the ordered set of input symbols is more than an order of magnitude larger than the number of symbols in the combined set, wherein at least one output symbol is generated from more than one symbol from the combined set and from less than all of the symbols in the combined set, such that the ordered set of input symbols can be regenerated to a desired degree of accuracy from any N of the output symbols, wherein N is an integer; and generating a key for each output symbol to be generated, wherein generating the plurality of output symbols includes generating each output symbol based on the corresponding key.

34. A computer-readable medium that is non-transitory for use with electronics capable of executing instructions read from the computer-readable medium in order to implement encoding data for transmission from a source to a destination over a communications channel, the computer-readable medium having stored thereon:

program code for generating a plurality of redundant symbols from an ordered set of input symbols representing the data to be encoded for transmission;

program code for generating a plurality of output symbols derived from a combined set of symbols including the ordered set of input symbols and the plurality of redundant symbols, wherein the number of possible valid output symbols for the ordered set of input symbols is more than an order of magnitude larger than the number of symbols in the combined set, wherein at least one output symbol is generated from more than one symbol from the combined set and from less than all of the symbols in the combined set, such that the ordered set of input symbols can be regenerated to a desired degree of accuracy from any N of the output symbols, wherein N is an integer; and program code for generating a key for each output symbol to be generated, wherein the program code for generating the plurality of output symbols includes program code for generating each output symbol based on the corresponding key.

35. A system for employing two or more stages of encoding to encode data for transmission from a transmitter to at least one receiver over a communication channel, the system comprising:

a first encoder, of a first encoding stage, coupled to receive an ordered set of input symbols, the first encoder for generating a plurality of redundant symbols from the ordered set of input symbols representing the data to be encoded for transmission;

a second encoder, of a second encoding stage, coupled to receive the ordered set of input symbols and the plurality of redundant symbols, the second encoder for generating a set of output symbols derived from a combination of the plurality of redundant symbols and the ordered set of input symbols, wherein the number of possible output symbols that could be used in the set of output symbols is independent of the number of input symbols in the ordered set of input symbols; and a transmitter coupled to receive the set of output symbols, the transmitter for transmitting at least some of the set of output symbols over the communications channel to at least one receiver such that the ordered set of input symbols can be regenerated to a desired degree of accuracy from a predetermined number of output symbols received by the at least one receiver, wherein the second encoder is a dynamic encoder, and the dynamic encoder generates the set of output symbols using chain-reaction encoding.

36. A computer-readable medium that is non-transitory for use with electronics capable of executing instructions read from the computer-readable medium in order to implement employing two or more stages of encoding to encode data for transmission from a transmitter to at least one receiver over a communication channel, the computer-readable medium having stored thereon:

program code for generating, during a first encoding stage, a plurality of redundant symbols from an ordered set of input symbols representing the data to be encoded for transmission;

program code for generating, during a second encoding stage, a set of output symbols derived from a combination of the plurality of redundant symbols and the ordered set of input symbols, wherein the number of possible output symbols that could be used in the set of output symbols is independent of the number of input symbols in the ordered set of input symbols; and program code for transmitting at least some of the set of output symbols over the communications channel to at least one receiver such that the ordered set of input symbols can be regenerated to a desired degree of accuracy from a predetermined number of output symbols received by the at least one receiver, wherein the program code for generating the set of output symbols includes program code for implementing a dynamic encoder, including program code for generating the set of output symbols using chain-reaction encoding.

37. A system for employing two or more stages of encoding to encode data for transmission from a transmitter to at least one receiver over a communication channel, the system comprising:

a first encoder, of a first encoding stage, coupled to receive an ordered set of input symbols, the first encoder for generating a plurality of redundant symbols from the ordered set of input symbols representing the data to be encoded for transmission;

a second encoder, of a second encoding stage, coupled to receive the ordered set of input symbols and the plurality of redundant symbols, the second encoder for generating a set of output symbols derived from a combination of the plurality of redundant symbols and the ordered set of input symbols, wherein the number of possible output symbols that could be used in the set of output symbols is independent of the number of input symbols in the ordered set of input symbols; and a transmitter coupled to receive the set of output symbols, the transmitter for transmitting at least some of the set of output symbols over the communications channel to at least one receiver such that the ordered set of input symbols can be regenerated to a desired degree of accuracy from a predetermined number of output symbols received by the at least one receiver, wherein the second encoder is a dynamic encoder, and the dynamic encoder generates the set of output symbols using the plurality of redundant symbols generated from the ordered set of input symbols, the ordered set of input symbols, and a plurality of dynamic keys.

38. A computer-readable medium that is non-transitory for use with electronics capable of executing instructions read from the computer-readable medium in order to implement employing two or more stages of encoding to encode data for transmission from a transmitter to at least one receiver over a communication channel, the computer-readable medium having stored thereon:

program code for generating, during a first encoding stage, a plurality of redundant symbols from an ordered set of input symbols representing the data to be encoded for transmission;

program code for generating, during a second encoding stage, a set of output symbols derived from a combination of the plurality of redundant symbols and the ordered set of input symbols, wherein the number of possible output symbols that could be used in the set of output symbols is independent of the number of input symbols in the ordered set of input symbols; and program code for transmitting at least some of the set of output symbols over the communications channel to at least one receiver such that the ordered set of input symbols can be regenerated to a desired degree of accuracy from a predetermined number of output symbols received by the at least one receiver, wherein the program code for generating the set of output symbols includes program code for implementing a dynamic encoder, including program code for generating the set of output symbols using the plurality of redundant symbols generated from the ordered set of input symbols, the ordered set of input symbols, and a plurality of dynamic keys.

39. A system for encoding data for transmission from a source to a destination over a communications channel, the system comprising:

a static encoder coupled to receive an ordered set of input symbols, the ordered set of input symbols generated from data to be transmitted, the static encoder including a redundant symbol generator that generates a plurality of redundant symbols from the ordered set of input symbols; and a dynamic encoder coupled to receive the ordered set of input symbols and the plurality of redundant symbols, the dynamic encoder including an output symbol generator that generates a plurality of output symbols from a combined set of symbols including the ordered set of input symbols and the plurality of redundant symbols, wherein the number of possible output symbols is independent of the number of symbols in the combined set of symbols, each output symbol having a weight representing the number of symbols from the combined set of symbols used to generate that output symbol.

40. The system of claim 39, wherein the weights of the output symbols in the plurality of output symbols are distributed in a way to minimize the number of output symbols or the number of operations needed to regenerate the ordered set of input symbols.

41. The system of claim 39, wherein the weights of the output symbols in the plurality of output symbols are distributed among the output symbols so that the input symbols in the ordered set of input symbols can be decoded as reliably as possible.

42. The system of claim 39, wherein each redundant symbol is associated with a static key; and each redundant symbol is generated by a function determined at least in part by the static key associated with the redundant symbol.

43. A computer-readable medium that is non-transitory for use with electronics capable of executing instructions read from the computer-readable medium in order to implement encoding data for transmission from a source to a destination over a communications channel, the computer-readable medium having stored thereon:

program code for generating a plurality of redundant symbols from an ordered set of input symbols representing the data to be encoded for transmission; and program code for generating a plurality of output symbols from a combined set of symbols including the ordered set of input symbols and the plurality of redundant symbols, wherein the number of possible output symbols is independent of the number of symbols in the combined set of symbols, each output symbol having a weight representing the number of symbols from the combined set of symbols used to generate that output symbol.

44. The computer-readable medium of claim 43, wherein the weights of the output symbols in the plurality of output symbols are distributed in a way to minimize the number of output symbols or the number of operations needed to regenerate the ordered set of input symbols.

45. The computer-readable medium of claim 43, wherein the weights of the output symbols in the plurality of output symbols are distributed among the output symbols so that the input symbols in the ordered set of input symbols can be decoded as reliably as possible.

46. The computer-readable medium of claim 43, wherein each redundant symbol is associated with a static key; and the program code for generating the plurality of redundant symbols includes program code for generating each redundant symbol by a function determined at least in part by the static key associated with the redundant symbol.

47. A system for decoding output symbols transmitted over a communications channel, the system comprising:

a receiver input for receiving a plurality of encoded output symbols, wherein the encoded output symbols can be received in an order independent of the order of encoded output symbols previously received;

memory for storing encoded output symbols received at the receiver input;

a key generator that generates corresponding keys for the received encoded output symbols by extracting or deducing keys from the particular encoded output symbols received, if corresponding keys are not already available to the system;

dynamic decoder logic that decodes, from at least some of the received encoded output symbols and their corresponding keys, to recover a first set of input symbols and at least some redundant symbols used in the creation of a first subset of the encoded output symbols;

processing logic for determining whether the decoding process is complete; and static decoder logic that decodes, if the decoding process is not complete, from at least some of the redundant symbols, additional input symbols not decoded by the dynamic decoder logic, to recover a second set of input symbols used in the creation of a second subset of the encoded output symbols that were not decoded by the dynamic decoder.

48. The system of claim 47, wherein the processing logic for determining includes processing logic for determining based at least in part on one or more of (a) the number of output symbols processed, (b) a rate at which input symbols are being recovered, and (c) time spent processing output symbols.

49. A computer-readable medium that is non-transitory for use with electronics capable of executing instructions read from the computer-readable medium in order to implement decoding output symbols transmitted over a communications channel, the computer-readable medium having stored thereon:

program code for receiving a plurality of encoded output symbols and corresponding keys from the communications channel, including program code for handling encoded output symbols if they are received in an order independent of the order of encoded output symbols previously received;

program code for decoding at least some of the encoded output symbols using a dynamic decoder and the corresponding keys to recover a first set of input symbols and at least some redundant symbols used in the creation of a first subset of the encoded output symbols;

program code for determining whether the decoding process is complete; and program code for decoding, if the decoding process is not complete, at least some of the encoded output symbols using a static decoder to recover a second set of input symbols used in the creation of a second subset of the encoded output symbols that were not decoded by the dynamic decoder.

50. The computer-readable medium of claim 49, wherein the program code for determining includes program code for determining based at least in part on one or more of (a) the number of output symbols processed, (b) a rate at which input symbols are being recovered, and (c) time spent processing output symbols.

* * * * *